US005784382A

United States Patent [19]
Byers et al.

[11] Patent Number: 5,784,382
[45] Date of Patent: Jul. 21, 1998

[54] METHOD AND APPARATUS FOR DYNAMICALLY TESTING A MEMORY WITHIN A COMPUTER SYSTEM

[75] Inventors: Larry L. Byers, Apple Valley; Gary R. Robeck, Albertville; Terry J. Brunmeier, Shoreview; Randy L. DeGarmo, Oakdale; Paul A. LaBerge, Coon Rapids, all of Minn.

[73] Assignee: Unisys Corporation, Blue Bell, Pa.

[21] Appl. No.: 396,679

[22] Filed: Mar. 1, 1995

[51] Int. Cl.$^6$ .................... G01R 31/28; G06F 12/00
[52] U.S. Cl. .................. 371/22.3; 371/22.4; 371/22.5; 371/21.1
[58] Field of Search ................. 371/22.3, 22.4, 371/22.5, 21.1, 25.1; 365/201; 395/183.06, 183.18, 575, 185.06, 182.22; 324/73 R

[56] References Cited

U.S. PATENT DOCUMENTS

| | | | |
|---|---|---|---|
| 3,761,695 | 9/1973 | Eichelberger | 235/153 |
| 4,020,466 | 4/1977 | Cordi et al. | 340/172.5 |
| 4,084,231 | 4/1978 | Capozzi et al. | 364/200 |
| 4,195,770 | 4/1980 | Benton et al. | 371/21 |
| 4,225,958 | 9/1980 | Funatsu | 371/15 |
| 4,298,929 | 11/1981 | Capozzi | 364/200 |
| 4,298,980 | 11/1981 | Hajdu et al. | 371/25 |
| 4,308,616 | 12/1981 | Timoc | 371/23 |
| 4,369,511 | 1/1983 | Kimura et al. | 371/21 |
| 4,370,749 | 1/1983 | Jones et al. | 371/27 |
| 4,433,413 | 2/1984 | Fasang | 371/25 |
| 4,476,431 | 10/1984 | Blum | 324/73 R |
| 4,493,077 | 1/1985 | Agrawal et al. | 371/25 |
| 4,513,283 | 4/1985 | Leininger | 340/825.02 |
| 4,534,028 | 8/1985 | Trischler | 371/25 |
| 4,535,467 | 8/1985 | Davis et al. | 377/81 |
| 4,546,272 | 10/1985 | Suzuki et al. | 307/455 |
| 4,566,104 | 1/1986 | Bradshaw et al. | 371/15 |
| 4,580,066 | 4/1986 | Berndt | 307/276 |
| 4,608,683 | 8/1986 | Shigaki | 370/13 |

(List continued on next page.)

OTHER PUBLICATIONS

Kaunitz et al., "Audit Trail Compaction for Database Recovery", *Communications of the ACM*, vol. 27, No. 7, Jul. 1984.

Verhofstad, "Recovery Techniques for Database Systems", *Computing Surveys*, vol. 10, No. 2, Jun. 1978.

Blumberg et al., "High Speed Glitchless Cascade Latch with Set", IBM Technical Disclosure Bulletin, vol. 18, No. 5, Oct., 1975.

Canova et al., "LSSD Compatible D–Function Latch", IBM Technical Disclosure Bulletin, vol. 25, No. 10, Mar. 1983.

Berglund, "Level–Sensitive Scan Design Tests Chips, Boards, System, *Electronics*, vol. 52, No. 6, Mar. 15, 1981.

Gray et al., "The Recovery manager of the System R Database Manager", *Computing Surveys*, vol. 13, No. 2, Jun. 1981.

*Primary Examiner*—Robert W. Beausoliel, Jr.
*Assistant Examiner*—Nadeem Iqbal
*Attorney, Agent, or Firm*—Nawrocki, Rooney & Sivertson, P.A.

[57] ABSTRACT

A method and apparatus for increasing the efficiency of a dynamic read and/or write operation of a memory element within a computer system. The dynamic read and/or write operation may be performed when the computer system is in a functional mode or a test mode. The present invention may reduce the number of bits that are required to be serially shifted into a design by providing an auto-increment block. It is recognized that most multi-word access to a memory are made to sequential address locations within the memory. The auto-increment block takes advantage of this and automatically manipulates the address thereby not requiring subsequent addresses to be serially shifted into the design. Further, the control word may be stored within the design for subsequent accesses. That is, the support controller may shift a starting address and a control word into the design. The addresses for subsequent accesses may be generated by the auto-increment block, thereby only requiring that the support controller shift a data word to/from the design. This may significantly reduce the time necessary perform the subsequent read and/or write operations.

75 Claims, 32 Drawing Sheets

U.S. PATENT DOCUMENTS

| | | | |
|---|---|---|---|
| 4,628,217 | 12/1986 | Berndt | 307/467 |
| 4,646,229 | 2/1987 | Boyle | 364/200 |
| 4,701,920 | 10/1987 | Resnick et al. | 371/25 |
| 4,782,487 | 11/1988 | Smelser | 371/21 |
| 4,783,785 | 11/1988 | Hanta | 371/25 |
| 4,788,684 | 11/1988 | Kawaguchi et al. | 371/21 |
| 4,835,774 | 5/1989 | Ooshima et al. | 371/25 |
| 4,847,519 | 7/1989 | Wahl et al. | 307/296.2 |
| 4,853,843 | 8/1989 | Ecklund | 364/200 |
| 4,876,685 | 10/1989 | Rich | 371/21.6 |
| 4,888,772 | 12/1989 | Tanigawa | 371/21.2 |
| 4,903,266 | 2/1990 | Hack | 371/21.2 |
| 4,969,148 | 11/1990 | Nadeau-Dostie et al. | 371/21.1 |
| 5,032,979 | 7/1991 | Hecht et al. | 364/200 |
| 5,089,958 | 2/1992 | Horton et al. | 395/575 |
| 5,093,787 | 3/1992 | Simmons | 364/406 |
| 5,107,501 | 4/1992 | Zorian | 371/213 |
| 5,138,619 | 8/1992 | Fasang et al. | 37/21.1 |
| 5,146,573 | 9/1992 | Sato et al. | 395/425 |
| 5,173,906 | 12/1992 | Dreibelbis et al. | 371/22.5 |
| 5,202,969 | 4/1993 | Sato et al. | 395/425 |
| 5,222,066 | 6/1993 | Grula et al. | 371/21.1 |
| 5,222,224 | 6/1993 | Flynn et al. | 395/425 |
| 5,224,101 | 6/1993 | Popyack, Jr. | 371/21.1 |
| 5,307,484 | 4/1994 | Baker et al. | 395/600 |

| SIGNAL | SIGNAL DESCRIPTION |
|---|---|
| D(0-31) | DSD DATA BUS (I.O.Z) - BI-DIRECTIONAL MAIN DATA PATH FOR ALL OPERATIONS - ASSERTED BY BUS MASTER FOR WRITE OPERATIONS AND BY BUS SLAVE FOR READ OPERATIONS |
| DP(0-3) | DSD DATA BUS PARITY (I.O.Z) - DP0 = PARITY FOR D0-7. DP1 = PARITY FOR D8-15. DP2 = PARITY FOR D16-23. DP3 = PARITY FOR D24-31. |
| A(0-29) | DSD ADDRESS BUS (I.O.Z) - BI-DIRECTIONAL ADDRESS BUS FOR ALL DEVICES ATTACHED TO THE INTERFACE - ASSERTED BY THE BUS MASTER. |
| ADS/ | ADDRESS STATUS (I.O.Z) - WHEN ASSERTED BY THE BUS MASTER, THE CONTENTS OF THE ADDRESS BUS ARE VALID - DEFINES THE START OF A BUS CYCLE |
| W-R/ | WRITE/READ (I.O.Z) - INDICATES THE DIRECTION OF DATA TRANSFER RELATIVE TO THE BUS MASTER - DRIVEN BY THE BUS MASTER. WRITE=1, READ=0. |
| HOLD/ | HOLD (O) - ASSERTED BY DEVICE TO INDICATE THAT IT IS REQUESTING BUS MASTERSHIP |
| HLDAI/ | HOLD ACKNOWLEDGE (I) - ASSERTED BY BUS ARBITRATION LOGIC TO INDICATE THAT THE PREVIOUS BUS MASTER HAS RELINQUISHED USE OF THE BUS. |
| BCLK | BUS CLOCK (I) - CLOCK SIGNAL THAT CONTROLS THE DMA PORTION OF THE NCR53C720 |
| RESET/ | CHIP RESET (I) - FORCES A SYNCHRONOUS FULL CHIP RESET OF THE NCR53C720 - MUST BE ASSERTED FOR A MINIMUM OF 15 BUS CYCLES |
| CS/ | CHIP SELECT (I) - SELECTS THE NCR53C720 AS A SLAVE DEVICE - CONNECTED TO ADDRESS BIT 6 IN THE DSD APPLICATION |
| IRQ/ | INTERRUPT (O) - INDICATES THAT SERVICE IS REQUIRED FROM THE USBC |

FIG. 10A

| SIGNAL | SIGNAL DESCRIPTION |
|---|---|
| BE3/ | BYTE ENABLE THREE (I,O,Z) - ENABLES DATA TRANSFER ON DATA BUS LINES D0-D7 - ASSERTED BY BUS MASTER |
| BE2/ | BYTE ENABLE TWO (I,O,Z) - ENABLES DATA TRANSFER ON DATA BUS LINES D8-D15 - ASSERTED BY BUS MASTER |
| BE1/ | BYTE ENABLE ONE (I,O,Z) - ENABLES DATA TRANSFER ON DATA BUS LINES D16-D23 - ASSERTED BY BUS MASTER |
| BE0/ | BYTE ENABLE ZERO (I,O,Z) - ENABLES DATA TRANSFER ON DATA BUS LINES D24-D31 - ASSERTED BY BUS MASTER |
| READYI/ | READY-IN (I) - SIGNAL FROM SLAVE DEVICE TO BUS MASTER INDICATING THAT SLAVE IS READY TO TRANSFER DATA |
| READYO/ | READY-OUT (O) - ASSERTED TO INDICATE THE END OF A SLAVE MODE CYCLE - THE NCR53C720 PROVIDES THIS SIGNAL TO TERMINATE A SLAVE CYCLE |
| MASTER/ | MASTER STATUS (O) - ASSERTED BY THE NCR53C720 WHEN IT BECOMES THE MASTER |
| BS(2-0) | BUS MODE SELECT (I) - SELECTS THE BUS MODE (MOTOROLA OR INTEL) AND ADDRESSING MODE (BIT OR LITTLE ENDIAN) - IN THE DSD APPLICATION, BS(2-0) = "010" THEREBY SELECTING 80386DX LIKE (BUS MODE 4) AND BIG ENDIAN BUS MODE. |
| AUTO/ | SCRIPTS AUTOSTART MODE (I) - SELECTS EITHER AUTO OR MANUAL SCRIPTS START MODE. WHEN AUTO/=0, SCRIPTS STARTS AT ADDRESS-0 (ADDRESS IN DSP REGISTER OF NCR DEVICE) AUTOMATICALLY FOLLOWING A CHIP RESET. WHEN AUTO/=1, SCRIPTS STARTS AFTER THE DSP REGISTER HAS BEEN LOADED BY THE USBC. IN THE DSD APPLICATION, AUTO/ IS SET TO 1. |

FIG. 10B

METHOD AND APPARATUS FOR DYNAMICALLY TESTING A MEMORY WITHIN A COMPUTER SYSTEM

CROSS REFERENCE TO CO-PENDING APPLICATIONS

The present application is related to U.S. patent application Ser. No. 08/396,951, filed Mar. 1, 1995, entitled "Method and Apparatus For Storing Computer Data After a Power Failure", which is assigned to the assignee of the present invention and is incorporated herein by reference.

BACKGROUND OF THE INVENTION

1. Field of the Invention

The present invention generally relates to general purpose digital data processing systems and more particularly relates to such systems which provide a mechanism for dynamically testing memory elements therein.

2. Description of the Prior Art

A key design element of high reliability computer systems is Built-In-Self-Test (BIST). The complexity of computer systems has increased exponentially over the past several decades. Because of this increased complexity, many of the internal nodes within modern computer systems are not controllable or observable from the external I/O pins. BIST design techniques have been developed to combat this growing problem. BIST can be used to make the internal nodes of a complex computer system both controllable and observable and therefore testable. This is often the only method of ensuring hardware integrity in many modern computer systems.

One method for providing BIST is to replace the functional registers within a design with serial scan shift registers. The serial scan shift registers can operate in both a functional mode and a test mode. During normal operations, the serial scan shift registers are placed in functional mode and operate like any other flip-flop. In test mode, the serial scan shift registers are configured into a scan path which allows test data to be "serially shifted" through the registers within the design.

Typically, a support controller scans in computer generated serial scan test vectors through the serial scan shift registers within the design. Once these vectors are fully shifted into the design, the data residing in the serial scan shift registers then travels through the logic gates and eventually arrives at either an I/O pin or another serial scan shift register. The serial scan shift registers are then switched into functional mode and the clock is pulsed once. The functional clock causes the serial scan shift registers to capture the data that has traveled through the logic gates. The serial scan shift registers are then switched back into test mode and the results are shifted out and compared to an expected value. This process may be repeated until the source of an error is identified.

A technique that may be used for automating the latter part of this process is to provide a signature analysis register within the design. The signature analysis register is coupled to predetermined nodes within the design. As a predefined pattern is shifted through the design, the signature analysis register is updated periodically. At the end of the test, the contents of the signature analysis register are compared to an expected "signature". If there is a match, the system is deemed to be fully functional. This eliminates the need to compare the results of the serial scan vectors with an expected result and therefore may reduce the complexity of the support controller. However, the signature analysis approach described above typically only provides a pass or fail result and generally does not identify the faulty hardware element. This is a drawback of the signature analysis approach.

Modern computer systems may utilize error detection techniques on a number of critical nodes to identify when an error exist within the computer system. For example, parity checks may be provided on a number of critical nodes to detect an error therein. A support controller or the like may then be notified of the error wherein the above referenced BIST techniques may be used to isolate the source of the error. As indicated above, the signature analysis approach is generally not used to isolate the source of the error. Rather, a support controller may shift test vectors through a corresponding scan path as described above.

The serial scan techniques described above are commonly used for testing logic gates within a design. However, this techniques may not be efficient for testing large memory elements like Random Access Memories (RAMs). RAMs typically have a large number of address locations which require several different patterns to be written to each address location to ensure that there are no "stuck" bits, addresses, and/or data lines. To serially shift-in and shift-out test vectors for each address location/pattern combination would require a relatively large amount of time. Further, computer systems today require large amounts of Random Access Memory to operate efficiently. Both the Application program and the resulting data are often stored in RAM. Therefore, it is common to have a large array of RAM devices located on a memory card or equivalent within a computer system. The RAM devices located therein have become increasingly large. Today each RAM device can store one megabyte (1 MB) of data or more. Consequently, the number of memory addresses which must be tested in today's computer systems can be very large. As can readily be seen, the BIST approach described above may require a relatively large amount of time to test the number of memory addresses that may be in a modern computer system.

A further limitation of the above referenced BIST approach is that the corresponding computer system, or at least a portion thereof, must be taken out of functional mode and placed in a test mode. This may require the computer system to be interrupted during the execution of a transaction. In some high reliability computing applications, this may not be acceptable. For example, in the banking industry, high reliability computer systems may be used to process a large number of banking transactions. It may not be acceptable to interrupt the banking computer system whenever a fault is detected, unless the fault is a critical fault which could corrupt a corresponding data base. As can readily be seen, an interruption of the banking computer may cause a transaction to be lost. Similarly, in the airline industry, high reliability computer systems may be used to process a large number of seat reservations. It may not be acceptable to interrupt the airline reservation computer system whenever a fault is detected, unless the fault is a critical fault which could corrupt a corresponding data base. As can readily be seen, an interruption of the airline reservation computer may cause a seat assignment to be lost, thereby allowing a single seat to be assigned to multiple passengers or the like.

One method for providing a BIST function within an operating computer system is to employ a dynamic scan register. The dynamic scan register may be controlled by a support controller. The support controller may serially shift a test vector into the dynamic scan register, without disturbing the normal functional operation of the computer system.

Thereafter, the test vector stored in the dynamic scan register may be gated into a functional register wherein a corresponding operation may be performed by the computer system. The result of the corresponding operation may be gated back to the dynamic scan register wherein the support controller may shift the result out for analysis.

The dynamic scan technique may be used to test a variety of elements within a corresponding computer system. For example, like the serial scan techniques described above, a support controller may serial shift a test vector into the dynamic scan register. The test vector may then be gated into a functional data path containing logic gates wherein the output of the logic gates may be gated back to the dynamic scan register. The support controller may then serially shift out the contents of the dynamic scan register for analysis.

In another exemplary application, a memory within a computer system may have an address register, a data register, and a control register coupled thereto. The address register, data register, and control register may be used during normal functional operation to store an address, a data word, and a control word during a read and/or write operation requested by the system.

To perform a read operation of the memory, a support controller may shift an address into a dynamic scan register. The address may then be gated into the address register. The support controller may then shift a control word into the dynamic scan register. The control word may then be gated into the control register. Thereafter, the memory may perform a functional read operation of the memory, resulting in a read data word. The read data word may then be gated back to the dynamic scan register wherein the support controller may shift the read data word out of the dynamic scan register for further analysis.

To perform a write operation of the memory, a support controller may shift an address into a dynamic scan register. The address may then be gated into the address register. The support controller may then shift a data word into the dynamic scan register. The data word may then be gated into the data register. Finally, the support controller may shift a control word into the dynamic scan register. The control word may then be gated into the control register. Thereafter, the memory may perform a functional write operation of the memory. The support controller may then shift another data word into the dynamic scan register. The data word may then be gated into the data register of the memory wherein another functional write operation may be performed. This may continue as long as the support controller provides data words to the dynamic scan register.

The above referenced dynamic scan read and write operations may be invaluable for debugging a system. For example, the support controller may write predetermined data into a memory during normal functional operation of the system. This may be used to inject errors into the system while the system is running to determine the response thereto. Further, the support controller may read predetermined address locations from the memory during normal functional operation of the system. This may be used to determine the contents of the memory during normal functional operation.

A limitation of the above referenced dynamic serial scan technique is that the serial scan transfer between the support controller and the dynamic scan register may be relatively slow. This may be tolerable when testing logic gates within a design, as described above. However, the relatively slow transfer may not be very efficient for testing large memory elements like Random Access Memories (RAMs). RAMs typically have a large number of address locations. It may be desirable to read and/or write a relatively large number of the address locations within the RAM during system debug and/or test. The relatively slow transfer rate of the address, data word, and control word for each read and/or write operation may cause any test thereof to be prohibitively slow.

This limitation may be further pronounced when the integrity of a RAM element is to be determined. That is, it may be desirable to test all of the address locations of a RAM to ensure that there are no "stuck" bits, address lines and/or data lines. However, it may require several different patterns to be written to each address location to ensure that there are no "stuck" bits, addresses, and/or data lines. To serially shift-in and shift-out test vectors to/from the dynamic scan register, for each address location/pattern combination, may require a relatively large amount of time. Further, computer systems today typically require large amounts of Random Access Memory to operate efficiently. Both the Application program and the resulting data are often stored in RAM. Therefore, it is common to have a large array of RAM devices located on a memory card or equivalent within a computer system. Further, the RAM devices located therein have become increasingly large. Today each RAM device may store one megabyte (1 MB) of data or more. Consequently, the number of memory addresses which may require testing and/or debug may be very large. As can readily be seen, any increase in the speed at which a support controller can perform a read and/or write of a memory location of a memory device may significantly decrease the test and/or debug time of a corresponding system.

SUMMARY OF THE INVENTION

The present invention overcomes many of the disadvantages of the prior art by providing a method and apparatus for increasing the efficiency of a BIST read and/or write operation of a memory element within a computer system. As stated above, regardless of whether serial scan registers or dynamic scan registers are employed, BIST read and/or write operations of a memory element may be relatively slow. For example, for each read operation performed, an address and a control word must be serially shifted into the design. Further, the resulting read data word must be serially shifted out of the design. Similarly, for each write operation performed, an address, a data word, and a control word must be serially shifted into the design.

The present invention may reduce the number of bits that are required to be serially shifted into a design by providing an auto-increment block. It is recognized that most multi-word accesses to a memory are made to sequential address locations within the memory. The auto-increment block takes advantage of this by automatically manipulating the address, thereby not requiring subsequent addresses to be serially shifted into the design. Further, the control word may be stored within the design for subsequent accesses. That is, the support controller may shift a starting address and a control word into the design. The addresses for subsequent accesses may be generated by the auto-increment block, thereby only requiring that the support controller shift a data word to/from the design. This may significantly reduce the time necessary to perform the subsequent read and/or write operations. It is contemplated that the auto-increment block may perform an increment function, a decrement function, a multiplier function, or any other arithmetic function deemed appropriate.

In an exemplary embodiment of the present invention, a memory element may have a serial scan address register, a serial scan data register, and a serial scan control register. The serial scan address register and the serial scan control register may be coupled together to form a first scan path. The serial scan address register may be coupled to an auto-increment block. The data register may be in a second scan path. The first scan path may be separately controlled from the second scan path.

For a read operation, a support controller or the like may serially shift an address and a control word into the serial scan address register and the serial scan control register, respectively. The memory may then perform a read of the corresponding address location and provide a data word to the serial scan data register. The support controller may then serial shift the data word out of the serial scan data register for further analysis. Thereafter, the auto-increment block may automatically provide the next address to the memory thereby not requiring the support controller to provide the next address or control word. The memory may then perform a read of the next corresponding address location and may provide another data word to the serial scan data register. The support controller may then serial shift the data word out of the serial scan data register for further analysis as described above. This process may continue until a predetermined number of addresses have been read.

For a write operation, the support controller or the like may serially shift an address, a data word, and a control word into the serial scan address register, serial scan data register and the serial scan control register, respectively. The memory may write the data word to the corresponding address location. The support controller may then serial shift another data word into the serial scan data register for a next write operation. The auto-increment block may automatically provide the next address to the memory thereby not requiring the support controller to provide another address or control word. The memory may then write the next data word to the next corresponding address location. This process may continue until a predetermined number of addresses have been written with data.

In another exemplary embodiment, a serial scan word count register may be provided in the first scan path. The serial scan word count register may be loaded with the number of data words that are to be read or written. The serial scan word count register may be decremented every time a corresponding read or write operation is performed. When the value of the word count register reaches a predetermined value, the support controller may be notified and the corresponding read or write operations may be terminated.

In another exemplary embodiment of the present invention, a dynamic scan register may be employed. The dynamic scan register may be controlled by a support controller. The support controller may serially shift a test vector into the dynamic scan register, without disturbing the normal functional operation of the computer system. A memory element within the computer system may have an address register, a data register, and a control register coupled thereto. The address register, data register, and control register may be used during normal functional operation to store an address, a data word, and a control word during a read and/or write operation requested by the system. A auto-increment block may be coupled to the address register.

To perform a read operation of the memory, a support controller may shift an address into the dynamic scan register. The address may then be gated into the address register. The support controller may then shift a control word into the dynamic scan register. The control word may then be gated into the control register. Thereafter, the memory may perform a functional read operation of the memory, resulting in a read data word. The read data word may then be gated back to the dynamic scan register wherein the support controller may shift the read data word out of the dynamic scan register for further analysis. Thereafter, the auto-increment block may automatically increment the contents in the address register. Further, the contents of the control register may remain undisturbed. The memory may perform another functional read operation of the memory, resulting in another data word. In this configuration, the support controller may only need to shift out a resulting data word for each read operation performed. That is, the support controller may not be required to shift an address or a control word into the dynamic scan register for subsequent read operations.

To perform a write operation of the memory, the support controller may shift an address into the dynamic scan register. The address may then be gated into the address register. The support controller may then shift a write data word into the dynamic scan register. The write data word may then be gated into the data register. The support controller may then shift a control word into the dynamic scan register. The control word may then be gated into the control register. Thereafter, the memory may perform a functional write operation of the memory, thereby writing the write data word to the corresponding address location. Thereafter, the auto-increment block may automatically increment the contents in the address register. Further, the contents of the control register may remain undisturbed. The support controller may then shift another write data word into the dynamic scan register and to the data register. The memory may then perform another functional write operation of the memory, thereby writing the write data word to the next corresponding address location. In this configuration, the support controller may only need to shift in a write data word for each write operation performed. That is, the support controller may not be required to shift an address or a control word into the dynamic scan register for subsequent write operations.

In a related exemplary embodiment, the support controller may shift an address, a data word, and a control word into a single dynamic scan register. That is, the address, data word, and control word may be provided to the dynamic scan register during a single shift operation, rather than three shorter shift operations as described above. In this embodiment, the address, data word, and control word may be provided to the address register, the data register, and the control register during a single cycle. The read and write operations of the memory are similar to that described above. That is, for each subsequent read operation, the support controller may only need to shift the resulting data word out of the dynamic scan register because the auto-increment block may provide the subsequent addresses. In this embodiment, the dynamic scan register may be formatted such that the resulting read data word may be provided to the last corresponding bit positions within the dynamic scan register. That is, the support controller may only shift the last corresponding bit positions out of the dynamic scan register for further analysis, rather than shifting all of the bit positions out of the dynamic scan register. This may significantly increase the speed at which a read operation may be performed.

Similarly, for each subsequent write operations, the support controller may only need to shift a write data word into the dynamic scan register because the auto-increment block may provide the subsequent addresses. The dynamic scan register may be formatted such that the write data word may be shifted into the first corresponding bit positions within the dynamic scan register. That is, the support controller may only shift the first corresponding bit positions into the dynamic scan register prior to a subsequent write operation, rather than shifting all of the bit positions into the dynamic scan register. This may significantly increase the speed at which a write operation may be performed.

In another exemplary embodiment of the present invention, a dynamic scan register may be provided in a DSDC application specific integrated circuit (ASIC). The DSDC ASIC may provide an interface between a microsequencer and a memory. The microsequencer may communicate with the DSDC ASIC over a micro bus (MBUS) and may communicate with the memory via the DSDC ASIC. The DSDC ASIC may receive a data packet from the microsequencer over the MBUS. The data packet may comprise an address or a data word.

For a read operation during functional operation, the microsequencer may provide an address to the DSDC ASIC. The address may be latched into an address register. In the exemplary embodiment, the address may contain both the desired memory address and the necessary control information. One control field may indicate whether the address register is to be in an auto-increment mode. The address may then be provided to the memory wherein the memory may provide a corresponding data word to a data register. The microsequencer may then read the data register to complete a read operation. When successive memory addresses are to be read, the auto increment mode may be enabled. In this mode, the microsequencer may only need to read the corresponding read data word, and may not be required to send an address, as described above. For a write operation during functional operation, the microsequencer may provide an address to the DSDC ASIC. The address may be latched into the address register. In the exemplary embodiment, the address may contain both the desired memory address and the necessary control information. One control field may indicate whether the address register is to be in an auto-increment mode. During a subsequent MBUS bus cycle, the microsequencer may provide a write data word to the DSDC ASIC. The write data word may be latched into a data register. The address and the write data word may then be provided to the memory wherein the memory may write the write data word to the corresponding address location. When successive memory addresses are to be written, the auto-increment mode may be enabled. In this mode, the microsequencer may only need to send the corresponding write data word, and may not be required to send an address, as described above.

The dynamic register may allow a support controller to read and/or write the memory during the normal functional operation of the computer system. For example, the support controller may perform a read operation by shifting an address and a number of control bits into the dynamic scan register. The address may then be gated to the address register. In an exemplary embodiment, the support controller may then shift a word count into the dynamic scan register. The word count may then be gated to a word count register. The address may then be provided to the memory and the memory may provide a corresponding read data word. The read data word may be gated back to the dynamic scan register wherein the support controller may shift out the contents thereof for further analysis. The word count register may then be decremented and the address may be automatically incremented. Thereafter, the support controller may not be required to shift an address into the dynamic scan register for subsequent read operations. Rather, the support controller may merely shift each read data word from the dynamic scan register as it is provided to the dynamic scan register by the memory. This may be continued until the word count register is decremented to zero. This may significantly increase the speed at which a read operation may be dynamically performed.

For a write operation, the support controller may shift an address and a number of control bits into the dynamic scan register. The address may then be gated to the address register. The support controller may then shift a write data word into the dynamic scan register. The write data word may then be gated to a data register. The address and write data word may then be provided to the memory and the memory may write the write data word into the corresponding address location. The address may then be automatically incremented as described above. Thereafter, the support controller may not be required to shift an address into the dynamic scan register for subsequent write operations. Rather, the support controller may only be required to shift a write data word into the dynamic scan register for each write operation. This may be continued until so long as the support controller continues to provide a new write data word. This may significantly increase the speed at which a write operation may be dynamically performed.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIGS. 10A–10B comprise a table illustrating an exemplary bus description of the DSD bus of FIG. 8;

DETAILED DESCRIPTION OF THE PREFERRED EMBODIMENTS

Figure 1:
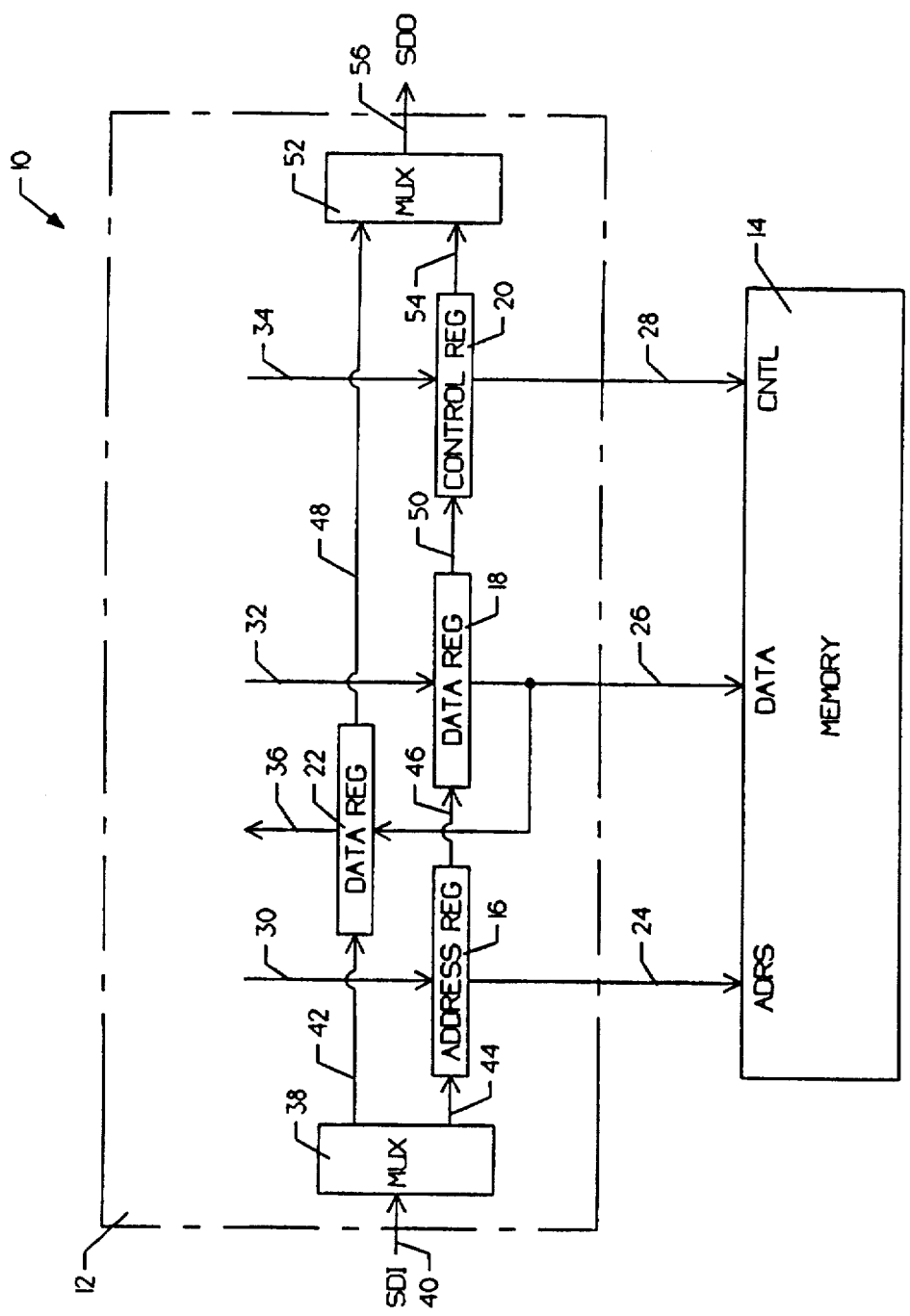
FIG. 1 is a block diagram of a memory test apparatus utilizing serial scan shift registers.

FIG. 1 is a block diagram of a memory test apparatus utilizing serial scan shift registers. The block diagram is generally shown at 10. A logic block 12 may interface with a memory 14. Memory 14 may have an address input port, a data input/output port, and a control input port. Logic block 12 may provide an address to the address input port of memory 14 via interface 24. Logic block 12 may further provide a number of control signals to the control input port of memory 14 via interface 28. Finally, logic block 12 may provide and receive data to/from the data input/output port of memory 14 via interface 26.

Logic block 12 may have an address register 16, a data input register 18, a control register 20, and a data output register 36. During a functional write operation, address register 16 may receive an address from logic block 12 via interface 30 wherein address register 16 may provide the address to the address input port of memory 14 via interface 24. Further, data input register 18 may receive a data word from logic block 12 via interface 32 wherein data input register 18 may provide the data word to the data input/ output port of the memory 14 via interface 26. Finally, control register 20 may receive control signals from logic block 12 via interface 34 wherein control register 20 may provide the control signals to the control input port of memory 14 via interface 28. The control signals provided by logic block 12 may include a chip enable, a read/write control signal, etc. In response to these inputs, memory 14 may write the data word provided on interface 26 to the corresponding address location. During a next functional write operation, logic block 12 may provide another address and data word to address register 16 and data input register 18, respectively, wherein memory 14 may write the next data word to the corresponding address location.

During a functional read operation, address register 16 may receive an address from logic block 12 via interface 30 wherein address register 16 may provide the address to the address input port of memory 14 via interface 24. Further, control register 20 may receive control signals from logic block 12 via interface 34 wherein control register 20 may provide the control signals to the control input port of memory 14 via interface 28. The control signals provided by logic block 12 may include a chip enable, a read/write control signal, etc. In response to these inputs, memory 14 may read the data word located at the corresponding address location, and may provide the data word to data output register 22 via interface 26. Logic block 12 may then read the data word from data output register 22 via interface 36 to complete the read operation. During a next functional read operation, logic block 12 may provide another address to address register 16 wherein memory 14 may read the next corresponding address location.

As indicated above, the complexity of modern computer systems has increased exponentially over the past several decades. Because of this increased complexity, many of the internal nodes within modern computer systems are not controllable or observable from the external I/O pins. BIST design techniques have been developed to combat this growing problem. BIST can be used to make the internal nodes of a complex computer system both controllable and observable and therefore testable. This is often the only method of ensuring hardware integrity in many modern computer systems.

One method for providing BIST is to replace the functional registers within a design with serial scan shift registers. In FIG. 1, address register 16, data input register 18, data output register 22, and control register 20 may be serial scan shift registers. The serial scan shift registers can operate in both a functional mode and a test mode. During normal operations, the serial scan shift registers are placed in functional mode and operate like any other flip-flop. In test mode, the serial scan shift registers are configured into a scan path which allows test data to be "serially shifted" through the registers within the design. In FIG. 1, address register 16 may be coupled to data input register 18 via interface 46. Similarly, data input register 18 may be coupled to control register 20 via interface 50. Finally, address register 16 may be coupled to a multiplexer 38 via interface 44 and control register 20 may be coupled to multiplexer 52 via interface 54. In this configuration, a scan path may be formed wherein data may be serially shifted in/out of address register 16, data input register 18, and control register 20. Similarly, data output register 22 may be coupled to multiplexer 38 via interface 42 and further may be coupled to multiplexer 52 via interface 48. In this configuration, data output register 22 may comprise a scan path wherein data may be shifted in/out of data output register 22.

Typically, a support controller scans in computer generated serial scan test vectors through the serial scan shift registers within the design. Once these vectors are fully shifted into the design, the data residing in the serial scan shift registers then may travel through the logic gates and eventually arrives at either an I/O pin or another serial scan shift register. In FIG. 1, a support controller (not shown) may scan an address, a data word, and a control word into address register 16, data input register 18, and control register 20, respectively. The serial scan shift registers are then switched into functional mode and the clock is pulsed once. The functional clock causes the serial scan shift registers to capture the data that has traveled through the logic gates. For example, the address and control signals may be released by address register 16 and control register 20 wherein a read operation is performed on memory 14. Memory 14 may then provide a read data word to data output register 22. The serial scan shift registers are then switched back into test mode and the results may be shifted out and compared to an expected value. In FIG. 1, the contents of data output register may be scanned out and compared to an expected read data word. This process may be repeated until the source of an error is identified. In FIG. 1, two scan paths are shown. However, it is recognized that a single scan path may be provided to test memory 14.

The serial scan techniques described above are commonly used for testing logic gates within a design. However, this techniques may not be efficient for testing large memory elements like Random Access Memories (RAMs). RAMs typically have a large number of address locations which require several different patterns to be written to each address location to ensure that there are no "stuck" bits, addresses, and/or data lines. To serially shift-in and shift-out test vectors for each address location/pattern combination would require a relatively large amount of time. Further, computer systems today require large amounts of Random Access Memory to operate efficiently. Both the Application program and the resulting data are often stored in RAM. Therefore, it is common to have a large array of RAM devices located on a memory card or equivalent within a computer system. The RAM devices located therein have also become increasingly large. Today each RAM device can store one megabyte (1 MB) of data or more. Consequently, the number of memory addresses which must be tested in today's computer systems can be very large. As can readily be seen, the BIST approach described above may require a relatively large amount of time to test the number of memory addresses that may be in a modern computer system.

A further limitation of the above referenced BIST approach is that the corresponding computer system, or at least a portion thereof, must be taken out of functional mode and placed in a test mode. In FIG. 1, address register 16, data input register 18, data output register 22, and control register 20 must be taken out of functional mode and placed into a test mode. This may require that the corresponding computer system be interrupted during the execution of a transaction. In some high reliability computing applications, this may not be acceptable. For example, in the banking industry, high reliability computer systems may be used to process a large number of banking transactions. It may not be acceptable to interrupt the banking computer system whenever a fault is detected, unless the fault is a critical fault which could corrupt a corresponding data base. As can readily be seen, an interruption of the banking computer may cause a transaction to be lost. Similarly, in the airline industry, high reliability computer systems may be used to process a large number of seat reservations. It may not be acceptable to interrupt the airline reservation computer system whenever a fault is detected, unless the fault is a critical fault which could corrupt a corresponding data base. As can readily be seen, an interruption of the airline reservation computer may cause a seat assignment to be lost, thereby allowing a single seat to be assigned to multiple passengers or the like.

Figure 2:
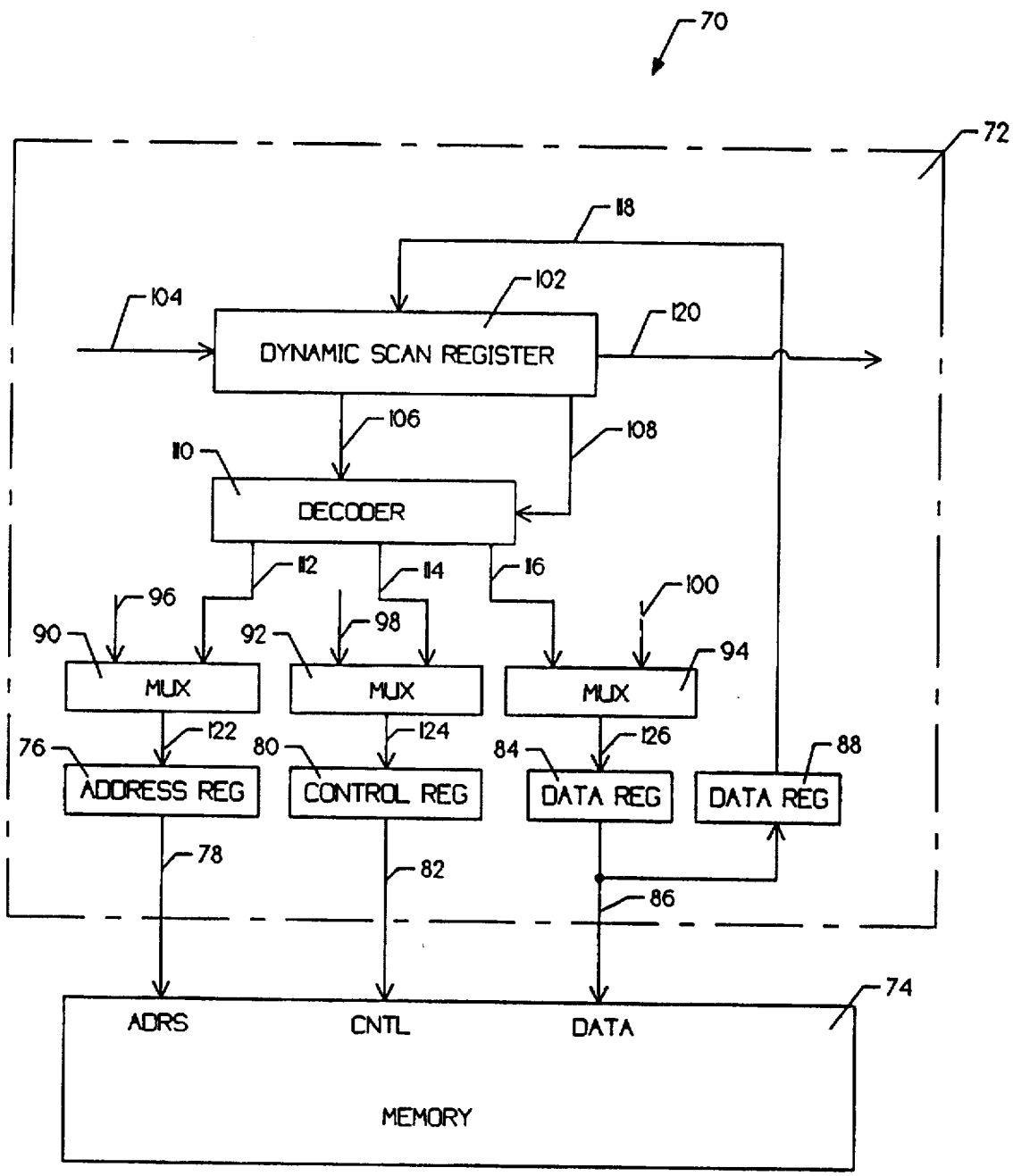
FIG. 2 is a block diagram of a memory test apparatus utilizing a dynamic scan register.

FIG. 2 is a block diagram of a memory test apparatus utilizing a dynamic scan register. The block diagram is generally shown at 70. One method for providing a BIST function within an operating computer system is to employ a dynamic scan register. The dynamic scan register may be controlled by a support controller. The support controller may serially shift a test vector into the dynamic scan register, without disturbing the normal functional operation of the computer system. Thereafter, the test vector stored in the dynamic scan register may be gated into a functional register wherein a corresponding operation may be performed by the computer system. The result of the corresponding operation may be gated back to the dynamic scan register wherein the support controller may shift the result out for analysis.

The dynamic scan technique may be used to test a variety of elements within a corresponding computer system. For example, like the serial scan techniques described above, a support controller may serial shift a test vector into the dynamic scan register. The test vector may then be gated into a functional data path containing logic gates wherein the output of the logic gates may be gated back to the dynamic scan register. The support controller may then serially shift out the contents of the dynamic scan register for analysis.

In FIG. 2, a logic block 72 may interface with a memory 74. Memory 74 may have an address input port, a data input/output port, and a control input port. Logic block 72 may provide an address to the address input port of memory 74 via interface 78. Logic block 72 may further provide a number of control signals to the control input port of memory 74 via interface 82. Finally, logic block 72 may provide and receive data to/from the data input/output port of memory 74 via interface 86.

Logic block 72 may have an address register 76, a data input register 84, a control register 80, and a data output register 88. Address register 76 may be coupled to a multiplexer 90 via interface 122 and control register 80 may be coupled to a multiplexer 92 via interface 124. Further, data input register 84 may be coupled to multiplexer 94 via interface 126. Multiplexers 90, 92, and 94 may have an input for receiving an address, a control word, and a data input word, respectively, during normal functional operation. However, multiplexers 90, 92, and 94 may have another input for receiving an address, a control word, and a data input word, respectively, from a decoder 110 or the like. Decoder 110 may receive an address, a control word, and a data input word from a dynamic scan register 102. Further, decoder 110 may be controlled by a number of control bits provided on interface 108. That is, the number of control bits may indicate where the current contents of the dynamic scan register are to be directed. For example, during a first scan cycle, the support controller may scan in an address. The support controller may provide a number of control bits such that decoder 110 directs the address to multiplexer 112. Dynamic scan register 102 may be coupled to the support controller (not shown) via interfaces 104 and 120.

During a normal functional write operation, multiplexer 90 may receive an address from logic block 72 via interface 96 wherein multiplexer 90 may provide the address to address register 76. Address register 76 may then provide the address to the address input port of memory 74 via interface 78. Further, multiplexer 92 may receive a control word from logic block 72 via interface 98 wherein multiplexer 92 may provide the control word to control register 80. Control register 80 may then provide the control word to the control input port of memory 74 via interface 82. The control signals provided by logic block 72 may include a chip enable, a read/write control signal, etc. Finally, multiplexer 94 may receive a data input word from logic block 72 via interface 100 wherein multiplexer 94 may provide the data input word to data input register 84. Data input register 84 may then provide the data input word to the data input/output port of memory 74 via interface 86. In response to these inputs, memory 74 may write the data word provided on interface 86 to the corresponding address location. During a next functional write operation, logic block 72 may provide another address and data word to address register 76 and data input register 84, respectively, wherein memory 74 may write the next data word to the corresponding address location.

During a normal functional read operation, multiplexer 90 may receive an address from logic block 72 via interface 96 wherein multiplexer 90 may provide the address to address register 76. Address register 76 may then provide the address to the address input port of memory 74 via interface 78. Further, multiplexer 92 may receive a control word from logic block 72 via interface 98 wherein multiplexer 92 may provide the control word to control register 80. Control register 80 may then provide the control word to the control input port of memory 74 via interface 82. The control signals provided by logic block 72 may include a chip enable, a read/write control signal, etc. In response to these inputs, memory 74 may read the data word located at the corresponding address location, and may provide the data word to data output register 88 via interface 86. Logic block 72 may then read the data word from data output register 88 via interface 118 to complete the read operation. During a next functional read operation, logic block 72 may provide another address to address register 76 wherein memory 74 may read the next corresponding address location.

An advantage of the dynamic scan register approach is that address register 76, data registers 84 and 88, and control register 80 may not have to be switched out of a functional mode and placed into a test mode. To perform a read operation of memory 74, a support controller (not shown) may shift an address into dynamic scan register 102 via interface 104. The address may then be gated into address register 76 via multiplexer 90. The support controller may then shift a control word into dynamic scan register 102 via interface 104. The control word may then be gated into control register 80 via multiplexer 92. Thereafter, memory 74 may perform a functional read operation of the corresponding memory location, resulting in a read data word. The read data word may then be gated back to dynamic scan register 102 via data output register 88, wherein the support controller may shift the read data word out of the dynamic scan register via interface 120 for further analysis. For another read operation, the support controller may shift in another read address into dynamic scan register 102 via interface 104. The read address may then be gated into address register 76 via multiplexer 90. The support controller may then shift a control word into dynamic scan register 102 via interface 104. The control word may then be gated into control register 80 via multiplexer 92. Thereafter, memory 74 may perform a functional read operation of the corresponding memory location, resulting in a read data word. The read data word may then be gated back to dynamic scan register 102 via data output register 88, wherein the support controller may shift the read data word out of the dynamic scan register via interface 120 for further analysis.

To perform a write operation of the memory, a support controller may shift an address into dynamic scan register 102 via interface 104. The address may then be gated into address register 76 via multiplexer 90. The support controller may then shift a data word into dynamic scan register 102 via interface 104. The data word may then be gated into data input register 84 via multiplexer 94. Finally, the support controller may shift a control word into dynamic scan register 102 via interface 104. The control word may then be gated into control register 80 via multiplexer 92. Thereafter, the memory may perform a functional write operation to the corresponding memory location. The support controller may then shift another address into dynamic scan register 102 via interface 104 wherein the address may be provided to address register 76 via multiplexer 90. To perform another write operation, the support controller may shift another write address into dynamic scan register 102 via interface 104 wherein the write address may be gated into address register 76 via multiplexer 90. Thereafter, the support controller may shift another data word into dynamic scan register 102 via interface 104 wherein the data word may be gated into data input register 84 via multiplexer 94. Finally, the support controller may shift another control word into dynamic scan register 102 via interface 104 wherein the control word may be gated into control register 80 via multiplexer 92. After this is complete, another functional write operation may be performed. This may continue as long as the support controller provides addresses, data words, and control word to dynamic scan register 102.

The above referenced dynamic scan read and write operations may be invaluable for debugging a system. For example, the support controller may write predetermined data into a memory during normal functional operation of the system. This may be used to inject errors into the system while the system is running to determine the response thereto. Further, the support controller may read predetermined address locations from the memory during normal functional operation of the system. This may be used to determine the contents of the memory during normal functional operation.

A limitation of the above referenced dynamic serial scan technique is that the serial scan transfer between the support controller and dynamic scan register 102 may be relatively slow. This may be tolerable when testing logic gates within a design, as described above. However, the relatively slow transfer may not be very efficient for testing large memory elements like Random Access Memories (RAMs). RAMs typically have a large number of address locations. Further, it may be desirable to read and/or write a relatively large number of the address locations within the RAM during system debug and/or test. The relatively slow transfer rate of the address, data word, and control word for each read and/or write operation may cause any test thereof to be prohibitively slow.

This limitation may be further enhanced when the integrity of a RAM element is to be determined. That is, it may be desirable to test all of the address locations of a RAM to ensure that there are no "stuck" bits, address lines and/or data lines. However, it may require several different patterns to be written to each address location to ensure that there are no "stuck" bits, addresses, and/or data lines. To serially shift-in and shift-out test vectors to/from dynamic scan register 102, for each address location/data pattern combination, may require a relatively large amount of time. Further, computer systems today typically require large amounts of Random Access Memory to operate efficiently. Both the Application program and the resulting data are often stored in RAM. Therefore, it is common to have a large array of RAM devices located on a memory card or equivalent within a computer system. Finally, the RAM devices located therein have become increasingly large. Today each RAM device may store one megabyte (1 MB) of data or more. Consequently, the number of memory addresses which may require testing and/or debug may be very large. As can readily be seen, any increase in the speed at which a support controller can perform a read and/or write of a memory location of a memory device may significantly decrease the test and/or debug time of a corresponding system.

Figure 3:
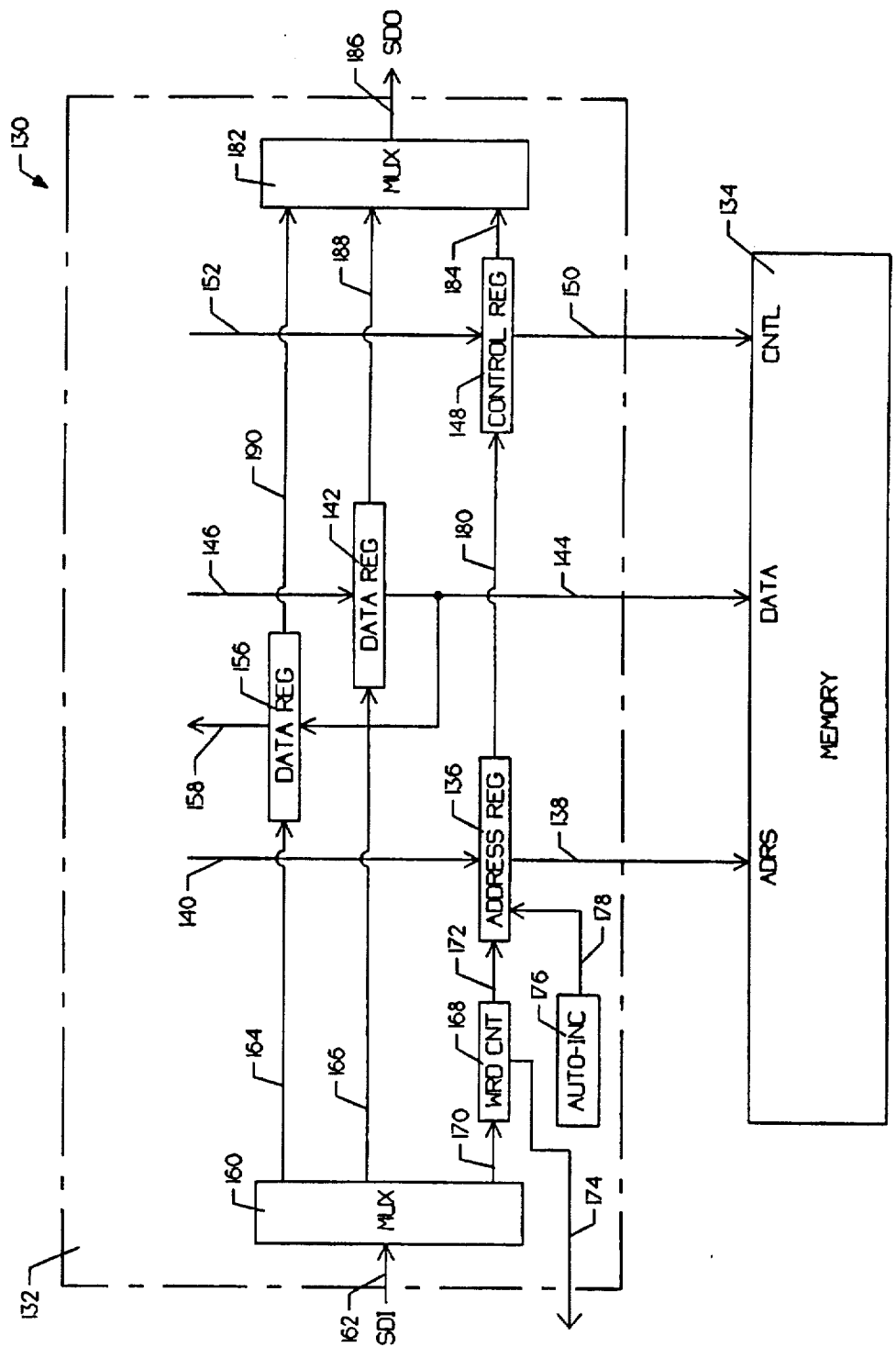
FIG. 3 is a block diagram of an exemplary embodiment of the present invention which utilizes serial scan shift registers.

FIG. 3 is a block diagram of an exemplary embodiment of the present invention which utilizes serial scan shift registers. The block diagram is generally shown at 130. The exemplary embodiment may increase the efficiency of a BIST read and/or write operation of a memory element within a computer system. As stated above, regardless of whether serial scan registers or dynamic scan registers are employed, BIST read and/or write operations of a memory element may be relatively slow. For example, for each read operation performed, an address and a control word must be serially shifted into the design. Further, the resulting read data word must be serially shifted out of the design. Similarly, for each write operation performed, an address, a data word, and a control word must be serially shifted into the design.

The present invention may reduce the number of bits that are required to be serially shifted into a design by providing an auto-increment block. It is recognized that most multi-word access to a memory are made to sequential address locations within the memory. The auto-increment block takes advantage of this and automatically manipulates the address thereby not requiring subsequent addresses to be serially shifted into the design by a support controller. Further, the control word may be stored within the design for subsequent accesses. That is, the support controller may shift a starting address and a control word into the design. The addresses for subsequent accesses may be generated by the auto-increment block, thereby only requiring that the support controller shift a data word to/from the design. This may significantly reduce the time necessary perform the subsequent read and/or write operations.

In an exemplary embodiment, a logic block 132 may interface with a memory 134. Memory 134 may have an address input port, a data input/output port, and a control input port. Logic block 132 may provide an address to the address input port of memory 134 via interface 138. Logic block 132 may further provide a number of control signals to the control input port of memory 134 via interface 150. Finally, logic block 132 may provide and receive data to/from the data input/output port of memory 134 via interface 144.

Logic block 132 may have an address register 136, a data input register 142, a control register 148, and a data output register 156. During a functional write operation, address register 136 may receive an address from logic block 132 via interface 140 wherein address register 136 may provide the address to the address input port of memory 134 via interface 138. Further, data input register 142 may receive a data word from logic block 132 via interface 146 wherein data input register 142 may provide the data word to the data input/output port of the memory 134 via interface 144.

Finally, control register 148 may receive control signals from logic block 132 via interface 152 wherein control register 148 may provide the control signals to the control input port of memory 134 via interface 150. The control signals provided by logic block 132 may include a chip enable, a read/write control signal, etc. In response to these inputs, memory 134 may write the data word provided on interface 144 to the corresponding address location. During a next functional write operation, logic block 132 may provide another address and data word to address register 136 and data input register 142, respectively, wherein memory 134 may write the next data word to the corresponding address location.

As indicated above, one method for providing BIST is to replace the functional registers within a design with serial scan shift registers. In the exemplary embodiment, address register 136, data input register 142, data output register 156, and control register 148 may be serial scan shift registers. The serial scan shift registers can operate in both a functional mode and a test mode. During normal operations, the serial scan shift registers are placed in functional mode and operate like any other flip-flop. In test mode, the serial scan shift registers are configured into a scan path which allows test data to be "serially shifted" through the registers within the design.

In the exemplary embodiment, a word count register 168, address register 136, and control register 148 may be coupled together via interfaces 172 and 180 to form a scan path. A multiplexer 160 may be coupled to a support controller via interface 162 and may be further coupled to word count register 168 via interface 170. Multiplexer 182 may be coupled to the support controller via interface 186 and may be further coupled to control register 148 via interface 184. Similarly, data input register 142 may be coupled to multiplexer 160 via interface 166 and multiplexer 182 via interface 188. Finally, data output register 156 may be coupled to multiplexer 160 via interface 164 and may be further coupled to multiplexer 182 via interface 190. This configuration provides three separate scan paths within the design. A support controller may control multiplexers 160 and 182 to control which scan path is selected. In this configuration, the support controller may be serially shifted in/out of word count register 168, address register 136, data input register 142, data output register 156, and control register 148. It is recognized that the above reference configuration is only exemplary and that other configurations contemplated.

Typically, a support controller scans in computer generated serial scan test vectors through the serial scan shift registers within the design. Once these vectors are fully shifted into the design, the data residing in the serial scan shift registers then may travel through the logic gates and eventually arrives at either an I/O pin or another serial scan shift register. In the exemplary embodiment, a support controller (not shown) may scan a word count, an address, a data word, and a control word into word count register 168, address register 136, data input register 142, and control register 148, respectively. The serial scan shift registers are then switched into functional mode and the clock is pulsed once. The functional clock causes the serial scan shift registers to capture the data that has traveled through the logic gates. For example, the address and control signals may be released by address register 136 and control register 148 wherein a read operation may be performed on memory 134. Memory 134 may then provide a read data word to data output register 156. The serial scan shift registers are then switched back into test mode and the results may be shifted out and compared to an expected value. In the exemplary embodiment, the contents of data output register may be scanned out and compared to an expected read data word. This process may be repeated until the source of an error is identified.

The exemplary embodiment may have an auto-increment block 176 which may be coupled to address register 136 via interface 178. It is recognized that most multi-word access to a memory are made to sequential address locations within the memory. Auto-increment block 176 takes advantage of this by automatically manipulating the address thereby not requiring subsequent addresses to be serially shifted into the design. That is, the support controller may shift a starting address and a control word into the design. The addresses for subsequent accesses may be generated by the auto-increment block, thereby only requiring that the support controller shift a data word to/from the design. This may significantly reduce the time necessary perform the subsequent read and/or write operations. It is contemplated that the auto-increment block may perform an increment function, a decrement function, a multiplier function, or any other arithmetic function deemed appropriate. In the exemplary embodiment, the auto-increment block 176 may automatically increment the contents of address register 136 and provide the results to memory 134. The auto-increment block may significantly increase the speed at which a memory may be tested when a number of successive addresses are read or written.

For a read operation, the support controller or the like may serially shift a word count, an address, and a control word into word count register 168, address register 136, and control register 148, respectively. In the configuration shown in FIG. 3, the support controller may load these registers using a single scan path. The memory may then perform a read of the corresponding address location and provide a data word to data output register 156 via interface 144. The support controller may then serial shift the data word out of data output register 156 for further analysis. Thereafter, the auto-increment block may automatically provide the next address to the memory thereby not requiring the support controller to provide the next word count, address, or control word. The memory may perform a read of the next corresponding address location and may provide another data word to data output register 156. The support controller may then serial shift the data word out of data input register 156 for further analysis as described above. This process may continue until a predetermined block of address have been read. Note that in the exemplary embodiment, data output register is provided in separate scan path such that only the data bits therein need to be scanned out. This may increase the speed at which a read operation may be performed. For example, if a read data word comprises 16 bits, the support controller may only have to scan 16 bits for each read operation. This is far less than prior art schemes.

For a write operation, the support controller or the like may serially shift an address, a data word, and a control word into address register 136, data input register 142 and control register 148, respectively. The memory may write the data word to the corresponding address location. The support controller may then serial shift another data word into data input register 142 for a next write operation. The auto-increment block 176 may automatically provide the next address to the memory thereby not requiring the support controller to provide another address or control word. The memory may then write the next data word to the next corresponding address location. This process may continue until a predetermined block of addresses have been written with data. Note that in the exemplary embodiment, data input register 142 is provided in a separate scan path such that only the data bits therein need to be scanned in for every write operation. This may increase the speed at which a write operation may be performed. For example, if a write data word comprises 16 bits, the support controller may only have to scan 16 bits into the design for each write operation. This is far less than prior art schemes.

In the exemplary embodiment, word count register 168 may be provided. Word count register 168 may be loaded with the number of data words that are to be read or written. Word count register 168 may be decremented every time a corresponding read or write operation is performed. When the value of the word count register reaches a predetermined value, the support controller may be notified and the corresponding read or write operations may be terminated.

Figure 4:
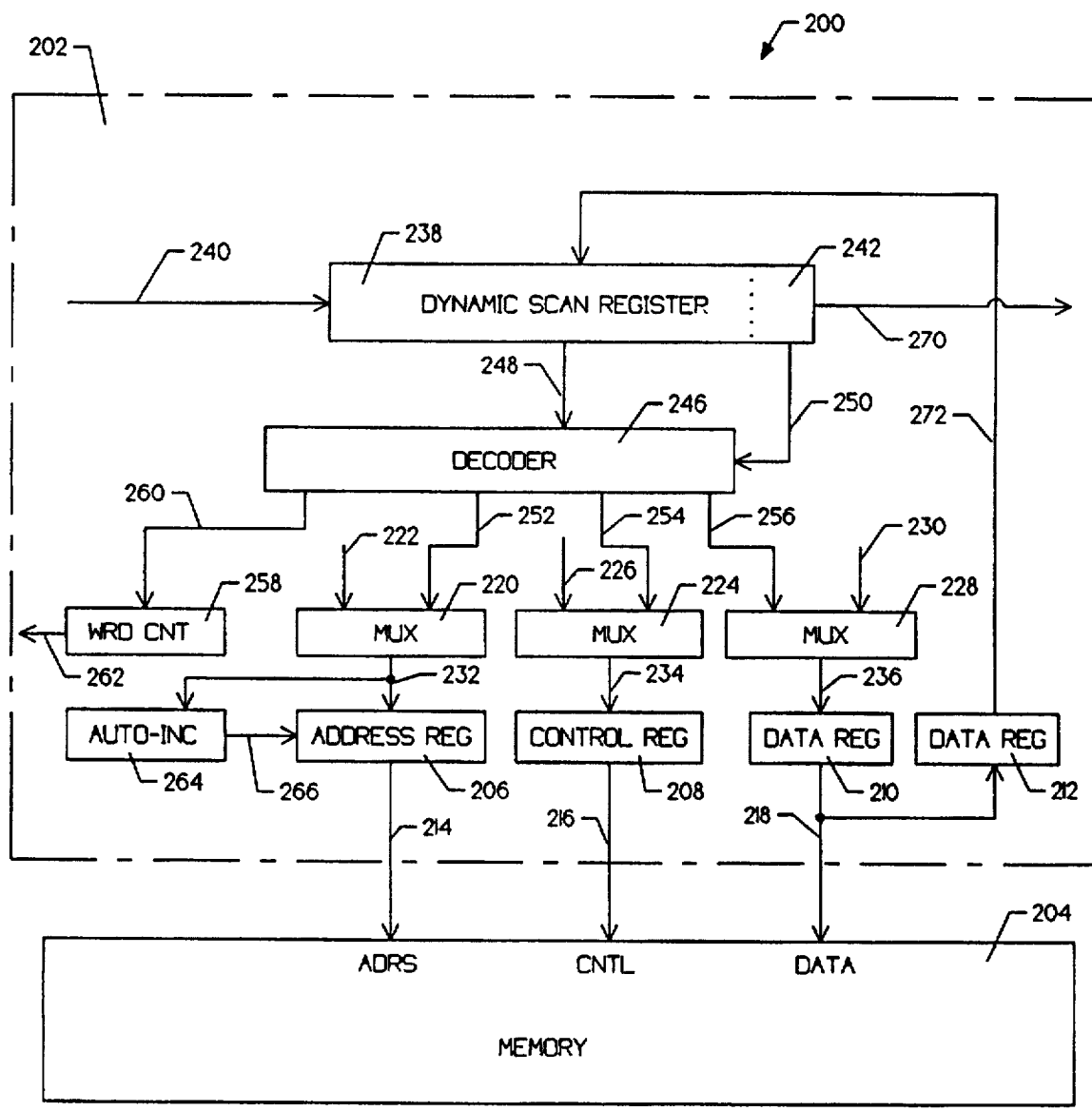
FIG. 4 is a block diagram of another exemplary embodiment of the present invention which utilizes a dynamic scan shift register and a decoder.

FIG. 4 is a block diagram of another exemplary embodiment of the present invention which utilizes a dynamic scan shift register and a decoder. The block diagram is generally shown at 200. The dynamic scan register may be controlled by a support controller. The support controller may serially shift a test vector into the dynamic scan register, without disturbing the normal functional operation of the computer system.

In the exemplary embodiment, a logic block 202 may interface with a memory 204. Memory 204 may have an address input port, a data input/output port, and a control input port. Logic block 202 may provide an address to the address input port of memory 204 via interface 214. Logic block 202 may further provide a number of control signals to the control input port of memory 204 via interface 216. Finally, logic block 202 may provide and receive data to/from the data input/output port of memory 204 via interface 218.

Logic block 202 may have an address register 206, a data input register 210, a control register 208, and a data output register 212. Address register 206 may be coupled to a multiplexer 220 via interface 232 and control register 208 may be coupled to a multiplexer 224 via interface 234. Further, data input register 210 may be coupled to a multiplexer 228 via interface 236. Multiplexers 220, 224, and 228 may have an input for receiving an address, a control word, and a data input word, respectively, during normal functional operation. However, multiplexers 220, 224, and 228 may have another input for receiving an address, a control word, and a data input word, respectively, from a decoder 246 or the like. Decoder 246 may receive an address, a control word, and a data input word from a dynamic scan register 242. Further, decoder 246 may be controlled by a number of control bits provided on interface 250. That is, the number of control bits may indicate where the current contents of the dynamic scan register are to be directed. For example, during a first scan cycle, the support controller may scan in an address. The support controller may provide a number of control bits such that decoder 246 directs the address to multiplexer 220. Dynamic scan register 242 may be coupled to the support controller (not shown) via interfaces 240 and 270.

Logic block 202 may further have a word count register 258 which may be coupled to decoder 246 via interface 260 and may be further coupled to the support controller via interface 262. Word count register 258 may be loaded with the number of data words that are to be read or written. Word count register 258 may be decremented every time a corresponding read or write operation is performed. When the value of the word count register reaches a predetermined value. the support controller may be notified and the corresponding read or write operations may be terminated.

Finally, logic block 202 may further have an auto-increment block 264 which may be coupled to address register 206 via interface 266. It is recognized that most multi-word access to a memory are made to sequential address locations within the memory. Auto-increment block 264 takes advantage of this by automatically manipulating the address thereby not requiring subsequent addresses to be serially shifted into the design. That is, the support controller may shift a starting address and a control word into the design. The addresses for subsequent accesses may be generated by the auto-increment block, thereby only requiring that the support controller shift a data word to/from the design. This may significantly reduce the time necessary perform the subsequent read and/or write operations. It is contemplated that the auto-increment block may perform an increment function, a decrement function, a multiplier function, or any other arithmetic function deemed appropriate.

During a normal functional write operation, multiplexer 220 may receive an address from logic block 202 via interface 222 wherein multiplexer 220 may provide the address to address register 206. Address register 206 may then provide the address to the address input port of memory 204 via interface 214. Further, multiplexer 224 may receive a control word from logic block 202 via interface 226 wherein multiplexer 224 may provide the control word to control register 208. Control register 208 may then provide the control word to the control input port of memory 204 via interface 216. The control signals provided by logic block 202 may include a chip enable, a read/write control signal, etc. Finally, multiplexer 228 may receive a data input word from logic block 202 via interface 230 wherein multiplexer 228 may provide the data input word to data input register 210. Data input register 210 may then provide the data input word to the data input/output port of memory 204 via interface 218. In response to these inputs, memory 204 may write the data word provided on interface 218 to the corresponding address location. During a next functional write operation, logic block 202 may provide another address and data word to address register 206 and data input register 210, respectively, wherein memory 204 may write the next data word to the corresponding address location.

During a normal functional read operation, multiplexer 220 may receive an address from logic block 202 via interface 222 wherein multiplexer 220 may provide the address to address register 206. Address register 206 may then provide the address to the address input port of memory 204 via interface 214. Further, multiplexer 224 may receive a control word from logic block 202 via interface 226 wherein multiplexer 224 may provide the control word to control register 208. Control register 208 may then provide the control word to the control input port of memory 204 via interface 216. The control signals provided by logic block 202 may include a chip enable, a read/write control signal, etc. In response to these inputs, memory 204 may read the data word located at the corresponding address location, and may provide the data word to data output register 212 via interface 218. Logic block 202 may then read the data word from data output register 212 via interface 272 to complete the read operation. During a next functional read operation, logic block 202 may provide another address to address register 206 wherein memory 204 may read the next corresponding address location.

An advantage of the dynamic scan register approach is that address register 206, data registers 210 and 212, and control register 208 may not have to be switched out of a functional mode and placed into a test mode. To perform a read operation of memory 204, a support controller (not shown) may shift an address into dynamic scan register 238 via interface 240. The address may then be gated into address register 206 via multiplexer 220. The support controller may then shift a control word into dynamic scan register 238 via interface 240. The control word may then be gated into control register 208 via multiplexer 224. Thereafter, memory 204 may perform a functional read operation of the corresponding memory location, resulting in a read data word. The read data word may then be gated back to dynamic scan register 238 via data output register 212, wherein the support controller may shift the read data word out of dynamic scan register 238 via interface 270 for further analysis. Thereafter, auto-increment block 164 may automatically increment the contents in address register 206. Further, the contents of control register 208 may remain undisturbed. The memory may perform another functional read operation of the memory, resulting in another read data word. In this configuration, the support controller may only need to shift out a resulting data word for each subsequent read operation performed. That is, the support controller may not be required to shift an address or a control word into dynamic scan register 238 for subsequent read operations.

To perform a write operation of the memory, a support controller may shift an address into dynamic scan register 238 via interface 240. The address may then be gated into address register 206 via multiplexer 220. The support controller may then shift a data word into dynamic scan register 238 via interface 240. The data word may then be gated into data input register 210 via multiplexer 228. Finally, the support controller may shift a control word into dynamic scan register 238 via interface 240. The control word may then be gated into control register 208 via multiplexer 224. Thereafter, memory 204 may perform a functional write operation of the memory, thereby writing the write data word to the corresponding address location. Thereafter, the auto-increment block may automatically increment the contents in address register 206. Further, the contents of control register 208 may remain undisturbed. The support controller may then shift another write data word into dynamic scan register 238 and finally to data input register 210. The memory may then perform another functional write operation of the memory, thereby writing the write data word to the next corresponding address location. In this configuration, the support controller may only need to shift in a write data word for each write operation performed. That is, the support controller may not be required to shift an address or a control word into dynamic scan register 238 for subsequent write operations.

Figure 5A:
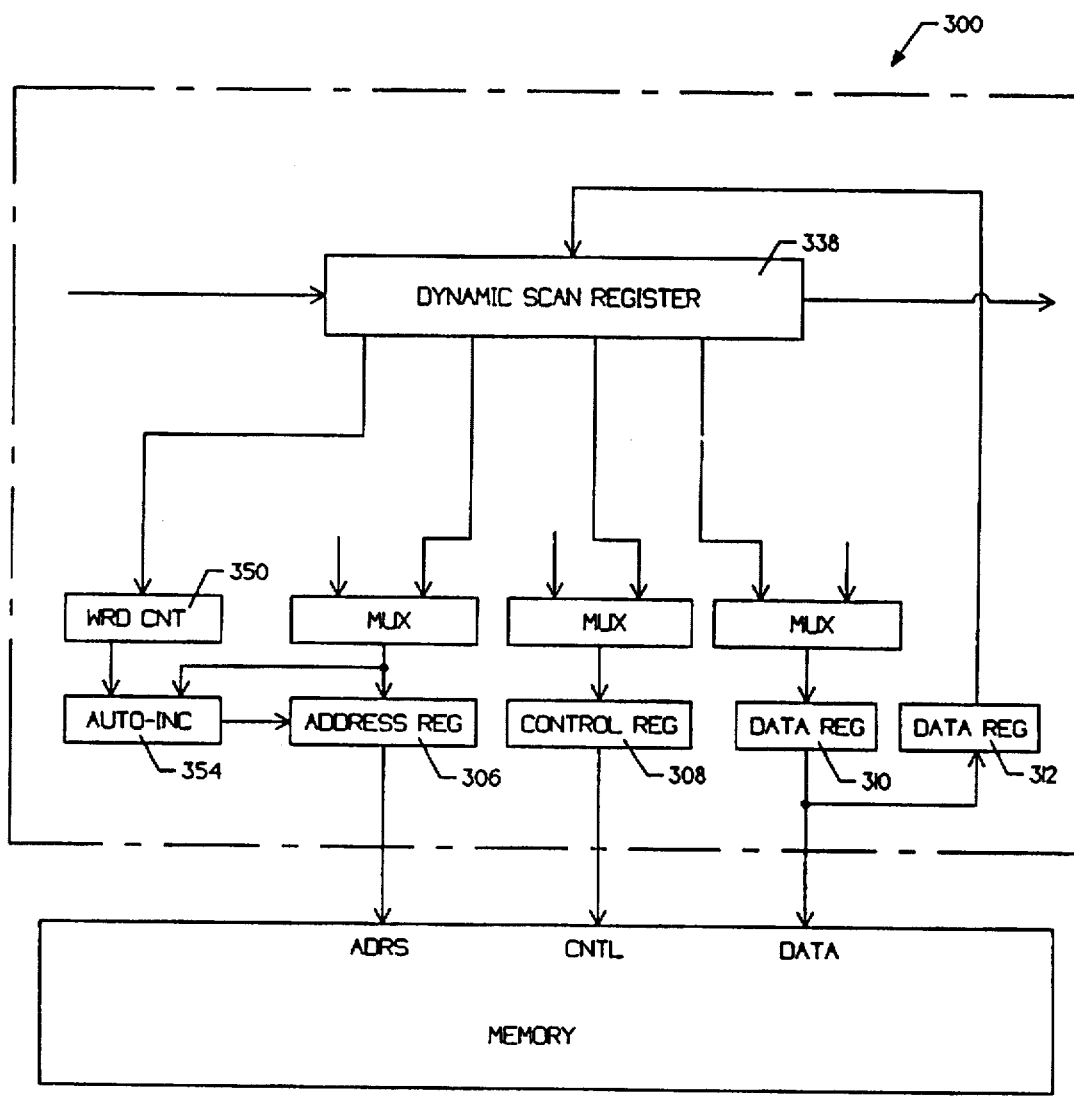
FIG. 5A is a block diagram of yet another exemplary embodiment of the present invention which utilizes a dynamic scan shift register.

FIG. 5A is a block diagram of yet another exemplary embodiment of the present invention which utilizes a dynamic scan shift register. The block diagram is generally shown at 300. The embodiment shown in FIG. 5A is similar to the embodiment shown in FIG. 4 except the decoder has been removed. In this embodiment, the support controller may shift a word count, an address, a data word, and a control word into a single dynamic scan register 338. That is, a word count, an address, a data word, and a control word may be provided to dynamic scan register 338 during a single shift operation, rather than three shorter shift operations as described above. In this embodiment, the word count, address, data word, and control word may be provided to word count register 350, address register 306, data register 310, and control register 308 during a single cycle. The read and write operations of the memory are similar to that described above. That is, for each subsequent read operation, the support controller may only need to shift the resulting data word out of dynamic scan register 338 because auto-increment block 354 may provide the subsequent addresses. In this embodiment, dynamic scan register 338 may be formatted such that the resulting read data word may be provided to the last corresponding bit positions within dynamic scan register 338 (see FIG. 5B). That is, the support controller may only shift the last corresponding bit positions out of dynamic scan register 338 for further analysis, rather than shifting all of the bit positions out of dynamic scan register 338 as previously described. This may significantly increase the speed at which a read operation may be performed.

Similarly, for each subsequent write operations, the support controller may only need to shift a write data word into dynamic scan register 338 because auto-increment block 354 may provide the subsequent addresses. Dynamic scan register 338 may be formatted such that the write data word may be shifted into the first corresponding bit positions within dynamic scan register 338 (see FIG. 5B). That is, the support controller may only shift the first corresponding bit positions into dynamic scan register 338 prior to a subsequent write operation, rather than shifting all of the bit positions into dynamic scan register 338 as previously described. This may significantly increase the speed at which a write operation may be performed.

Figure 5B:
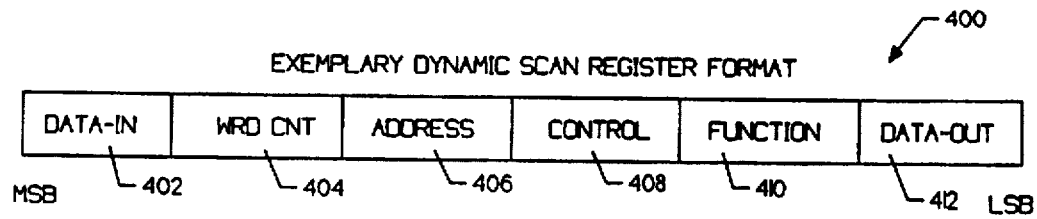
FIG. 5B is a table showing an exemplary bit format for the dynamic scan shift register of FIG. 4 and FIG. 5A.

FIG. 5B is a table showing an exemplary bit format for the dynamic scan shift register of FIG. 4 and FIG. 5A. The table is generally shown at 400. In the exemplary embodiment, dynamic scan register 338 may be formatted to optimize the performance of a read and/or write operation. Because auto-increment block 354 may provide the address for subsequent read and/or write operations, it is only necessary for the support controller to shift in/out a corresponding data word. For example, for a read operation, the support controller need only shift out a resulting read data word. Further, for a write operation, the support controller need only shift in a corresponding write data word. To minimize the number of bits that must be shifted in dynamic scan register 338, the resulting read data word may be provided at the last corresponding bit positions within dynamic scan register 338 as shown at 412. This allows the support controller to only shift out the last corresponding bit position of dynamic scan register 338 during each read operation, rather than shifting all of the bit positions out of dynamic scan register 338 as previously described. This may significantly increase the speed at which a subsequent read operation may be performed. Similarly, the write data word may be provided at the first corresponding bit positions within dynamic scan register 338 as shown at 402. This allows the support controller to only shift in the first corresponding bit positions of dynamic scan register 338 during each write operation, rather than shifting all of the bit positions into the dynamic scan register 338 as previously described. This may significantly increase the speed at which a subsequent write operation may be performed. The word count, address, control, and function codes may be provided at 404, 406, 408, and 410 as shown.

Figure 6:
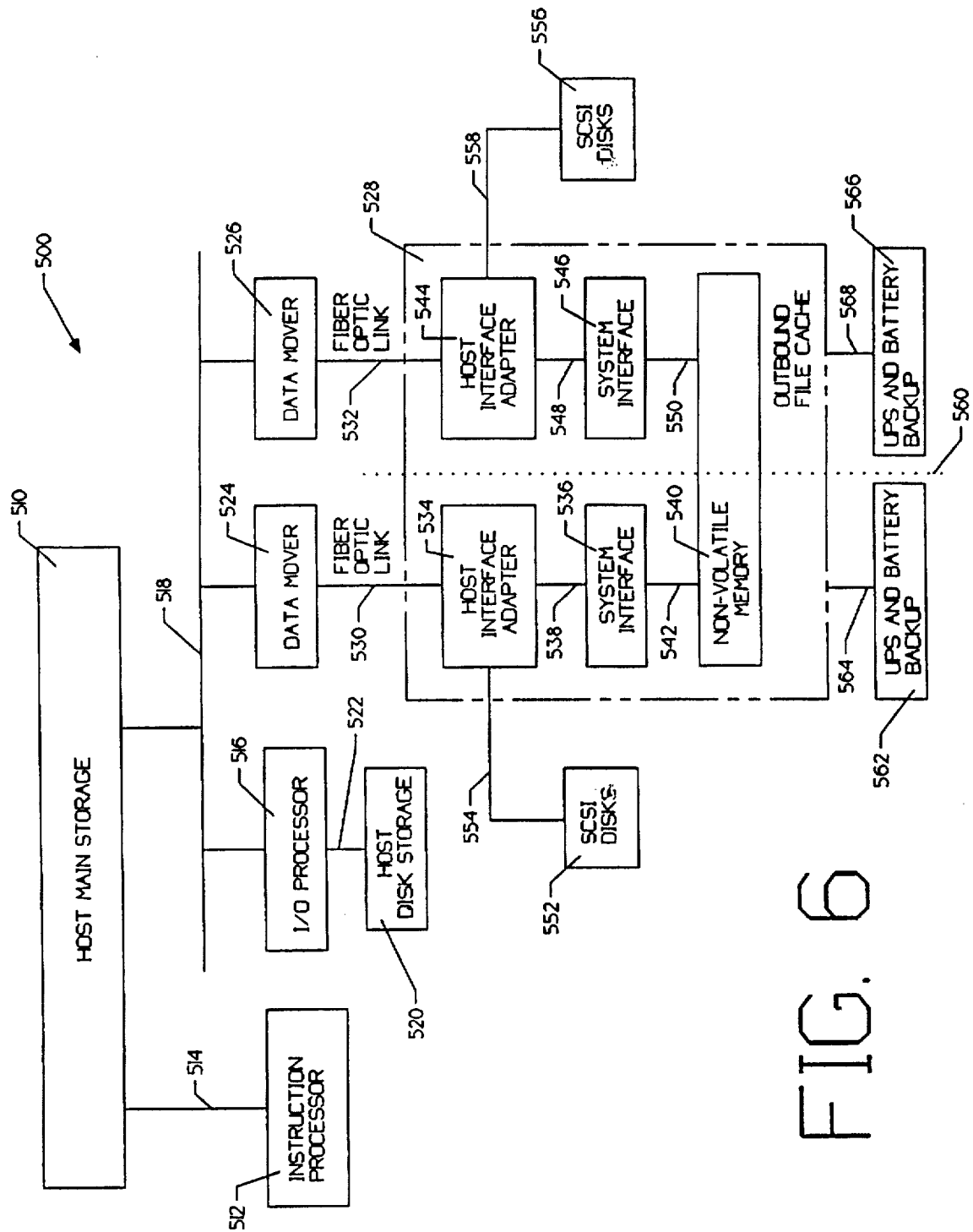
FIG. 6 is a block diagram of the exemplary computer which may incorporate the present invention.

FIG. 6 is a block diagram of the exemplary computer which may incorporate the present invention. The block diagram is generally shown at 500. The XPC comprises an instruction processor 512, an IO processor 516, a host disk storage 520, an outbound File Cache block 528, and a host main storage 510. Instruction processor 512 receives instructions from host main storage 510 via interface 514. Host main storage 510 is also coupled to MBUS 518. I/O processor 516 is coupled to MBUS 518 and is further coupled to host disk storage 520 via interface 522. In the exemplary embodiment, outbound File Cache block 528 is coupled to MBUS 518 through a first data mover 524 and a second data mover 526. Outbound File Cache block 528 may comprise two separate power domains including a power domain-A powered by a universal power source (UPS) and battery backup power source 562 via interface 564, and a power domain-B powered by a UPS power source and battery backup power source 566 via interface 568. The separation of power domain-A and power domain-B is indicated by line 560. UPS and battery backup blocks 562 and 566 may have a detection means therein to detect when a corresponding primary power source fails or becomes otherwise degradated.

Power domain-A of outbound file cache 528 may comprise a host interface adapter 534, a system interface block 536, and a portion of a nonvolatile memory 540. Host interface adapter 534 may be coupled to data mover 524 via fiber optic link 530 and may further be coupled to system interface block 536 via interface 538. System interface block 536 may be coupled to nonvolatile memory 540 via interface 542, as described above. Similarly, host interface adapter 544 may be coupled to data mover 526 via fiber optic link 532 and may further be coupled to system interface block 546 via interface 548. System interface block 546 may be coupled to nonvolatile memory 540 via interface 550, as described above.

The data may be transferred from the host disk storage 520 through I/O processor 516 to host main storage 510. But now, any updates that occur in the data are stored in nonvolatile memory 540 instead of host disk storage 520, at least momentarily. All future references then access the data in nonvolatile memory 540. Therefore, nonvolatile memory 540 acts like a cache for host disk storage 520 and may significantly increases data access speed. Only after the data is no longer needed by the system is it transferred back to host disk storage 520. Data movers 524 and 526 are used to transmit data from the host main storage 510 to the nonvolatile memory 540 and vice versa. In the exemplary embodiment, data movers 524 and 526 perform identical cache functions thereby increasing the reliability of the overall system. A more detailed discussion of the XPC system may be found in the above reference co-pending application, which has been incorporated herein by reference.

In accordance with the present invention, a data save disk system 552 may be coupled to host interface adapter 534 via interface 554. Similarly, data save disk system 556 may be coupled to host interface adapter 544 via interface 558. Data save disk systems 552 and 556 may comprise SCSI type disk drives and host interface adapters 534 and 544, respectively, may provide a SCSI interface thereto. In this configuration, the data elements stored in nonvolatile memory 540 may be downloaded directly to the data save disk systems 552 and 556. This may permit computer system 500 to detect a power failure in a power domain, switch to a corresponding backup power source 562 or 566, and store all of the critical data elements stored in nonvolatile memory 540 on SCSI disk drives 552 or 556 before the corresponding backup power source 562 or 566 also fails.

The primary power sources may comprise a universal power source (UPS) available from the assignee of the present invention. The backup power sources may comprise a limited power source, like a battery. Typical batteries may provide power to a computer system for only a limited time. For some computer systems, a large battery or multiple batteries may be required to supply the necessary power. Further, because the power requirements of some computer systems are substantial, the duration of the battery source may be very limited. It is therefore essential that the critical data elements be downloaded to a corresponding data save disk system 552 or 556 as expediently as possible.

In the exemplary embodiment, backup power source 562 may only power a first portion of nonvolatile memory 540, host interface adapter 534, system interface 536, and data save disk system 552. Similarly, backup power source 566 may only power a second portion of nonvolatile memory 540, host interface adapter 544, system interface 546, and data save disk system 556. In this configuration, the remainder of computer system 500, including instruction processor 512, I/O processor 516, host main storage 510, and host disk storage 520, may not be powered after the primary power source fails. This may allow backup power sources 562 and 566 to remain active for a significantly longer period of time thereby allowing more data to be downloaded from nonvolatile memory 540. In this embodiment, host interface adapters 534 and 544 may have circuitry to support the downloading of the critical data elements to the SCSI disk drives 552 and 556, without requiring any intervention by instruction processor 512 or I/O processor 516.

Coupling data save disk systems 552 and 556 directly to host interface adapters 534 and 544, respectively, rather than to instruction processor 512 or I/O processor 516 may have significant advantages. As indicated above, it may be faster to download the data elements directly from nonvolatile memory 540 to data save disk systems 552 or 556, rather than providing all of the data to I/O processor 516 and then to host disk storage 520. Further, significant power savings may be realized by powering only the blocks in outbound file cache 528 and the corresponding data save disk systems 552 or 556, thereby allowing more data to be downloaded before a corresponding backup power source 562 or 566 fails. Finally, data save disk systems 552 and 556 may be dedicated to storing the data elements in nonvolatile memory 540 and thus may be appropriately sized.

In a preferred mode, once the data save operation has begun, it continues until all of the data in nonvolatile memory 540 has been transferred to the data save disk system. Thereafter, the data save disks are spun down and the outbound file cache 528 is powered down to minimize further drain on the battery backup power source. If the primary power source comes back on during the data save operation, the data save is still completed, but the outbound file cache 528 is not powered down. When primary power is restored, the operation of computer system 500 may be resumed beginning with a data restore operation, but only after the battery backup power source has been recharged to a level which could sustain another primary power source failure.

The data restore operation occurs after normal computer system 500 initialization, including power-up, firmware load, etc. However, before a data restore operation is allowed to begin, the presence of saved data on a corresponding data save disk must be detected. Prior to initiating the data restore operation, the USBC microcode (see FIG. 7) compares the present computer system 500 configuration with the configuration that was present when the data save operation was executed. If the two configurations are not an exact match, the data restore operation is not executed and an error is indicated.

A data save disk set may be added to the outbound file cache 528 as a single or redundant configuration. A single data save set may save one copy of the nonvolatile memory 540 contents, and is used when there is only one Universal Power Source (UPS) 562 driving the outbound file cache 528 and data save disks. A redundant data save disk configuration may have two data save disk sets (as shown in FIG. 6) and may save two copies of the nonvolatile memory contents. In the redundant configuration, one set of data save disk drives may be powered from one UPS while the another set of data save disk drives may be powered by another UPS.

Figure 7:
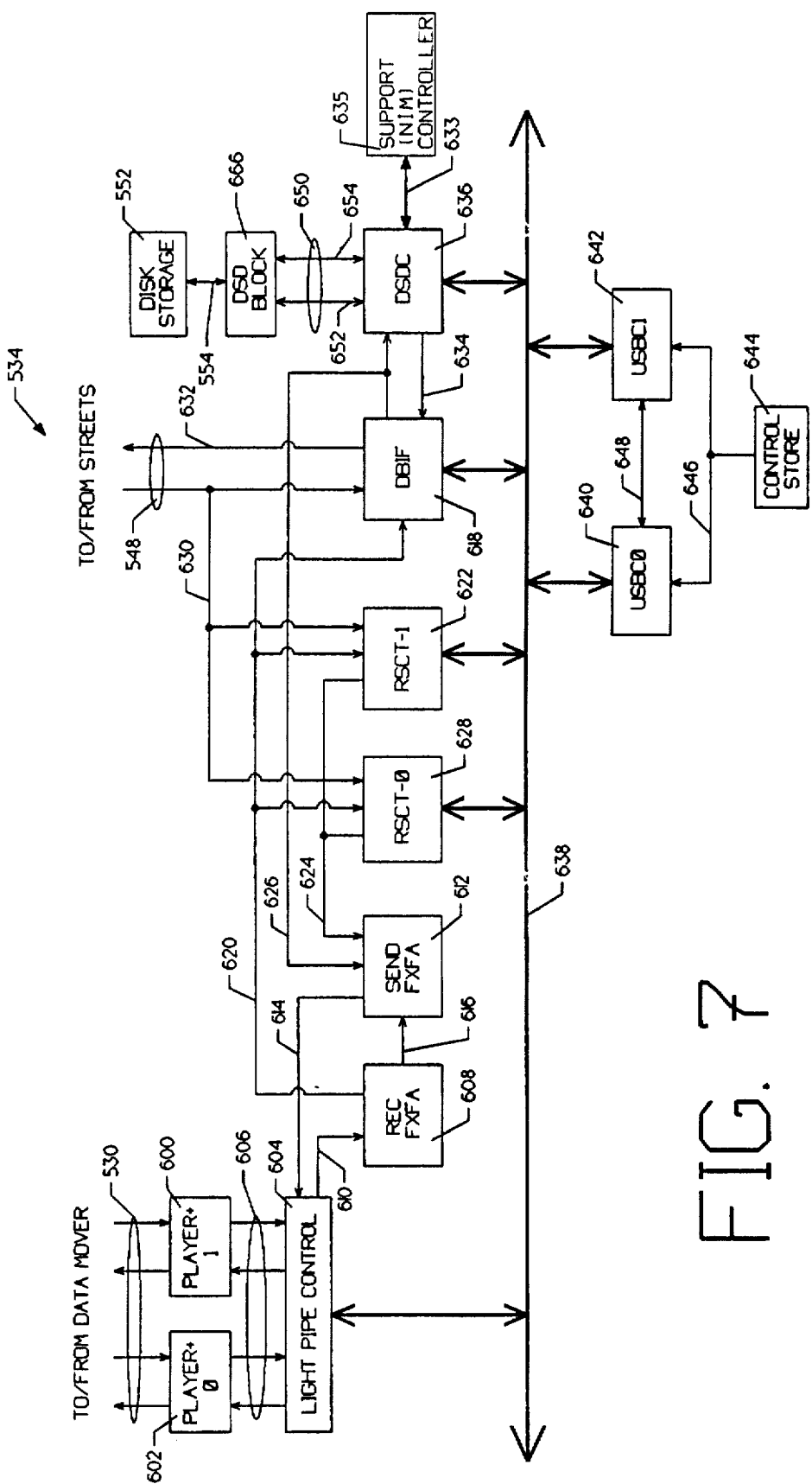
FIG. 7 is a schematic diagram of an exemplary embodiment of the host interface adapter block.

FIG. 7 is a schematic diagram of an exemplary embodiment of the host interface adapter block. For illustration, Host Interface Adapter (HIA) 534 of FIG. 6 is shown. It is recognized that HIA 544 may be similarly constructed. HIA 534 may comprise two Microsequencer Bus Controllers (USBC) 640, 642 which may be connected to a control store 644 via interface 646. The USBC's 640, 642 may access the HIA stations 628, 622, 618, and 636 via a micro bus 638. A player+0 602 and a player+1 600 may receive frames (or data elements) over fiber optic link 530. The term player+ refers to a fiber optic interface controller available from National Semiconductor which is called the Player Plus Chip Set. Player+0 602 may forward its frame to light pipe control 604 via interface 606. Similarly, player+1 600 may forward its frame to light pipe control 604 via interface 606. Light pipe control 604 may transfer the frames to a Receive Frame Transfer Facility (REC FXFA) 608 via interface 610. REC FXFA 608 may unpack the frames and may store control information in a Request Status Control Table-0 (RSCT-0) 628 and a RSCT-1 622 via interface 620. RSCT-0 628 and RSCT-1 622 may monitor the data that has been received from a corresponding data mover. The data which was contained in the frame received by REC FXFA 608 may be sent to the Database Interface (DBIF) station 618 via interface 620. DBIF 618 may forward the data over interface 632 to the streets.

Data received by the DBIF 618 from the streets via interface 548, may be sent to the Send Frame Transfer Facility (SEND FXFA) 612 via interface 626. Control information received via interface 630 may be sent to RSCT-0 628 and RSCT-1 622. SEND FXFA 612 may take the data and the control information provided by RSCT-0 628 and RSCT-1 622 via interface 624, and format a frame for transmission by light pipe control 604. Acknowledgements from REC FXFA 608 may be provided to SEND FXFA 612 via interface 616. The frame may be forwarded to light pipe control 604 via interface 614. Light pipe control 604 may create two copies of the frame received by SEND FXFA 612, and may provided a first copy to player+0 602 and a second copy to player+1 600 via interface 606. The frames may then be transmitted over the fiber optic links 530 to a corresponding data mover.

Referring back to control store 644, control store 644 may be used to store the instructions that are executed by USBC0 640 and USBC1 642. Control store 644, although in reality a RAM, is used as a read-only memory (ROM) during normal operation. Control store 644 may comprise seven (7) SRAM devices (not shown). Each SRAM device may hold 32 * 1024 (K) 8-bit bytes of data. Each unit of data stored in control store 644 may comprise 44 bits of instruction, 8 bits of parity for the instruction, and 2 bits of address parity.

Control store 644 may be loaded with instructions at system initialization by a support computer system through a maintenance path (not shown). The parity bits and address bits are computed by a host computer system and appended to each instruction as it is stored. Later, as USBC0 640 and USBC1 642 read and execute the instructions, each instruction is fetched from control store 644 and parity values are computed from it. Each USBC compares the parity values computed against the parity checks stored in control store 644. If there are any discrepancies, control store 644 is assumed to be corrupted and an internal check condition is raised in the corresponding USBC's.

USBC0 640 and USBC1 642 are special purpose microprocessors that execute instructions to monitor and control the transfer of data on micro bus 638. There are two USBC's in the system to ensure that all data manipulations are verified with duplex checking. One of the USBC's 640 is considered to be the master while the other USBC1 642 is considered the slave. Only the master USBC0 640 drives the data on the micro bus 638, but both master USBC0 640 and slave USBC1 642 drive address and control signals to lower the loading on micro bus 638. The slave USBC1 642 may send the result of each instruction to the master USBC0 640 via interface 648. The master USBC0 640 may then compare this value to the result it computed. If the values are different, an internal check error condition is set and the program is aborted. A further discussion of the operation of HIA 534 may be found in the above referenced co-pending application, which is incorporated herein by reference.

In accordance with the present invention, a data save disk controller (DSDC) 636 may be coupled to micro bus 638 and may thus communicate with USBC0 640 and USBC1 642. DSDC 636 is further coupled to DBIF 618 via interfaces 634 and 626. DSDC may receive data elements from DBIF 618 via interface 626 and may provide data elements to DBIF 618 via interface 634. DSDC 636 is further coupled to a DSD block 666 via a DSD bus 650. In the exemplary embodiment, DSDC 636 may be coupled to DSD block 666 via a DSD address bus 652, a DSD data bus 654, and a number of control signals. DSD block 666 may be coupled to a data save disk system 552 via interface 554. DSD block may provide the interface function between DSDC 636 and data save disk system 552. A network interface module (NIM) 635 may be coupled to DSDC 636 via interface 633. NIM 635 may provide maintenance functions to DSDC 636, and to other elements within the system. USBC0 640 and USBC1 642 may control the operation of a download and/or upload operation between a nonvolatile memory 540 and data save disk system 552. This may include providing a timer function to delay the download and/or upload operation for a predetermined time period.

In this configuration, data save disk system 552 is directly coupled to nonvolatile memory 540 via DSD block 666, DSDC 636, DBIF 618, and system interface 536 (see FIG. 6). When a primary power source fails, the data elements stored in nonvolatile memory 540 may be downloaded directly to the data save disk system 552 without any intervention by an instruction processor 512 or I/O processor 516. This configuration may have a number of advantages. First, the speed at which the data elements may be downloaded from nonvolatile memory 540 to data save disk system 552 may be enhanced due to the direct coupling therebetween. Second, significant power savings may be realized because only HIA 534, data save disk system 552, system interface 536, and nonvolatile memory 540 need to be powered by the secondary power source to effect the download operation. This may significantly increase the amount of time that the secondary power source may power the system thereby increasing the number of data elements that can be downloaded.

Similarly, once the primary power source is restored, data save disk system 552 may upload the data elements directly to nonvolatile memory via DSD block 666, DSDC 636, DBIF 618, and system interface block 536, without any assistance from an instruction processor 512 or I/O processor 516. This may provide a high speed upload link between data save disk system 552 and nonvolatile memory 540.

Figure 8:
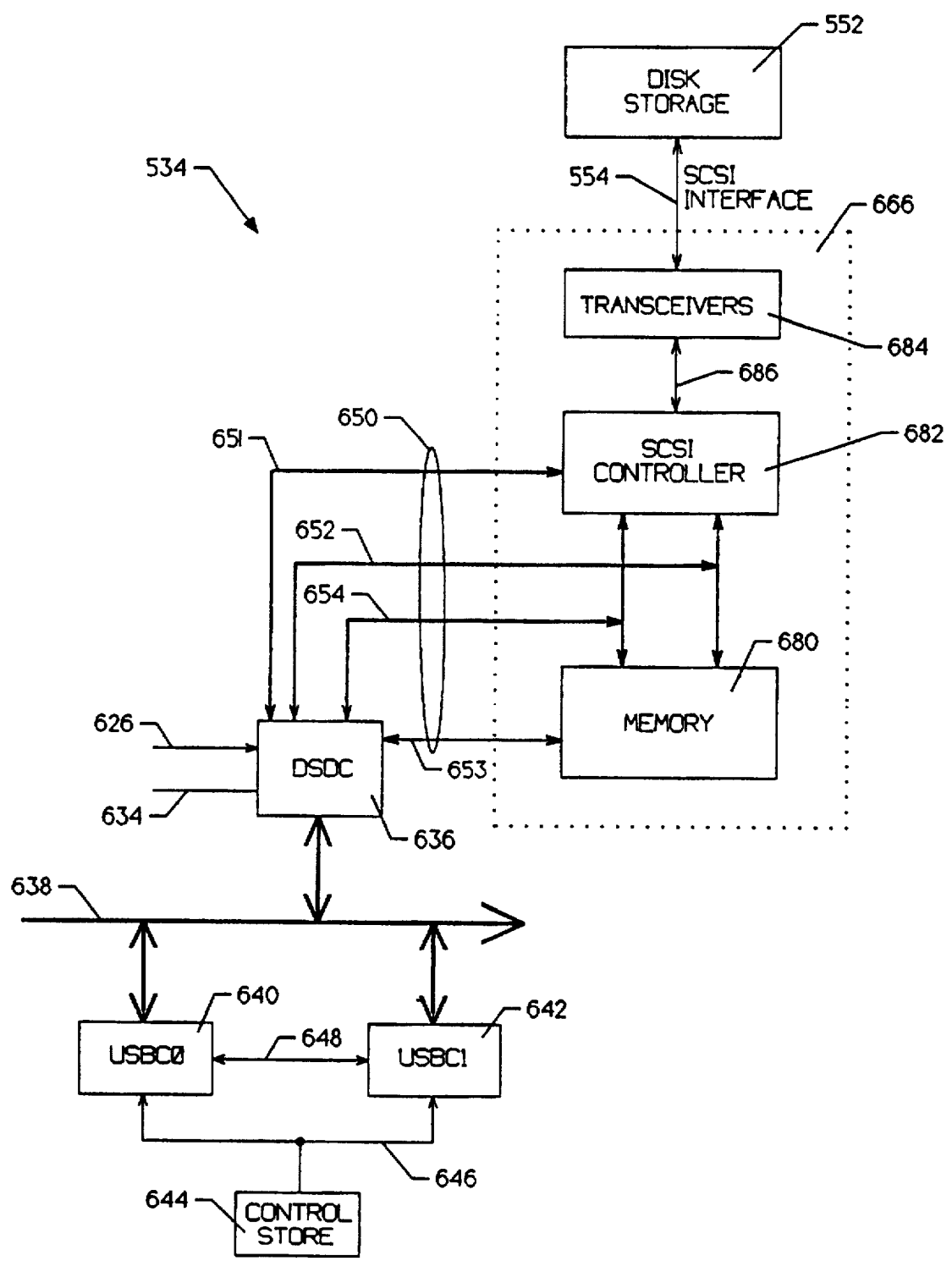
FIG. 8 is a partial schematic diagram of the host interface adapter block detailing the data save disk interface.

FIG. 8 is a partial schematic diagram of the host interface adapter block detailing the data save disk interface. DSD block 666 may comprise a memory 680, a disk controller 682, and a set of transceivers 684. A DSD bus 650 may couple DSDC 636, memory 680, and disk controller 682, and may comprise an address bus 652, and a data bus 654. DSD bus 650 may further comprise a number of disk controller control signals 651, and a number of memory control signals 653. DSD bus 650 may operate generally in accordance with a standard master/slave bus protocol wherein the DSDC 636, disk controller 682, and memory 680 may be slave devices, but only DSDC 636 and disk controller 682 may be master devices. That is, memory 680 may not be a master device in the exemplary embodiment.

Disk controller 682 may be coupled to transceivers 684 via interface 686. Transceivers 684 may be coupled to data save disk system 552 via interface 554. In a preferred mode, interface 554 may be a SCSI interface. Disk controller 682 may be a SCSI disk controller and data save disk storage system 552 may comprise at least one SCSI disk drive. In a preferred embodiment, disk controller 682 may be a NCR53C720 SCSI I/O Processor currently available from NCR corporation. Further, the at least one SCSI disk drives of data save disk storage 552 may comprise Hewlett Packard C3010 5.25" drives, Fijitsu M2654 5.25" drives, or Seagate ST12550/ND 3.5" drives. The data save disk system may comprise a set of 2-GByte SCSI Disks in sufficient quantity to store a single copy of the entire contents of the XPC. The NCR I/O processor may provide the necessary SCSI interface between DSDC 636 and the at least one disk drives of data save disk system 552.

As indicated with reference to FIG. 7, USBC0 640 and USBC1 642 may be coupled to MBUS 638. Further, USBC0 640 and USBC1 642 may be coupled to control store 644 via interface 646. DSDC 636 may be coupled to micro bus 638, DBIF 618, and DSD block 666.

Memory 680 may comprise at least one RAM device. In a preferred mode, memory 680 comprises four RAM devices. Because the disk storage system is an addition to an existing HIA design, control store 644 may not have enough memory locations to store the added pointers and temporary data needed to support the data save disk function. Therefore, a primary function of memory 680 is to store the pointers and temporary data for USBC0 640 and USBC1 642 such that HIA 534 may support the disk data save function. Another primary function of memory 680 is to store SCRIPTS for disk controller 682. SCRIPT programs and the application thereof are discussed in more detail below. Additions to the USBC microcode which may be stored in memory 680 may provide the following functionality: (1) initialization of the data save disk system 552 and microcode control areas; (2) data save operation which may copy all of the data and control elements from nonvolatile memory 540 to data save disk system 552; (3) data restore operation which may copy all of the data and control elements from data save disk system 552 to nonvolatile memory 540; (4) checking the status of the disks in data save disk storage system 552 and informing maintenance if restore data exists thereon; and (5) various error detection and error handling subroutines.

As indicated above, USBC0 640 and USBC1 642 may read pointers and/or temporary data or the like from memory 680 through DSDC 636. To accomplish this, USBC0 640 and USBC1 642 may provide an address to DSDC 636 wherein DSDC 636 may arbitrate and obtain control of DSD bus 650. Once this has occurred, DSDC 636 may provide the address to memory 680. Memory 680 may then read the corresponding address location and provide the contents thereof back to DSDC 636 via DSD bus 650. DSDC 636 may then provide the pointers and/or temporary data or the like to USBC0 640 and USBC1 642 for processing. By using this protocol, USBC0 640 and USBC1 642 may obtain pointers and/or temporary data from memory 680 to control the operation of a download and/or upload operation between nonvolatile memory 540 and data save disk system 552. This may include providing a timer function to delay the download and/or upload operation for a predetermined time period.

Data save disk system 552 is directly coupled to nonvolatile memory 540 via DSD block 666, DSDC 636, DBIF 618, and system interface 536 (see FIG. 6). When a primary power source fails, and under the control of USBC0 640 and USBC1 642, DBIF 618 may read the data elements from nonvolatile memory via interface 630 wherein DBIF 618 may provide the data elements to DSDC 636 via interface 626. DSDC 636 may then perform arbitration for DSD bus 650, wherein the data elements may be read by disk controller 682. In this instance, disk controller 682 may be the bus master. Disk controller 682 may then provide the data elements to transceivers 684 wherein the data elements may be written to data save disk system 552. This configuration may have a number of advantages. First, the speed at which the data elements may be downloaded from nonvolatile memory 540 to data save disk system 552 may be enhanced due to the direct coupling therebetween. Second, significant power savings may be realized because only HIA 534, system interface 536, non-volatile memory 540, and data save disk system 552 need to be powered by the secondary power source to effect the download operation. This may significantly increase the amount of time that the secondary power source may power the system thereby increasing the number of data elements that may be downloaded.

Similarly, once the primary power source is restored, data save disk system 552 may upload the data elements directly to nonvolatile memory via DSD block 666, DSDC 636, DBIF 618, and system interface block 536, without any assistance from an instruction processor 512 or I/O processor 514. This may provide a high speed upload link between data save disk system 552 and nonvolatile memory 540.

Figure 9A:
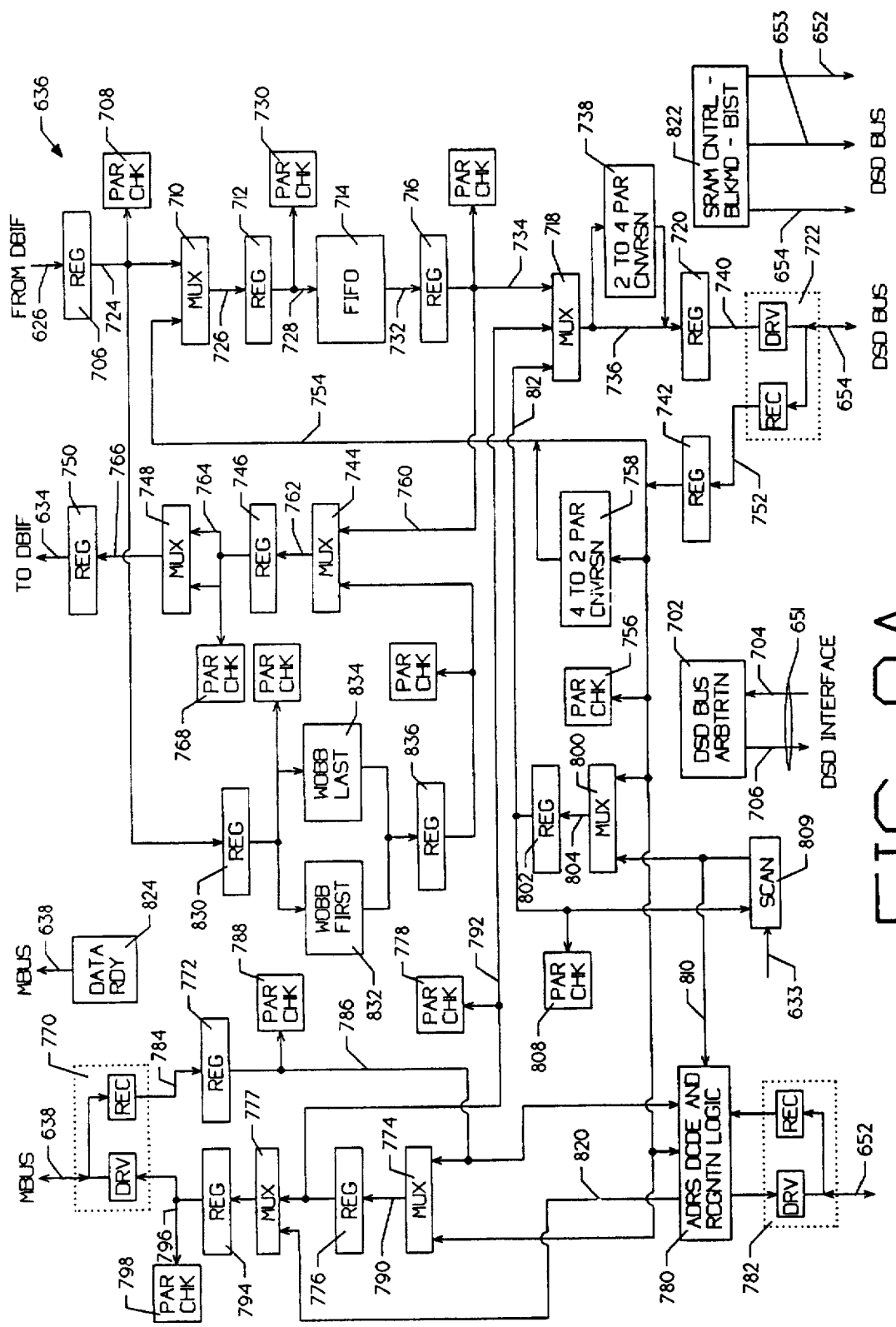
FIG. 9A is a block diagram of the Data Save Disk Controller (DSDC) shown in FIGS. 7–8.

FIG. 9A is a block diagram of the Data Save Disk Controller (DSDC) shown in FIGS. 7–8. The block diagram is generally shown at 636. DSDC 636 may comprise a DSD bus arbitration and control block 702 which may control the arbitration of DSD bus 650. DSD bus arbitration and control 702 may determine which device may assume the role of bus master of DSD bus 650. Preemptive priority is used to determine which device becomes bus master when more than one device is requesting bus mastership at any given time. In the exemplary embodiment, the priority order of bus mastership, from high priority to low priority, may be as follows: disk controller 682, USBC blocks 640, 642, and finally network interface module (NIM) 635. Memory 680 is not allowed to assume bus mastership of DSD bus 650 in the exemplary embodiment. DSD bus arbitration and control block 702, may be coupled to disk controller 682 via interface 651 (see FIG. 8). Interfaces 704 may be a bus request from disk controller 682 and interface 706 may be a bus acknowledge signal to disk controller 682.

In an exemplary embodiment, when disk controller 682 assumes bus mastership, it may relinquish bus ownership after a maximum of 16 bus cycles. Disk controller 682 may then wait 5 clock cycles before asserting a bus request to regain bus mastership. The 5 clock cycles provides a "fairness" delay to allow DSDC 636 to gain bus mastership if required.

DSDC 636 may comprise at least four basic data paths. A first basic data path may provide an interface between DBIF 618 and DSD bus 650. This path may comprise a register 706, a multiplexer 710, a register 712, a FIFO block 714, a register 716, a multiplexer 718, a data-out-register 720, and an I/O buffer block 722. Register 706 may receive data elements from DBIF 618 via interface 626. Register 706 may be coupled to multiplexer 710 via interface 724. Also coupled to interface 724 may be a parity check block 708. Parity Check block 708 may check the parity of a data element as it is released from register 706.

Multiplexer 710 may select interface 724 when transferring data between DBIF 618 and DSD bus 650. The data may then be provided to register 712 via interface 726 wherein register 712 may stage the data for FIFO 714. The data may then be provided to FIFO 714 via interface 728. Also coupled to interface 728 may be a parity check block 730. Parity Check block 730 may check the parity of a data element as it is released from register 712.

FIFO 714 may comprise a 34 bit by 64 word FIFO. FIFO 714 may function as a buffer between DBIF 618 and DSD bus 650. This may be desirable because disk controller 682 may have to arbitrate for DSD bus 650, thus causing an unpredictable delay. FIFO 714 may store the data that is transferred by DBIF 618 to DSDC 636 until disk controller 682 is able to gain control of DSD bus 650. Once disk controller 682 gains access to DSD bus 650, FIFO 714 may wait for eight (8) words to be transferred from DBIF 618 to FIFO 714 before sending the data over DSD bus 650.

Once released by FIFO 714, the data may be provided to register 716 via interface 732. Register 716 may store the output of FIFO 714. The data may then be provided to multiplexer 718 via interface 734. Multiplexer 718 may select interface 734 when transferring data between DBIF 618 and DSD bus 650. The data may then be provided to data-out-register 720 via interface 736, wherein data-out-register 720 may stage the data for I/O buffer block 722. Parity conversion block 738 may provide a two to four bit parity conversion. That is, data arriving from DBIF 618 via multiplexer 718 may only have two parity bits associated therewith. It may be desirable to convert the two parity bits to a four parity bit scheme. Data-out-register 720 may then provide the data to I/O buffer block 722 via interface 740. I/O buffer block 722 may comprise a plurality of bi-directional transceivers wherein each of the transceivers may be enabled to drive the data onto DSD bus 650 via interface 654.

A second basic data path of DSDC 636 may provide an interface between DSD bus 650 and DBIF 618. This path may comprise I/O buffer block 722, a data-in-register 742, multiplexer 710, register 712, FIFO block 714, register 716, a multiplexer 744, a register 746, a multiplexer 748, and a register 750. For this data path, I/O buffer block 722 may be enabled to accept data from DSD bus 650 and provide the data to data-in-register 742 via interface 752. Data-in-register 742 may provide the data to multiplexer 710 via interface 754. Also coupled to interface 754 may be a parity check block 756. Parity Check block 756 may check the parity of a data element as it is released by data-in-register 742. Parity conversion block 758 may provide a four to two bit parity conversion. That is, data arriving from DSD bus 650 may have four parity bits associated therewith while DBIF interface 634 may only have two parity bits associated therewith. It may be desirable to convert the four parity bits to a two parity bit scheme.

Multiplexer 710 may select interface 754 when transferring data between DSD bus 650 and DBIF 618. The data may then be provided to register 712 via interface 726 wherein register 712 may stage the data for FIFO 714. The data may then be provided to FIFO 714 via interface 728. Also coupled to interface 728 may be parity check block 730. Parity Check block 730 may check the parity of a data element as it is released from register 712.

FIFO 714 may function as a buffer between DSD bus 650 and DBIF 618. This may be desirable because DBIF 618 may have to wait to gain access to the streets via interface 632. FIFO 714 may store data that is transferred by DSD bus 650 until DBIF 618 can gain access to the streets.

Once released by FIFO 714, the data may be provided to register 716 via interface 732. Register 716 may store the output of FIFO 714. The data may then be provided to multiplexer 744 via interface 760. Multiplexer 744 may select the data provided by register 716 during a data transfer between DSD bus 650 and DBIF 618. Multiplexer 744 may then provide the data to register 746 via interface 762. Register 746 may then provide the data to multiplexer 748 via interface 764. Multiplexer 748 may select 16 bits at a time of a 32 bit word provided by register 746. This may be necessary because the DSD bus may comprise a 32 bit word while the interface to DBIF 618 may only be 16 bits wide. Also coupled to interface 764 may be parity check block 768. Parity Check block 768 may check the parity of a data element as it is released from register 746. Multiplexer 748 may then provide the data to register 750. Register 750 may provide the data to DBIF 618 via interface 634.

A third basic data path of DSDC 636 may provide an interface between MBUS 638 and DSD bus 650. This path may comprise a I/O buffer block 770, a register 772, an address decode and recognition logic block 780, a multiplexer 774, a register 776, multiplexer 718, data-out-register 720, and I/O buffer block 722. For this data path, USBC's 640, 642 may provide a request to DSDC 636 via MBUS 638. The request may comprise a data word, an address, and/or a number of control signals. In the exemplary embodiment, a request comprising an address and a number of control signals may be provided over MBUS 638 first wherein a data word may follow on MBUS 638, if appropriate. I/O buffer block 770 may receive the request via interface 638 and may provide the request to register 772 via interface 784. Register 772 may provide the request to multiplexer 774 and to an address decode and recognition block 780 via interface 786. Also coupled to interface 786 may be a parity check block 788. Parity Check block 788 may check the parity of the request as it is released from register 772. Multiplexer 774 may select interface 786 during transfers from MBUS 638 to DSD bus 650. Multiplexer 774 may provide the request to register 776 via interface 790. Register 776 may then provide the request to multiplexer 718 via interface 792. Also coupled to interface 792 may be a parity check block 778. Parity Check block 778 may check the parity of the request as it is released from register 776.

Multiplexer 718 may select interface 792 when transferring data between MBUS 618 and DSD bus 650. Multiplexer 718 may provide the data word to data-out-register 720 via interface 736 wherein data-out-register 720 may stage the data word for I/O buffer block 722. Parity conversion block 738 may provide a two to four bit parity conversion. That is, data arriving from MBUS 638 via multiplexer 718 may only have two parity bits associated therewith. It may be desirable to convert the two parity bits to a four parity bit scheme. Data-out-register 720 may then provide the data word to I/O buffer block 722 via interface 740. I/O buffer block 722 may be enabled to drive the data word onto DSD bus 650 via interface 654.

A fourth basic data path of DSDC 636 may provide an interface between DSD bus 650 and MBUS 638. This path may comprise I/O buffer block 722, data-in-register 742, parity conversion block 758, multiplexer 774, a multiplexer 777, register 776, a register 794, and I/O buffer block 770. I/O buffer block 722 may receive a data element from DSD bus 650. In an exemplary embodiment, the data element may comprise pointers and/or temporary data requested by USBC0 640 or USBC1 642 from memory 680. I/O buffer block 722 may provide the pointers and/or temporary data to data-in-register 742 via interface 752. Data-in-register 742 may provide the pointers and/or temporary data to parity conversion block 758 via interface 754. Parity conversion block 758 may provide a four to two bit parity conversion thereof. Parity conversion block 758, and register 742 may then provide the pointers and/or temporary data to multiplexer 774 via interface 754. Multiplexer 774 may select interface 754 when transferring data between DSD bus 650 and MBUS 638. Multiplexer 774 may then provide the pointer and/or temporary data to register 776 via interface 790. Register 776 may provide the pointers and/or temporary data to multiplexer 777 via interface 792. Multiplexer 777 may select interface 792 when transferring data between DSD bus 650 and MBUS 638. Multiplexer 777 may provide the pointers and/or temporary data to register 794. Register 794 may provide the pointers and/or temporary data to I/O buffer block 770 via interface 796. Also coupled to interface 796 may be a parity check block 798. Parity Check block 798 may check the parity of the data as it is released from register 794. I/O buffer block 770 may provide the pointers and/or temporary data to USBC0 640 or 642 via MBUS 638.

USBCs 640 and 642 do not interface directly with DSD bus 650 but rather may access memory 680 and disk controller 682 indirectly using registers in DSDC 636. For example, when USBC0 640 performs a read of memory 680, it initiates the transfer by writing a DSDC register 772 with the requested address. Register 772 may provide the address to address recognition logic block 780 via interface 786. The address may then be provided to register 773 (see FIG. 9B). Register 773 may then provide the address to multiplexer 852. Multiplexer 852 may select the output of register 773 when transferring an address from USBC0 640 to memory 680. Multiplexer 852 may then provide the address to address register 856 via interface 858.

DSDC 636 then performs bus arbitration, and provides the address to memory 680 via I/O transceiver block 782. Memory 680 then provides the requested data on DSD bus 650. DSDC 636 may then read the data on DSD bus 650 and provide the result to MBUS 638. Referring to FIG. 9A, register 742 may receive the read data word and may provide the read data word to multiplexer 774 via interface 754. Multiplexer 774 may then provide the read data word to register 776 wherein register 776 may provide the read data word to multiplexer 777. Multiplexer 777 may then provide the read data word to register 794 wherein the read data word may be provided to USBC0 640 via I/O buffer 770. Depending on whether an address or a data word is provided by USBC0 640 via MBUS 638, the corresponding address or data element may be routed to the appropriate location within DSDC 636.

In addition to providing the above reference data paths, DSDC 636 may provide a number of other functions. For example, logic may be provided to allow a test function of memory 680 and disk controller 682. For example, DSDC 636 may have a dynamic scan register 809 which may be coupled to NIM 635 via interface 633. NIM 635 may scan in an address and a function code into dynamic scan register 809. The address may then be provided to address register 851 (see FIG. 9B) within address decode and recognition logic block 780 via interface 810. Register 851 may provide the address to address output register 856 via multiplexer 852.

For a dynamic read operation of memory 680, the address may be an initial read address which may be scanned into dynamic scan register 809 as described above. Thereafter, the address may be automatically incremented by an auto-increment block 826 (see FIG. 9B) such that a number of successive read operations may be made to memory 680. After the initial address is provided, NIM 635 may provide a control word to dynamic scan register 809. The control word may comprise a word count and a function code. For a read operation, the function code may indicate a read function. The word count may be latched into a word count register 853 (see FIG. 9B) wherein after each read operation, the word count register may be decremented. When the word count register reaches a value of zero, DSDC 636 may terminate the above referenced read operation. For each read operation performed, the resulting data may be latched into data-in-register 742. A multiplexer 800 may then select interface 754 thereby storing the resulting data into register 802. The data may then be provided to dynamic scan register 809 via interface 812. The resulting data may then be scanned out of dynamic scan register 809 via NIM 635 for analysis.

For a write operation, the address may be an initial write address and function code which may be scanned into dynamic scan register 809 as described above. Thereafter, the address may also be automatically incremented by an auto-increment block 826 (see FIG. 9B) such that a number of successive write operations may be made to memory 680. For a write operation, the function code may indicate a write function. For each write operation performed, a corresponding data word may be scanned into dynamic scan register 809. The data word may be provided to multiplexer 800 wherein multiplexer 800 may provide the data word to register 802. Register 802 may provide the data word to multiplexer 718 via interface 812. Multiplexer 718 may provide the data word to data-out-register 720 via interface 736 wherein data-out-register 720 may stage the data word for I/O buffer block 722. Data-out-register 720 may then provide the data word to I/O buffer block 722 via interface 740. I/O buffer block 722 may be enabled to drive the data word to memory 680 via interface 654. The exemplary read and write operations discussed above may be used to perform tests on memory 680 and/or disk controller 682.

Another exemplary function that may be provided by DSDC 636 may be to support a partial block update function provided by host interface adapter 534. That is, in the exemplary system, a file may comprise a plurality of segments and each of the plurality of segments may comprise a plurality of blocks. Each of the blocks may comprise a plurality of words. When a host processor only updates a portion of a file, it may be advantages to only over-write the affected portions of the file to non-volatile memory 540. The host interface adapter block 534 supports the partial block update function. However, some of the supporting logic is located on DSDC ASIC 636. The partial block update function may increase the performance of the file caching system.

Register 830, wobb first block 832, wobb last block 834, and register 836 may support the partial block update function of the host interface adapter 534. A further discussion of the partial block update function may be found in the above referenced co-pending patent application Ser. No. 08/172,663, which is incorporated herein by reference.

SRAM control-block mode-and bist block 822 may provide a number of functions. For example, SRAM control-block mode-and bist block 822 may provide a number of control signals to memory 680 via interface 653. Other exemplary function may be to provide error detection and test to memory 680.

Finally, DSDC 636 may provide a data ready block 824 which may be coupled to MBUS 638. Data ready block 824 may indicate to USBC 640,642 when a corresponding read operation has been completed by DSDC 636.

Figure 9B:
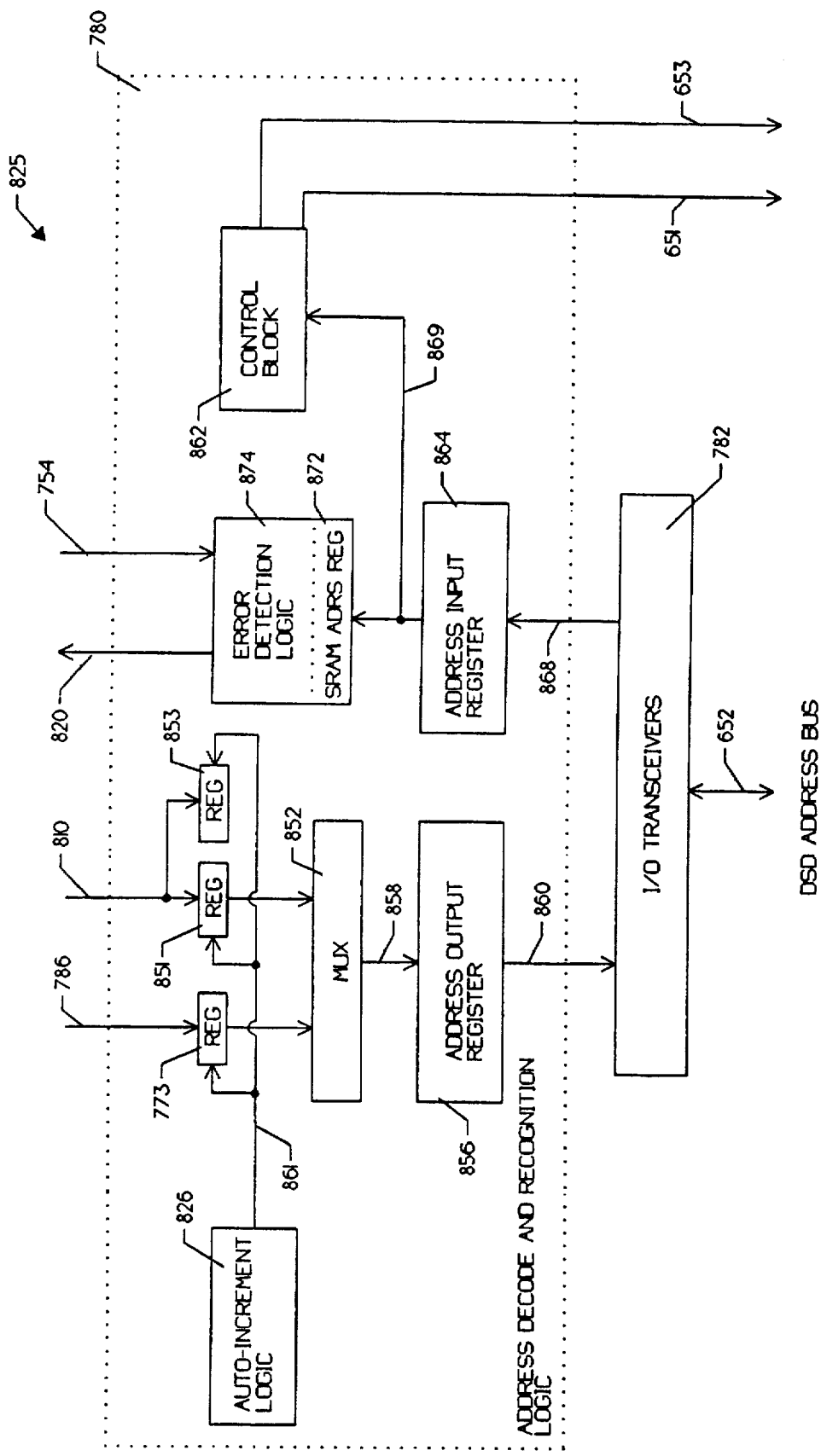
FIG. 9B is a block diagram showing applicable portions of the Address and Recognition Logic block of FIG. 9A.

FIG. 9B is a block diagram showing applicable portions of the Address and Recognition Logic block of FIG. 9A. The block diagram is generally shown at 825. In the exemplary embodiment, Address and Recognition Logic block 780 may comprise an address output register 856 and an address input register 864. Address output register 856 may be coupled to an outgoing port of I/O buffer block 782 via interface 860. Similarly, address input register 864 may be coupled to an in-going port of I/O buffer block 782 via interface 868.

An address may be provided to register 773 by MBUS 638 via interface 786, as described above. Further, an address may be provided to register 851 by dynamic scan register 809 via interface 810, as described above. When MBUS 638 is providing an address to DSD address bus 652, multiplexer 852 may select the output of register 773. Similarly, when NIM 635 is providing an address via dynamic scan register 809, multiplexer 852 may select the output of register 851. Multiplexer 852 may provide the selected address to address output register 856 via interface 858. Address output register 856 may provide the address to DSD address bus 652 via I/O buffer block 782.

Address recognition block 780 may determine if a request on interface 786 comprises an address. If the request comprises an address, corresponding control signals provided by register 772 via interface 786 may determine the appropriate format thereof. For example, one format for an address may indicate that the present address should be loaded, but each address thereafter should be generated by an automatic increment block 826 (see FIG. 11). Address recognition logic block 780 may make this determination and alert auto-increment block 826. Auto-increment block 826 may thereafter automatically increment and/or decrement the value in registers 773, 851, or 853 via interface 861.

Address input register 864 may be coupled to DSD address bus 652 via I/O buffer block 782. Address input register 864 may latch the contents of DSD address bus 652 and monitor the contents thereof. Address input register 864 may be coupled to a control block 862 via interface 869. Control block 862 may monitor the DSD address via the address input register 864 and provide appropriate control signals to DSD bus 650 via interfaces 651 and 653. In the exemplary embodiment, control block 862 may provide control signals that memory 680 and disk controller 682 may not otherwise provide. For example, control block 862 may provide four (4) byte enable signals, and a read/write enable signal (see FIG. 10A-10B) to memory 680 via interface 653. Also, the NCR53C720 SCSI controller 682 requires a ready-in signal to be asserted by a slave device indicating that the slave device is ready to transfer data. DSDC ASIC 636 may provide the ready-in signal to NCR53C720 SCSI controller 682 via interface 651 for both DSDC 636 and memory 680.

Finally, an error detection logic block 874 may be coupled to address input register 864 via interface 869. Error detection logic block 874 may comprise an SRAM address register 872. SRAM address register 872 may capture an SRAM address when an SRAM read error is detected. That is, SRAM address register 872 may store the read address that is present on DSD address bus 650 in response to an SRAM read error. Error detection block 874 may monitor the data that is present in DSD bus 650 via interface 754. Error detection block 874 may thus perform a parity check or the like on the data presently read from memory 680. If an error exists, error detection block 874 may enable SRAM address register thereby capturing the current read address. This may identify the faulty read address within memory 680. Error detection block 874 may then provide the faulty read address to USBC0 640 for further processing via interface 820. For example, USBC0 640 may read and write various test patterns to the faulty read address to determine if the fault was caused by a soft error or a hard error. If the fault was caused by a soft error, the contents of memory 680 may be reloaded and the operation of the computer system may continue. However, if the fault was caused by a hard error, the operation of the computer system may be interrupted. Other error detection schemes are contemplated and may be incorporated into error detection block 874.

FIGS. 10A–10B comprise a table illustrating an exemplary bus description of the DSD bus of FIG. 8. The table is generally shown at 900. DSD bus 650 may comprise a number of fields. The type of fields can be generally broken down into data fields, address fields, parity fields, and control fields. The fields for an exemplary embodiment of DSD bus 650 are described below.

DSD bus 650 may comprise a 32 bit data bus as shown at 902. The 32 bit data bus is a bi-directional data bus and may serve as the main data path for all operations. The 32 bit data bus may be asserted by a bus master for write operations and a bus slave for read operations.

DSD bus 650 may further comprise a 4 bit data parity bus as shown at 904. Each of the four parity bits may correspond to predetermined data bits of 32 bit data bus 902. The 4 bit data parity bus may be used for error detection and correction purposes.

DSD bus 650 may further comprise a 30 bit address bus as shown at 906. The 30 bit address bus is a bi-directional address bus and may serve as the main address path for all operations. The 30 bit address bus may be asserted by a bus master.

DSD bus 650 may further comprise an address status line (ADS\) as shown at 908. The address status line may be active low and when asserted by a bus master, may indicate that the value on the 30 bit address bus 906 are valid. In an exemplary mode, the address status line may be asserted to indicate a start of a bus cycle.

DSD bus 650 may further comprise a write/read line (W-R\) as shown at 910. The write/read line may be active low and may indicate the direction of the data transfer relative to the bus master. The write/read line may be driven by the bus master.

DSD bus 650 may further comprise a hold line as shown at 912. The hold line may be asserted by the disk controller 682 to request bus mastership. The hold line may be active low and may be provided by the NCR53C720 SCSI I/O processor 682.

DSD bus 650 may further comprise a hold acknowledge (HLDA\) line as shown at 914. The hold acknowledge line may be asserted by DSD bus arbitration logic 786 to indicate that the previous bus master has relinquished control of the DSD bus 650. The hold acknowledge line may be active low.

DSD bus 650 may further comprise a bus clock (BCLK) line as shown at 916. The bus clock signal may control the DMA portion of the NCR53C720 SCSI I/O processor 682. The bus clock may be provided by DSDC 636.

DSD bus 650 may further comprise a chip reset line as shown at 918. The chip reset line may be active low and may force a synchronous reset of the NCR53C720 SCSI I/O processor 682. In the exemplary embodiment, the chip reset line may be asserted by DSDC 636 for a minimum of 15 bus cycles.

DSD bus 650 may further comprise a chip select (CS\) line as shown at 920. The chip select line may select the NCR53C720 SCSI I/O processor 682 as a slave device. In the exemplary embodiment, the chip select line may be active low and may be connected to address bit 6 of the 30 bit address bus discussed above.

DSD bus 650 may further comprise an interrupt (IRQ\) line as shown at 922. The interrupt line may be active low and may indicate that service is required from USBC0 640 and/or USBC1 642.

Referring to FIG. 10B, DSD bus 650 may further comprise four byte enable (BE) lines as shown at 924, 926, 928, and 930. Each of the bus enable lines may be active low and each may be asserted by the bus master. A first byte enable line (BE0) may enable the transfer of data over data bus lines 24–31. A second byte enable line (BE1) may enable the transfer of data over data bus lines 16–23. A third byte enable line (BE2) may enable the transfer of data over data bus lines 8–15. Finally, a fourth byte enable line (BE3) may enable the transfer of data over data bus lines 0–7.

DSD bus 650 may further comprise a ready-in (READYI\) line as shown at 932. The ready-in line may be provided by the slave device to the master device indicating that the slave device is ready to transfer data to the master device. The ready-in line may be active low and may be provided by DSDC 636 even if DSDC 636 is not the master of the bus.

DSD bus 650 may further comprise a ready-out (READYO\) line as shown at 934. The ready-out line may be asserted to indicate the end of a slave cycle. In the exemplary embodiment, the ready-out line may be active low and may be provided by disk controller 682 to terminate a slave cycle.

DSD bus 650 may further comprise a master line as shown at 936. The master line may be asserted by the NCR53C720 I/O processor 682 to indicate it has become bus master. The master line may be active low.

DSD bus 650 may further comprise a bus mode select (BS) bus as shown at 938. The bus mode select bus may select the bus mode and addressing mode of the NCR53C720 I/O processor 682. In the exemplary embodiment, the bus mode select bus is set to "010" thereby selecting a 80386DX like bus mode (bus mode 4) and the big endian addressing mode.

Finally, DSD bus 650 may further comprise a scripts autostart mode (AUTO\) line at shown at 940. The scripts autostart mode line selects either auto or manual scritps start mode. Script routines may be stored in memory 680 and may control a RISC processor in NCR53C720 SCSI I/O processor 682. When scripts autostart mode is set low, the execution of the scripts programs starts at address zero of a DSP register within NCR53C720 SCSI I/O processor 682, immediately following a chip reset. When scripts autostart mode is set high, the execution of the scripts programs starts at an address which corresponds to a value which is loaded into the DSP register by USBC0 640 and/or USBC1 642, immediately following a chip reset. In the exemplary embodiment, the scripts auto start mode line is set to one.

As indicated with reference to FIG. 8, a number of control signals may be provided between DSDC 636 and disk controller 682 via interface 651. These signals may include the signals shown at 906, 908, 910, 912, 914, 916, 918, 920, 922, 932, 934, 936, and 938. Similarly, a number of control signals may be provided between DSDC 636 and memory 680 via interface 653. These signals may include a memory read/write enable signal and the four byte enable signals shown at 924, 926, 928 and 930.

Figure 11:
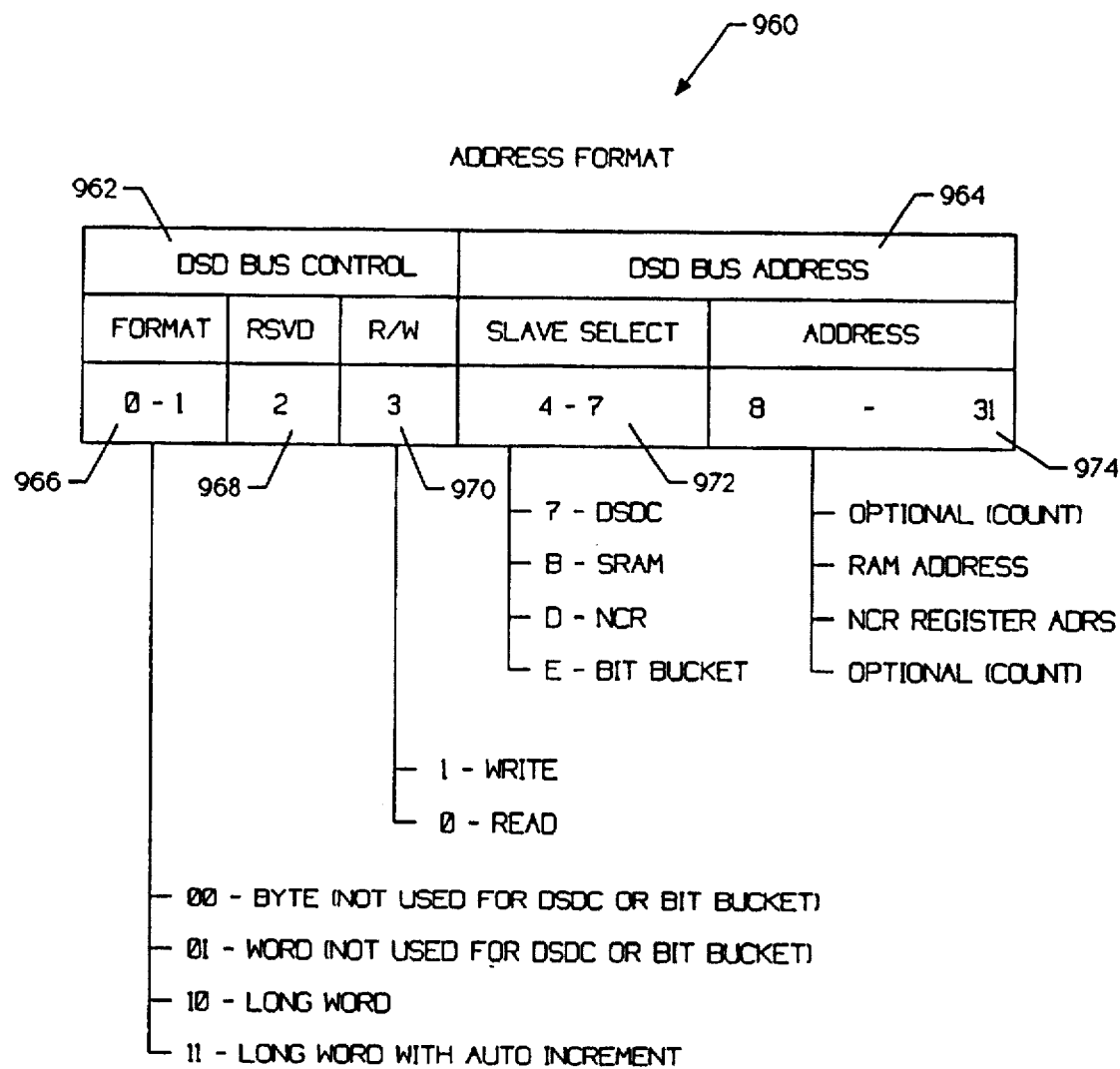
FIG. 11 is a table illustrating an exemplary address format for the address field of the DSD bus of FIG. 8.

FIG. 11 is a table illustrating an exemplary address format for the address field of the DSD bus of FIG. 8. The table is generally shown at 960. The address format of the address field of DSD bus 650 may comprise DSD bus control signals 962 and DSD bus address signals 964. The DSD bus control signals may comprise a format field 966, a reserved field 968, and a read/write field 970. The DSD address signals may comprise a slave select field 972 and an address field 974.

The format field 966 may specify the format of a corresponding address. For example, the format field may specify the format of a corresponding address as a long word or a long word with auto increment. The auto increment option is further discussed above with reference to FIG. 9A and FIG. 9B. The read/write field 970 may indicate whether the corresponding address is requesting a read or write operation.

The slave select field 972 may indicate which of the three devices attaches to DSD bus 650 is to be the slave. That is, if DSDC 636 has bus mastership and is providing the address, the slave select field may indicate whether NCR53C720 682 or memory 680 is to be the slave. Finally, the address field 974 provides a valid address to the selected slave device. That is, if memory 680 is the slave device, the address field 974 may provide a valid memory address thereto. Under some conditions, the address field is optional as shown. That is, when DSDC 636 is the slave device, the address field is optional. The slave select field identifier shown below slave select field 972 correspond to the address field identifiers shown below address field 974. Format bits 0 and 1, and address bits 30 and 31 may be decoded to provide the bi-directional byte enable signals 924, 926, 928, and 930 as shown in FIG. 10B.

Figure 12:
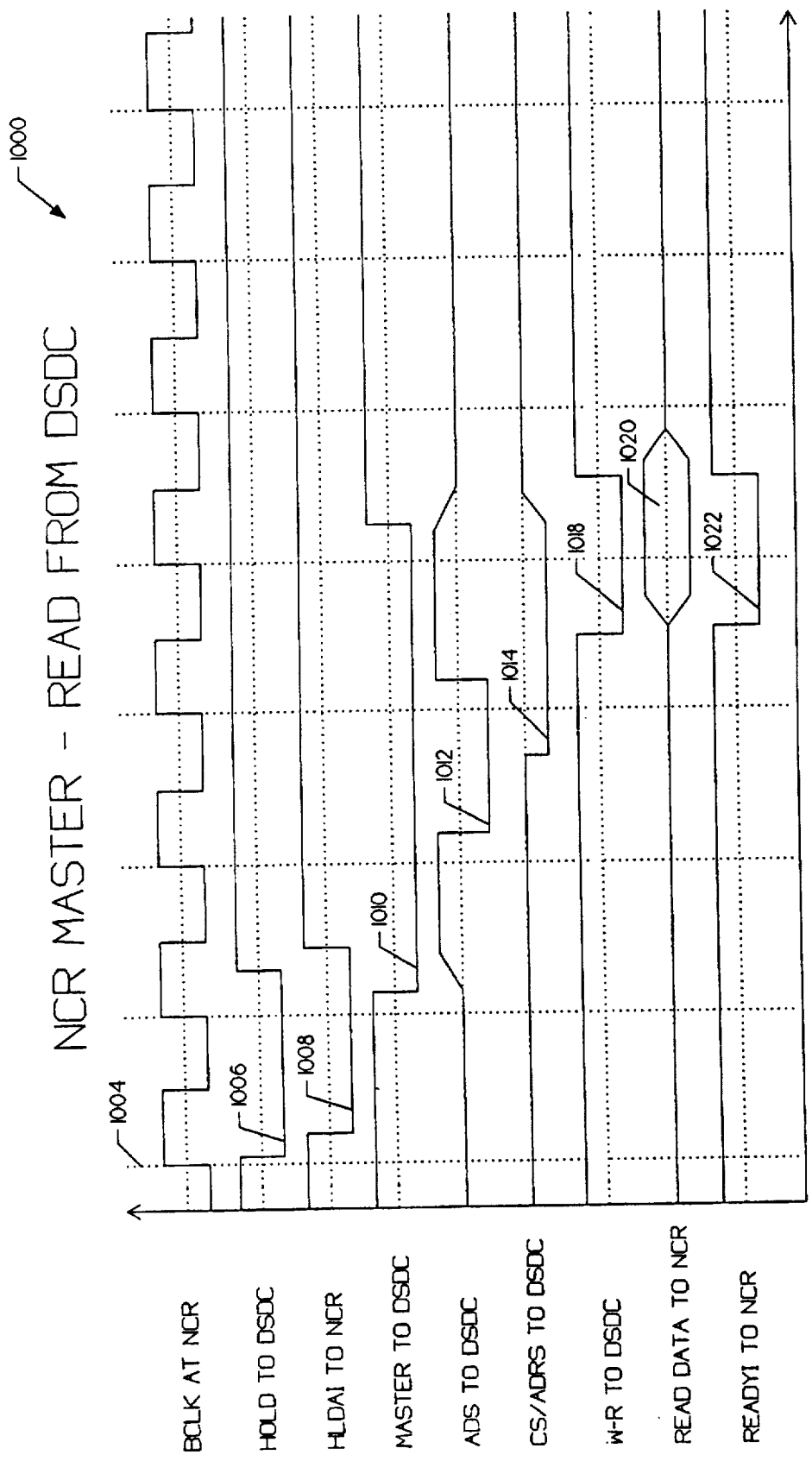
FIG. 12 is a timing diagram illustrating an exemplary read cycle on the DSD bus wherein the NCR chip is the master and the DSDC device is the slave.

FIG. 12 is a timing diagram illustrating an exemplary read cycle on the DSD bus wherein the NCR chip is the master and the DSDC device is the slave. The timing diagram is generally shown at 1000. In the exemplary embodiment, NCR53C720 682, memory 680, and DSDC 636 are coupled to the DSD bus 650. Tri-state transceivers are used by all three devices to interface with the bi-directional lines of the DSD bus 650. Data transfer cycles are initiated and terminated by whichever device is bus master at given time. The direction of data transfer (read/write) is relative to the bus master. Only one device can be bus master for a given data transfer cycle.

When one of the three devices is the bus master, one of the two remaining devices may be the bus slave, and is either the source (read) or destination (write) of the data transfer. The third device on DSD bus 650 is inactive. NCR53C720 682 and DSDC 636 may be either a bus master or a bus slave, while memory 680 may only be a bus slave. Arbitration logic 786 in DSDC 636 may determine which device will be the next bus master when the present bus master relinquishes control of DSD bus 650.

Referring specifically to NCR53C720 682, NCR53C720 682 arbitrate for bus mastership to fetch SCRIPTS instructions from memory 680 and to transfer data to/from the SCSI interface 554. After an instruction fetch or data transfer is complete, NCR53C720 682 may relinquish bus mastership. When executing block move instructions, NCR53C720 682 may relinquish bus mastership after transferring eight long words. However, if more data needs to be transferred, NCR53C720 682 may wait 5 to 8 clock cycles and then initiates arbitration to regain bus mastership to transfer up to 8 more long words. This process may continue until the block move instruction is complete. In the exemplary embodiment, the effective data transfer rate of a block move instruction to/from the SCSI disk(s) may be in excess of 20 MB/s.

Referring specifically to FIG. 12, wherein an exemplary read operation is shown with NCR53C720 682 as bus master and DSDC 636 is bus slave. The signal names provided along the left side of timing diagram 1000 generally correspond to the signals described with reference to FIGS. 10A and 10B.

At time 1004, NCR53C720 682 may assert a hold signal as shown at 1006, indicating to all of the devices coupled to DSD bus 650 that NCR53C720 682 is requesting bus mastership. Arbitration logic 786 within DSDC 636 may receive the hold signal 1006 and may assert a hold acknowledge signal in response thereto, as shown at 1008, indicating that the previous bus master has relinquished control of DSD bus 650. On the next bus clock cycle, NCR53C720 682 may assert a master signal to DSDC 636 as shown at 1010, indicating to DSDC 636 that NCR53C720 682 has become bus master of DSD bus 650. NCR53C720 682 may then assert an address status signal as shown at 1012. The address status signal indicates the start of a bus cycle. Shortly thereafter, and while the address status signal is still asserted, NCR53C720 682 may provide an address to DSDC 636 as shown at 1014. The select slave field of the address may select DSDC 636 to be the slave for this bus transaction.

NCR53C720 682 may then provide a read/write signal 1018 to DSDC 636. The read/write signal 1018 indicates that NCR53C720 682 is requesting to read data from DSDC 636. Finally, DSDC 636 may provide a ready-in 1022 signal to NCR53C720 682, indicating that DSDC 636 is ready to transfer data thereto. The read data on DSD bus 650 may then be provided as shown at 1020.

Figure 13:
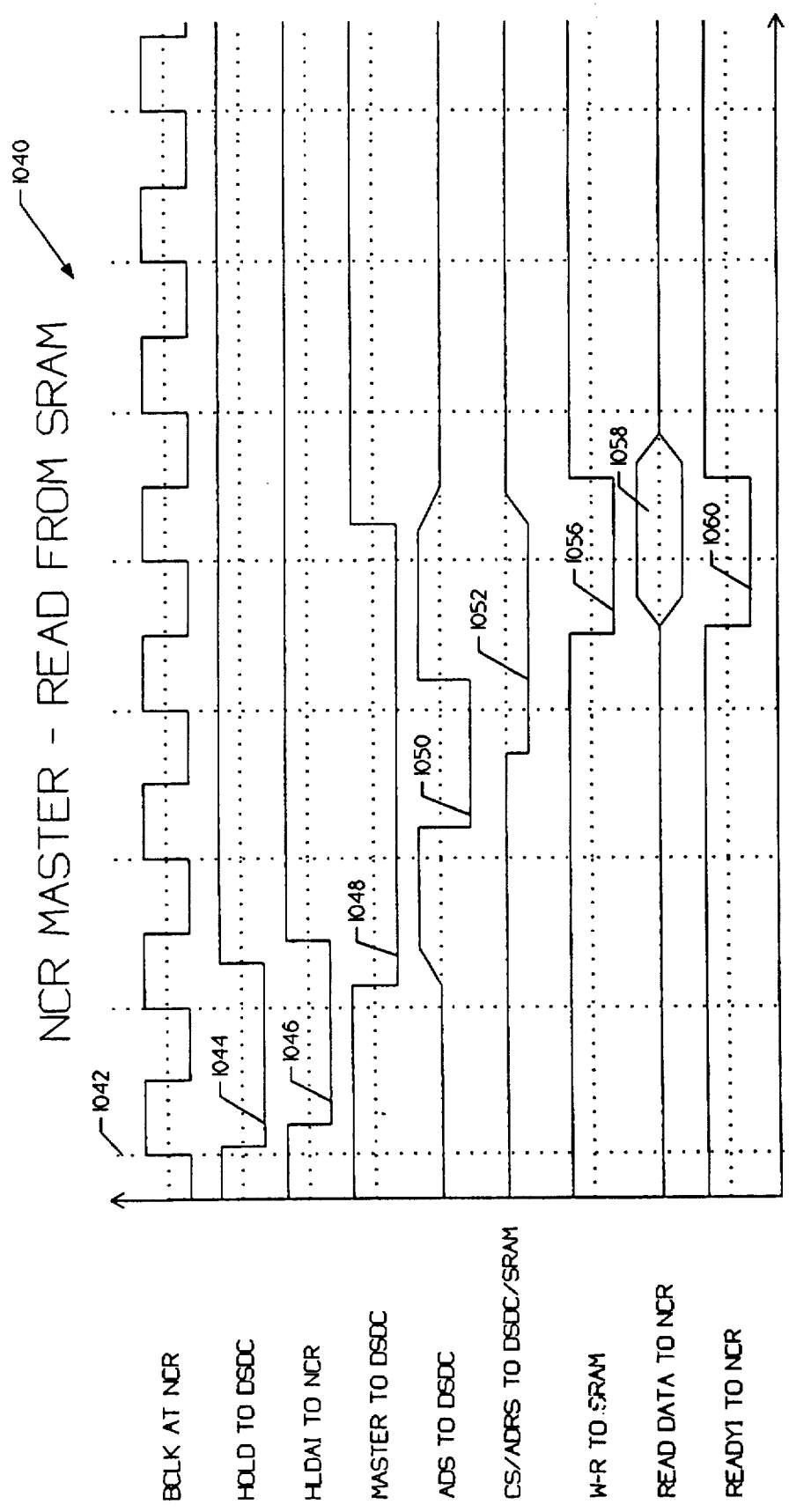
FIG. 13 is a timing diagram illustrating an exemplary read cycle on the DSD bus wherein the NCR chip is the master and the SRAM device is the slave.

FIG. 13 is a timing diagram illustrating an exemplary read cycle on the DSD bus wherein the NCR chip is the master and the SRAM device is the slave. The timing diagram is generally shown at 1040. The signal names provided along the left side of timing diagram 1040 generally correspond to the signals described with reference to FIGS. 10A and 10B.

At time 1042, NCR53C720 682 may assert a hold signal as shown at 1044, indicating to all of the devices coupled to DSD bus 650 that NCR53C720 682 is requesting bus mastership. Arbitration logic 786 within DSDC 636 may receive the hold signal 1044 and may assert a hold acknowledge signal in response thereto, as shown at 1046, indicating that the previous bus master has relinquished control of DSD bus 650. On the next bus clock cycle, NCR53C720 682 may assert a master signal to DSDC 636 as shown at 1048, indicating to DSDC 636 that NCR53C720 682 has become bus master of DSD bus 650. Note that it is not necessary to provide the master signal to memory 680 because memory 680 cannot be a bus master. NCR53C720 682 may then assert an address status signal as shown at 1050. The address status signal indicates the start of a bus cycle. Shortly thereafter, and while the address status signal is still asserted, NCR53C720 682 may provide an address to DSDC 636 and memory 680 as shown at 1052. The select slave field of the address may select memory 680 to be the slave for this bus transaction.

NCR53C720 682 may then provide a read/write signal 1056 to memory 680. The read/write signal 1056 indicates that NCR53C720 682 is requesting to read data from memory 680. Finally, memory 680 may provide a ready-in signal 1060 to NCR53C720 682, indicating that memory 680 is ready to transfer data thereto. The read data on DSD bus 650 is shown at 1058.

Figure 14:
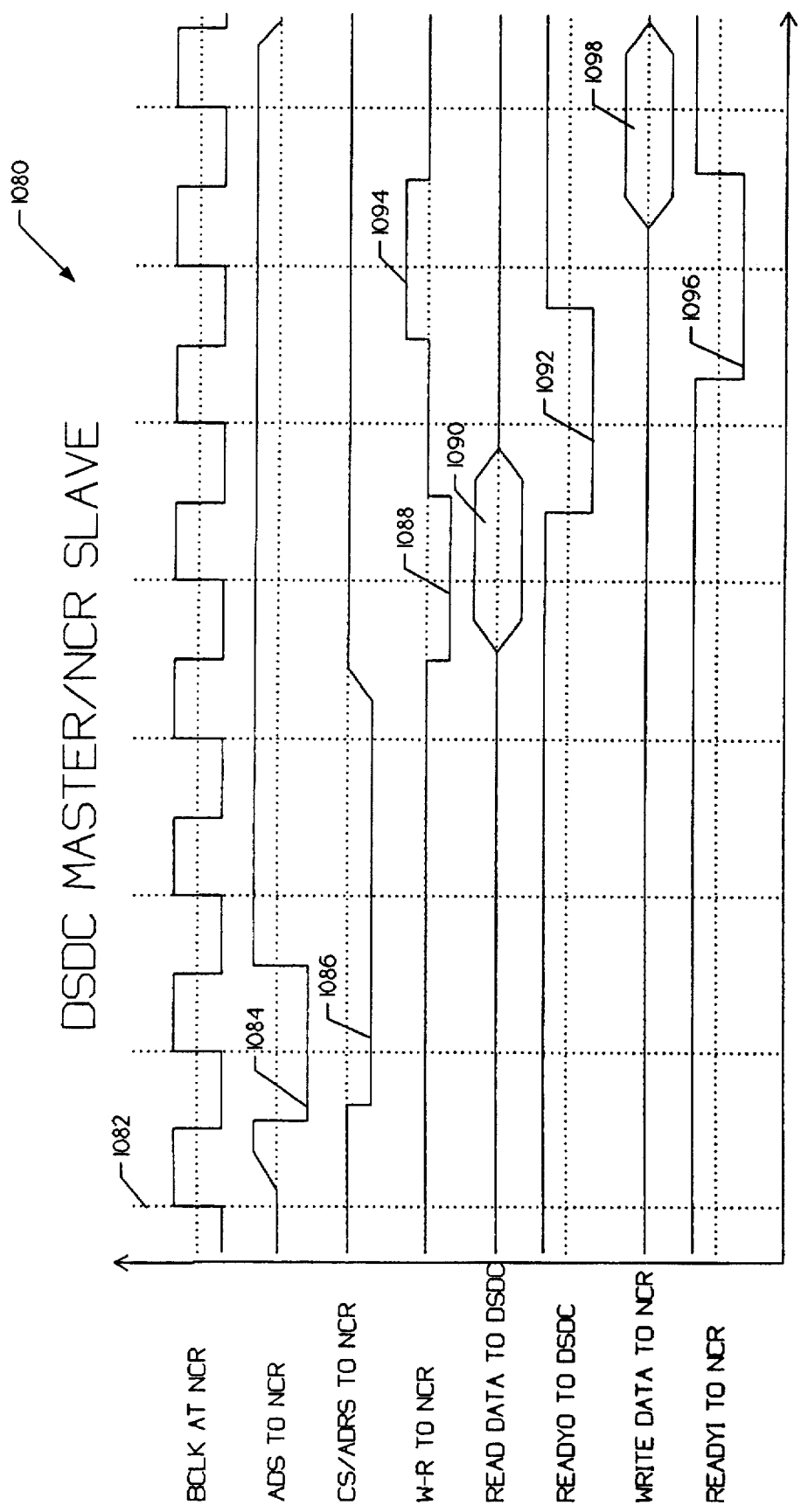
FIG. 14 is a timing diagram illustrating an exemplary read and write cycle on the DSD bus wherein the DSDC device is the master and the NCR chip is the slave.

FIG. 14 is a timing diagram illustrating an exemplary read and write cycle on the DSD bus wherein the DSDC device is the master and the NCR53C720 is the slave. The timing diagram is generally shown at 1080. At time 1082, DSDC 636 may assert an address status signal as shown at 1084. The address status signal indicates to NCR53C720 682 the start of a bus cycle. Shortly thereafter, and while the address status signal is still asserted, DSDC 636 may provide a chip select signal and an address to NCR53C720 682 and memory 680 as shown at 1086. The chip select signal selects the NCR53C720 682 as the slave device. The chip select signal may comprise the slave select field 972 of the DSD address 964.

DSDC 636 may then provide a read/write signal 1088 to NCR53C720 682. At 1088, DSDC 636 provides a low on the read/write signal indicating that DSDC 636 is requesting a read from NCR53C720 682. NCR53C720 682 may then provide the requested read data to DSDC 636 as shown at 1090. Thereafter, NCR53C720 682 may provide a ready-out signal 1092 to DSDC 636 to indicate the end of the slave bus cycle. DSDC 636 may then provide a read/write signal 1094 to NCR53C720 682. At 1094, DSDC 636 provides a high on the read/write signal indicating that DSDC 636 is requesting to write to NCR53C720 682. DSDC 636 may provide a ready-in signal 1096 to NCR53C720 682, indicating that DSDC 636 is ready to write data thereto. DSDC 636 may then provide the write data to NCR53C720 682 as shown at 1098.

Figure 15:
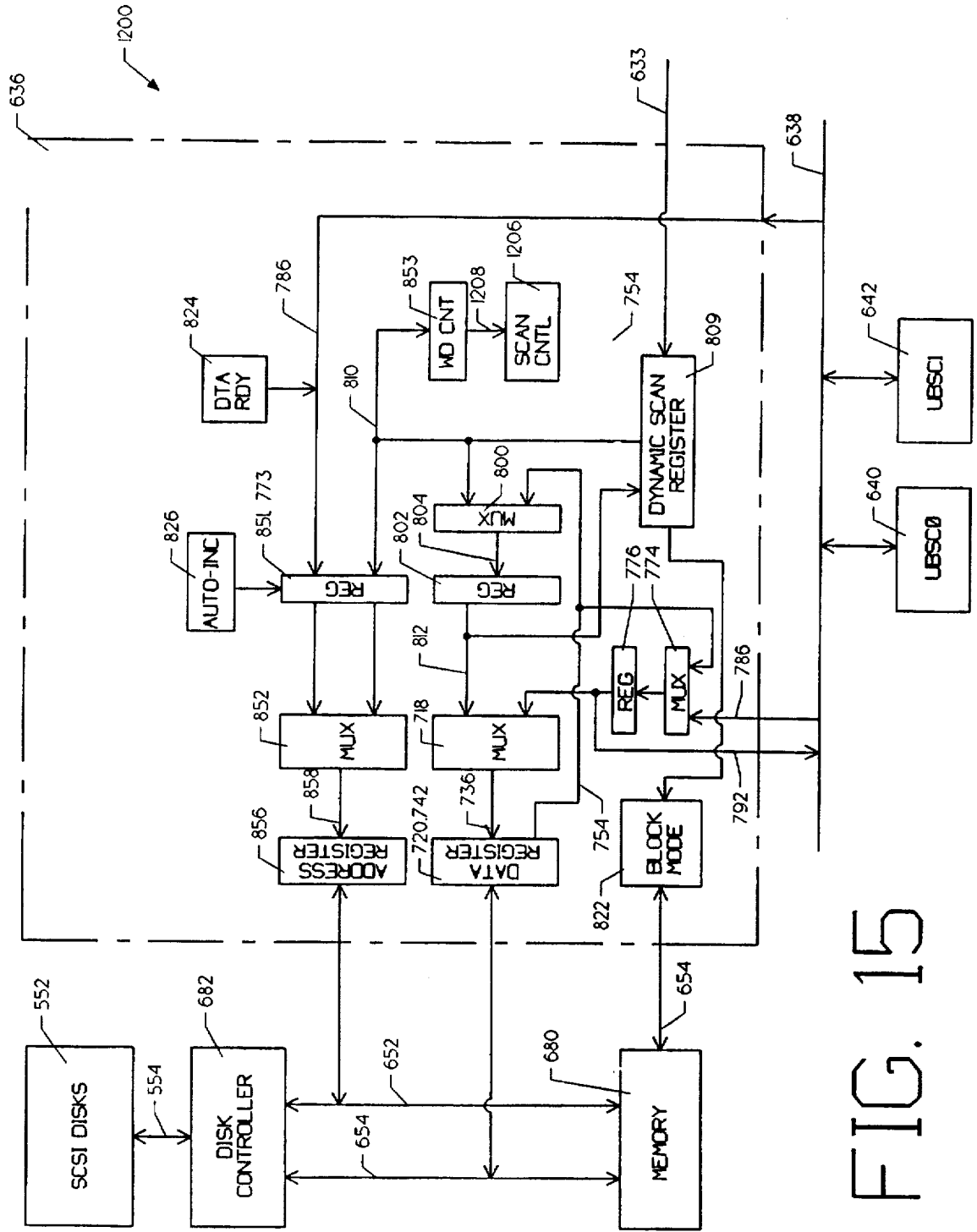
FIG. 15 is a block diagram of an exemplary embodiment of the present invention which is incorporated into the system described with reference to FIG. 6 through FIG. 14.

FIG. 15 is a block diagram of an exemplary embodiment of the present invention which is incorporated into the system described with reference to FIG. 6 through FIG. 14. In this embodiment, a dynamic scan register 809 may be provided in DSDC 636. The DSDC 636 may provide an interface between USBC 640 and memory 680. USBC 640 may communicate with DSDC 636 over MBUS 638 and may communicate with the memory via DSDC 636 as described above. DSDC 636 may receive a data packet from USBC 640 over the MBUS 638. The data packet may comprise an address or a data word.

For a read operation during functional operation, USBC 640 may provide an address to DSDC 636. The address may be latched into register 773. The address may then pass through multiplexer 852 wherein it may be latched by address register 856. In the exemplary embodiment, the address may contain both the desired memory address and the necessary control information. One control field may indicate whether address register 773 is to be in an auto-increment mode (see FIG. 11). The address may then be provided to memory 680 wherein the memory may provide a corresponding data word to data register 720,742. USBC 640 may then read data register 720,742 to complete a read operation. When successive memory addresses are to be read, the auto increment mode may be enabled. In this mode, USBC 640 may only need to provide the corresponding read data word, and may not be required to send an address, as described above.

For a write operation during functional operation, the microsequencer may provide an address to DSDC 636. The address may be latched into register 773. The address may then pass through multiplexer 852 wherein it may be latched by address register 856. In the exemplary embodiment, the address may contain both the desired memory address and the necessary control information. One control field may indicate whether address register 773 is to be in an auto-increment mode (see FIG. 11). During a subsequent MBUS bus cycle, USBC 640 may provide a write data word to DSDC 636. The write data word may be provided to multiplexer 718 via interface 792 (see FIG. 9A). Thereafter, the write data word may be latched into data register 720,742. The address and the write data word may then be provided to memory 680 wherein memory 680 may write the write data word to the corresponding address location. When successive memory addresses are to be written, the auto-increment mode may be enabled. In this mode, USBC 640 may only need to send the corresponding data word, and may not be required to send an address, as described above.

Dynamic register 809 may allow a support controller to read and/or write memory 680 during the normal functional operation of the computer system. For example, a support controller (NIM) may perform a read operation by shifting an address and a number of control signals into dynamic scan register 809 via interface 633. The address may then be gated to address register 856 via register 851 and multiplexer 852. In an exemplary embodiment, the support controller (NIM) may then shift a word count into dynamic scan register 809. The word count may then be provided to word count register 853 via interface 810. The address may then be provided to memory 680 and memory 680 may provide a corresponding read data word to data register 720,742. The read data word may be then be provided to multiplexer 800 and finally to register 802. Register 802 may provide the read data word to dynamic scan register 809 via interface 812. The support controller (NIM) may then shift out the contents thereof for further analysis. Word count register 853 may then be decremented and the address may be automatically incremented via auto-increment block 826. Thereafter, the support controller (NIM) may not be required to shift an address into dynamic scan register 809 for subsequent read operations. Rather, the support controller (NIM) may merely shift each read data word from dynamic scan register 809 as it is provided to dynamic scan register 809 by memory 680. This may be continued until word count register 853 is decremented to zero. Once word count register 852 is decremented to zero, the DSDC read logic is notified to not perform another read operation. This embodiment may significantly increase the speed at which a read operation may be dynamically performed.

For a write operation, the support controller (NIM) may shift an address and a number of control signals into dynamic scan register 809. The address may then be gated to address register 856 via register 851 and multiplexer 852. The support controller (NIM) may then shift a write data word into dynamic scan register 809. The write data word may then be gated to data register 720,742 via multiplexer 800, register 802, and multiplexer 718. The address and write data word may then be provided to memory 680 and memory 680 may write the write data word into the corresponding address location. The address may then be automatically incremented as described above via auto-increment block 826. Thereafter, the support controller (NIM) may not be required to shift an address into dynamic scan register 809 for subsequent write operations. Rather, the support controller (NIM) may only be required to shift a write data word into dynamic scan register 809 for each write operation. This may be continued until so long as the support controller (NIM) continues to provide a new write data word. This embodiment may significantly increase the speed at which a write operation may be dynamically performed.

Figure 16A:
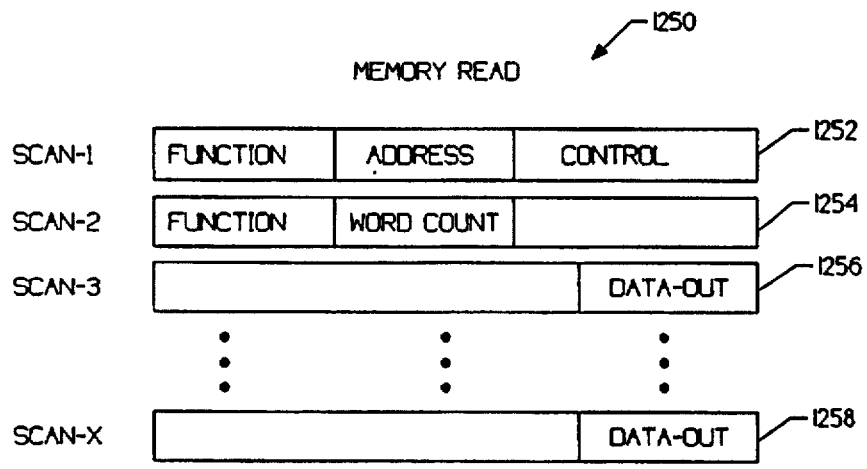
FIG. 16A is a table showing an exemplary bit format of the dynamic scan register of FIG. 15 during a read operation.

FIG. 16A is a table showing an exemplary bit format of the dynamic scan register of FIG. 15 during a read operation. The table is generally shown at 1250. During a first scan operation, the support controller (NIM) may scan in a function code, an address, and a number of control bits as shown at 1252. The function code may indicate that the supporting hardware should load the address and the function code into the appropriate registers. For example, the function code may setup the hardware to gate the address into address register 851. During a second scan operation, the support controller (NIM) may scan in a second function code and a word count as shown at 1254. The function code may indicate that the supporting hardware should load the word count into word count register 853. During a third scan operation, the support controller need only scan out a resulting data word because auto-increment block 826 may automatically provide the next read address. During any subsequent read operations, the support controller (NIM) need only scan out a corresponding resulting data word as shown at 1258.

Figure 16B:
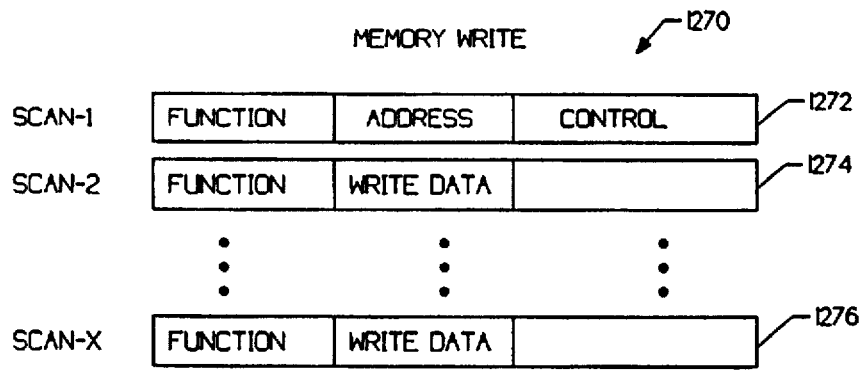
FIG. 16B is a table showing an exemplary bit format of the dynamic scan register of FIG. 15 during a write operation.

FIG. 16B is a table showing an exemplary bit format of the dynamic scan register of FIG. 15 during a write operation. The table is generally shown at 1270. During a first scan operation, the support controller (NIM) may scan in a function code, an address, and a number of control bits as shown at 1272. The function code may indicate that the supporting hardware should load the address and the function code into the appropriate registers. For example, the function code may setup the hardware to gate the address into address register 851. During a second scan operation, the support controller (NIM) may scan in a second function code and a write data word as shown at 1274. The function code may indicate that the supporting hardware should gate the write data word to data register 802. During a third scan operation, the support controller need only scan in a function code and a corresponding write data word because auto-increment block 826 may automatically provide the next write address. The function code may indicate that the supporting hardware should gate the write data word to data register 802. During any subsequent write operations, the support controller (NIM) need only scan in a function code and a corresponding write data word as shown at 1276.

Figure 16C:
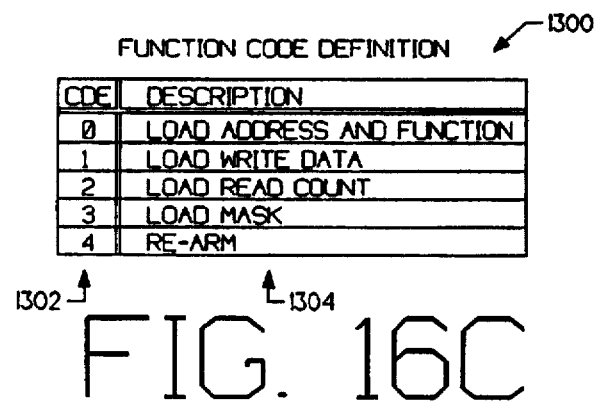
FIG. 16C is a table showing an exemplary function code definition for the function field of FIG. 16A and FIG. 16B.

FIG. 16C is a table showing an exemplary function code definition for the function field of FIG. 16A and FIG. 16B. The table is generally shown at 1300. An exemplary function code is shown in column 1302 and the corresponding function code description is shown in column 1304. A first function code may indicate that the supporting hardware should load the address and the function code into address register 851. A second function code may indicate that the supporting hardware should load the corresponding write data word into data register 802. A third function code may indicate that the supporting hardware should load the word count into word count register 853. A fourth function code may indicate that the supporting hardware should load a mask into an appropriate mask register (not shown). Finally, a fifth function code may indicate that the fault logic should be re-armed.

Figure 17:
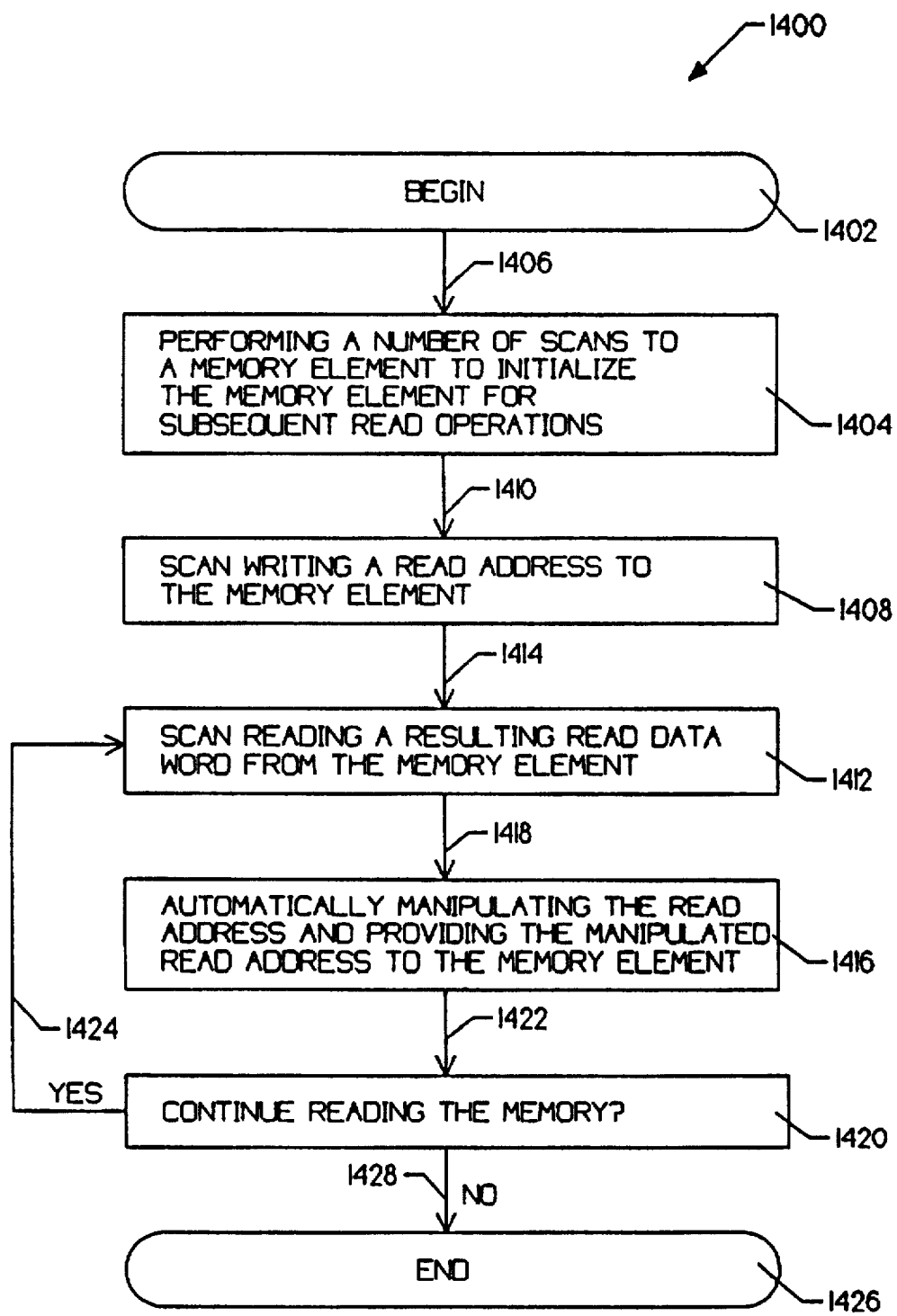
FIG. 17 is a flow diagram showing a first exemplary read operation in accordance with the present invention.

FIG. 17 is a flow diagram showing a first exemplary read operation in accordance with the present invention. The flow diagram is generally shown at 14. The algorithm is entered at element 1402, wherein control is passed to element 1404 via interface 1406. Element 1404 performs a number of scans to a memory element to initialize the memory element for subsequent read operations. This may include establishing the control signals and a word count. Control is then passed to element 1408 via interface 1410. Element 1408 scans in a read address to the memory element. It is contemplated that the memory element may have scan registers on the address, data, and control input ports. Control is then passed to element 1412 via interface 1414. Element 1412 scans out a resulting read data word from the memory element. Control is then passed to element 1416 via interface 1418. Element 1416 automatically manipulates the read address and provides the manipulated read address to the memory element. Control is then passed to element 1420 via interface 1422. Element 1420 determines whether another read operation is desired. If another read operation is desired, control is passed back to element 1412 via interface 1424. If another read operation is not desired, control is passed to element 1426 via interface 1428, wherein the algorithm is exited.

Figure 18:
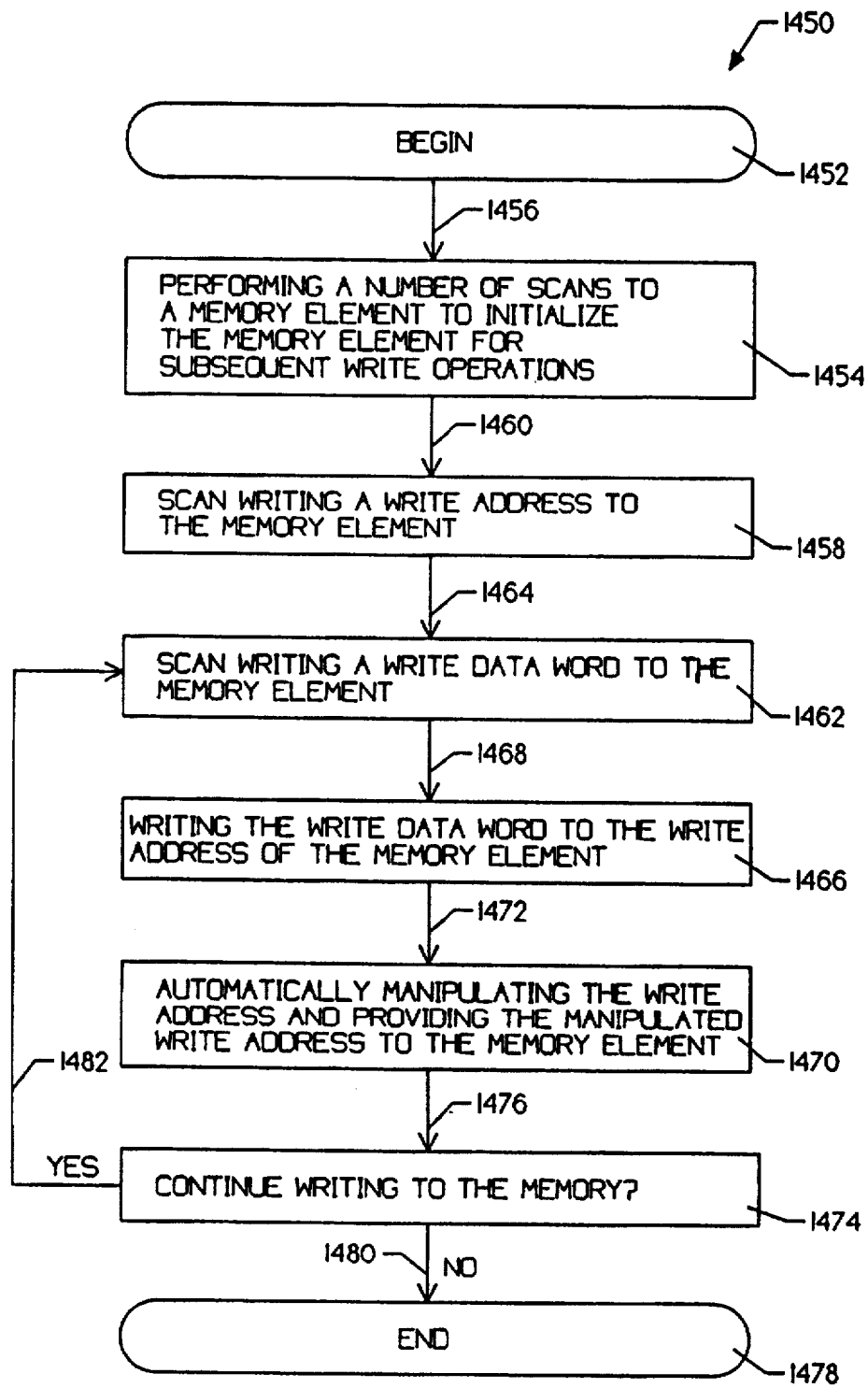
FIG. 18 is a flow diagram showing a first exemplary write operation in accordance with the present invention.

FIG. 18 is a flow diagram showing a first exemplary write operation in accordance with the present invention. The flow diagram is generally shown at 1450. The algorithm is entered at element 1452, wherein control is passed to element 1454 via interface 1456. Element 1454 performs a number of scans to a memory element to initialize the memory element for subsequent write operations. Control is then passed to element 1458 via interface 1460. Element 1458 scans in a write address to the memory element. As indicated above, it is contemplated that the memory element may have a register on the address, data, and control input ports. Control is then passed to element 1462 via interface 1464. Element 1462 scans a write data word to the memory element. Control is then passed to element 1466 via interface 1468. Element 1466 writes the write data word to the write address of the memory element. Control is then passed to element 1470 via interface 1472. Element 1470 automatically manipulates the write address and provides the manipulated write address to the memory element. Control is then passed to element 1474 via interface 1476. Element 1474 determines whether another write operation is desired. If another write operation is desired, control is passed back to element 1462 via interface 1482. If another write operation is not desired, control is passed to element 1478 via interface 1480, wherein the algorithm is exited.

Figure 19A:
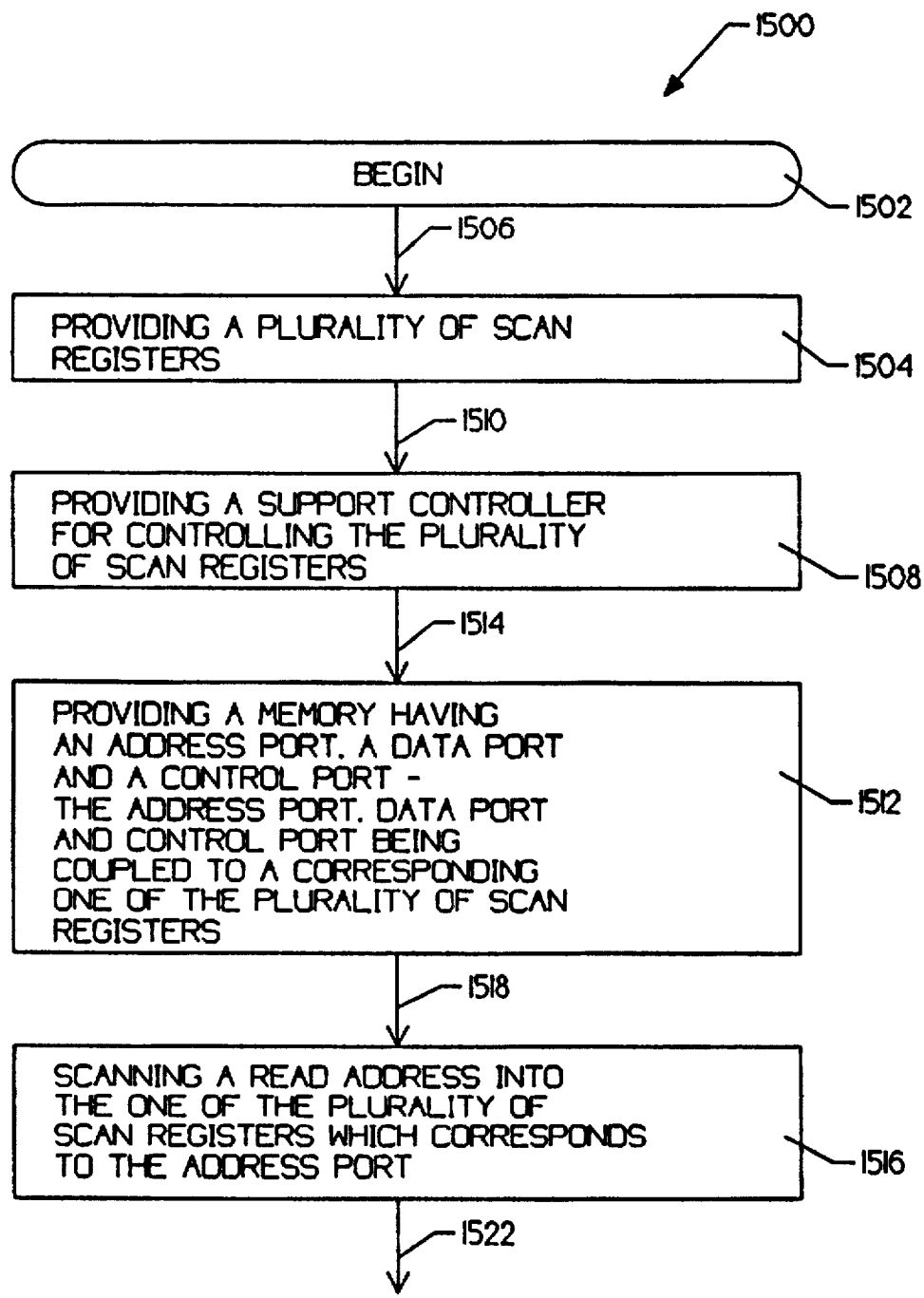
FIG. 19A and FIG. 19B comprise a flow diagram showing a second exemplary read operation in accordance with the present invention.
Figure 19B:
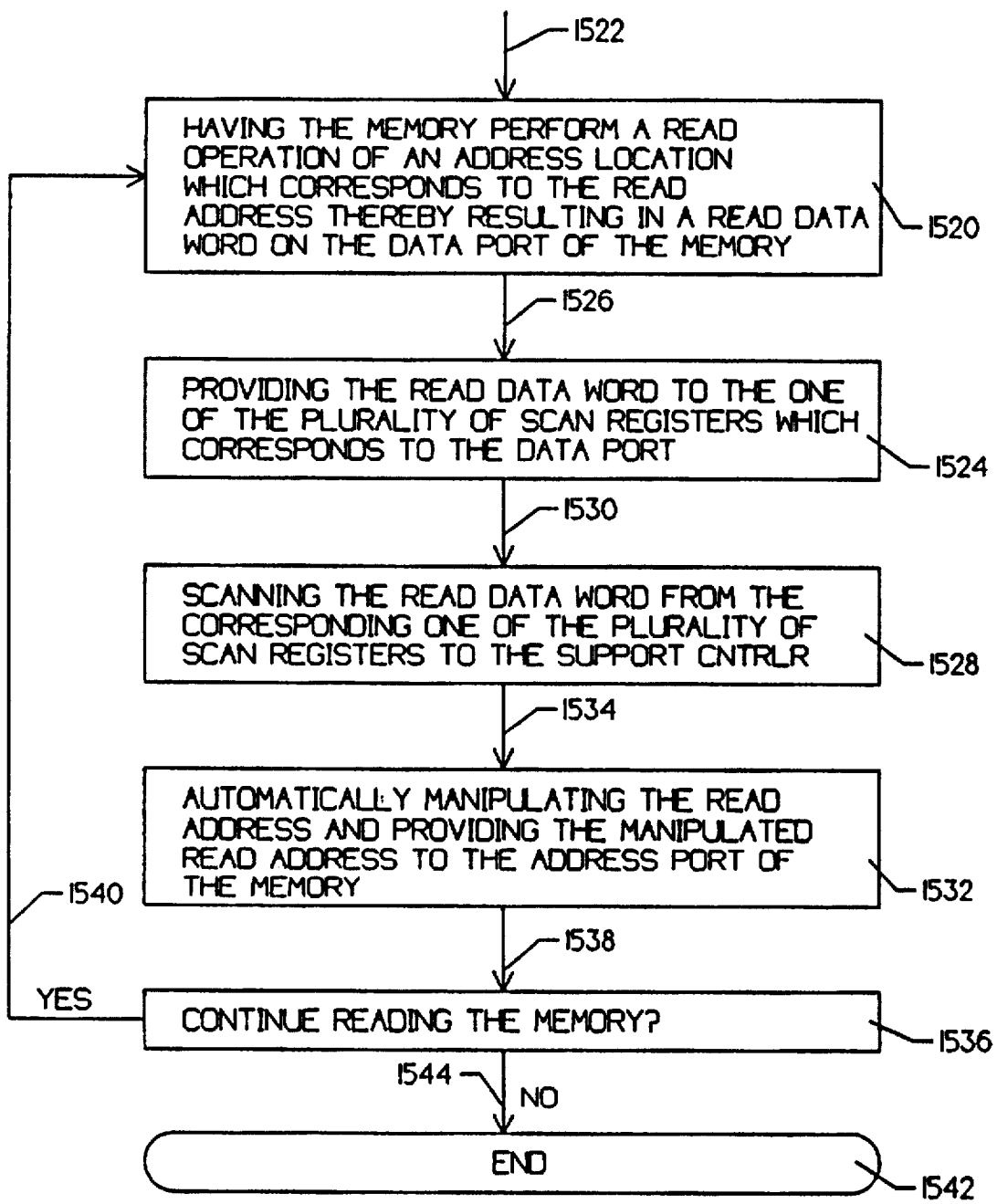

FIG. 19A and FIG. 19B comprise a flow diagram showing a second exemplary read operation in accordance with the present invention. The flow diagram is generally shown at 1500. The algorithm is entered at element 1502, wherein control is passed to element 1504 via interface 1506. Element 1504 provides a plurality of scan registers. Control is then passed to element 1508 via interface 1510. Element 1508 provides a support controller for controlling the plurality of scan registers. Control is then passed to element 1512 via interface 1514. Element 1512 provides a memory having an address port, a data port, and a control port. The address port, data port and control port are coupled to a corresponding one of the plurality of scan registers. Control is then passed to element 1516 via interface 1518. Element 1516 scans a read address into the one of the plurality of scan registers which corresponds to the address port. Control is then passed to element 1520 via interface 1522. Element 1520 has the memory perform a read operation of an address location which corresponds to the read address, thereby resulting in a read data word on the data port of the memory. Control is then passed to element 1524 via interface 1526. Element 1524 provides the read data word to the one of the plurality of scan registers which corresponds to the data port. Control is then passed to element 1528 via interface 1530. Element 1528 scans the read data word from the corresponding one of the plurality of scan registers to the support controller. Control is then passed to element 1532 via interface 1534. Element 1532 automatically manipulates the read address and provides the manipulated read address to the address port of the memory. Control is then passed to element 1536 via interface 1538. Element 1536 determines whether another read operation is desired. If another read operation is desired, control is passed back to element 1520 via interface 1540. If another read operation is not desired, control is passed to element 1542 via interface 1544, wherein the algorithm is exited.

Figure 20A:
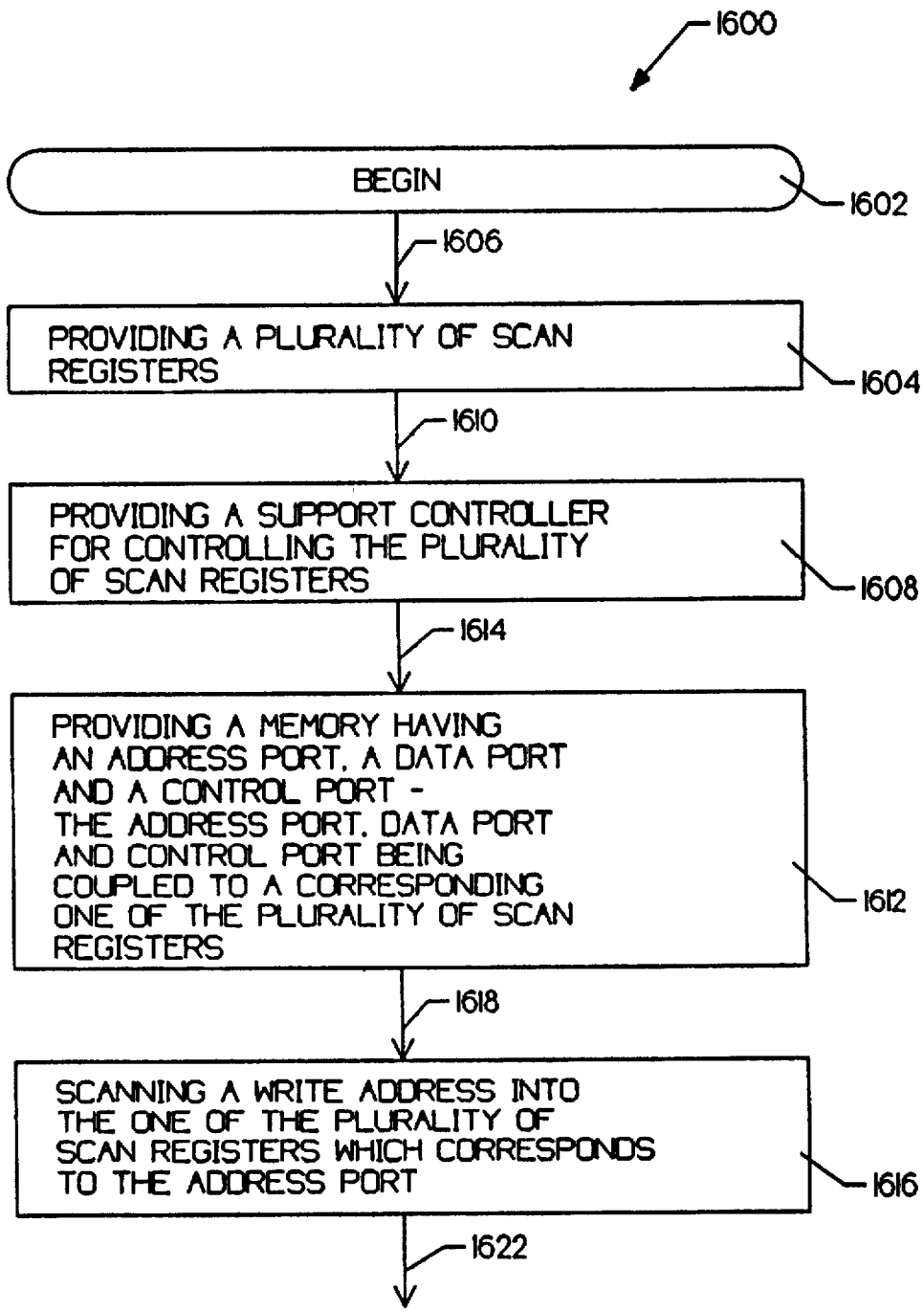
FIG. 20A and FIG. 20B comprise a flow diagram showing a second exemplary write operation in accordance with the present invention.
Figure 20B:
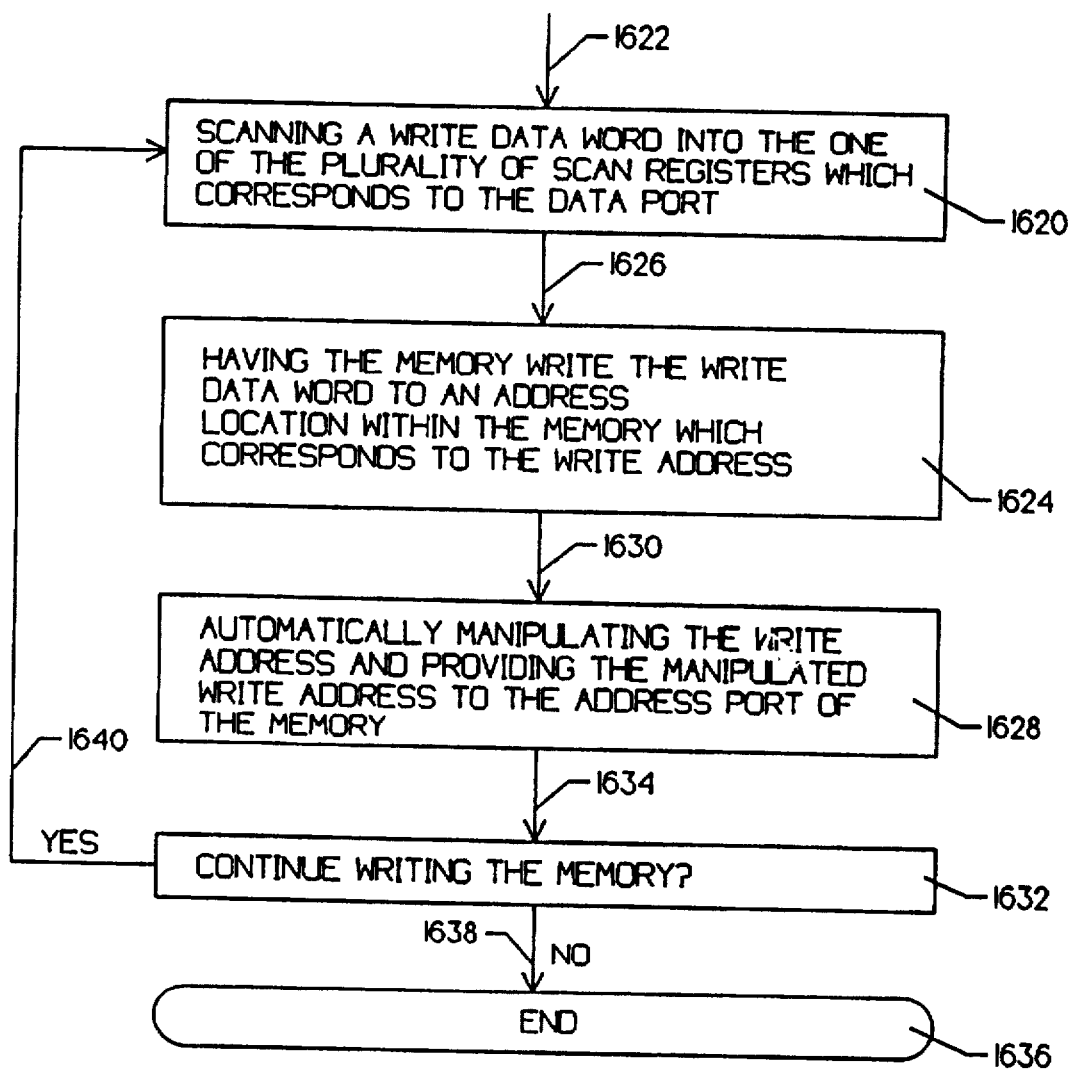

FIG. 20A and FIG. 20B comprise a flow diagram showing a second exemplary write operation in accordance with the present invention. The flow diagram is generally shown at 1600. The algorithm is entered at 1602, wherein control is passed to element 1604 via interface 1606. Element 1604 provides a plurality of scan registers. Control is then passed to element 1608 via interface 1610. Element 1608 provides a support controller for controlling the plurality of scan registers. Control is then passed to element 1612 via interface 1614. Element 1612 provides a memory having an address port, a data port, and a control port. The address port, data port and control port are coupled to a corresponding one of the plurality of scan registers. Control is then passed to element 1616 via interface 1618. Element 1616 scans a write address into the one of the plurality of scan registers which corresponds to the address port. Control is then passed to element 1620 via interface 1622. Element 1620 scans a write data word into the one of the plurality of scan registers which corresponds to the data port. Control is then passed to element 1624 via interface 1626. Element 1624 has the memory write the write data word to an address location within the memory which corresponds to the write address. Control is then passed to element 1628 via interface 1630. Element 1628 automatically manipulates the write address and provides the manipulated write address to the address port of the memory. Control is then passed to element 1632 via interface 1634. Element 1632 determines whether another write operation is desired. If another write operation is desired, control is passed back to element 1620 via interface 1640. If another write operation is not desired, control is passed to element 1636 via interface 1638, wherein the algorithm is exited.

Figure 21A:
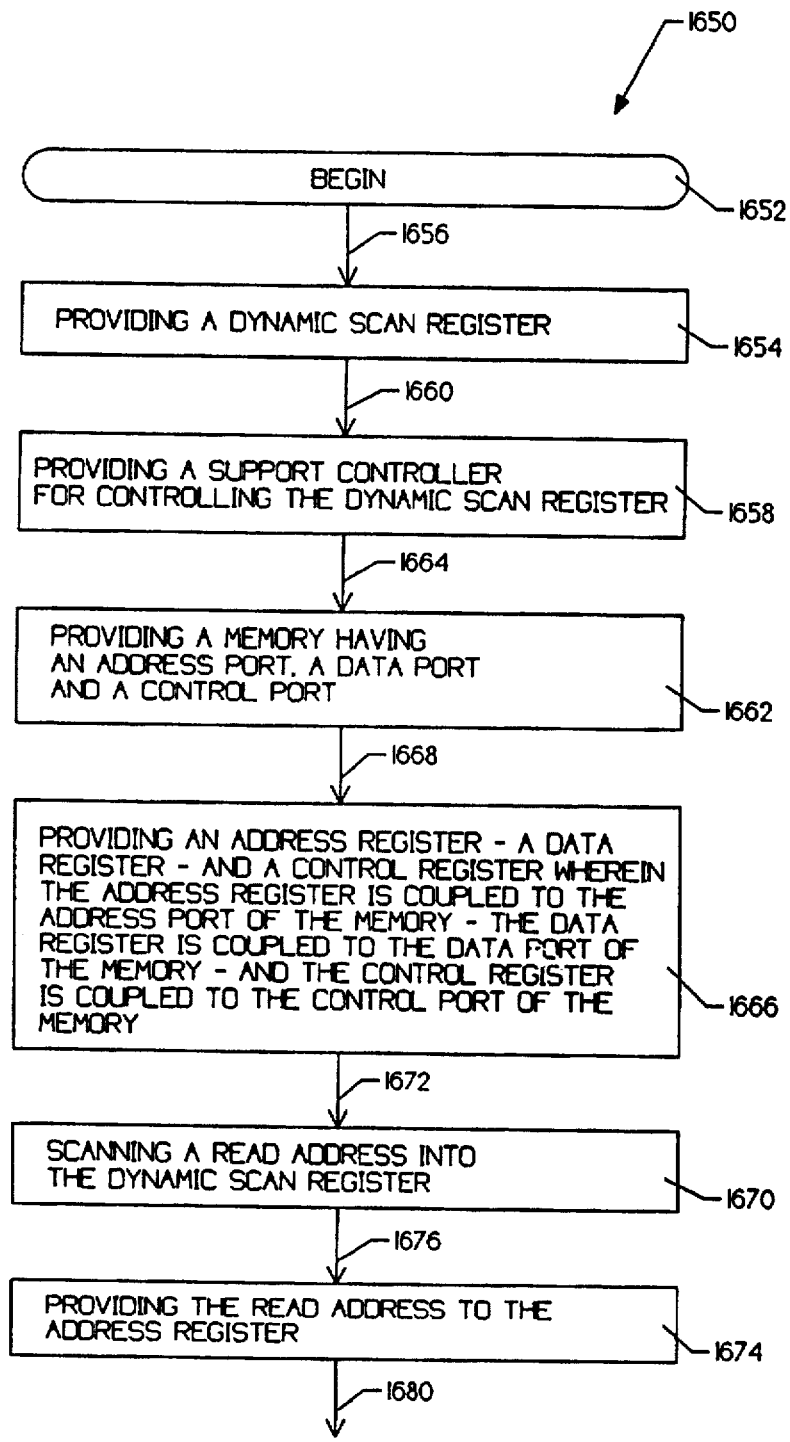
FIG. 21A and FIG. 21B comprise a flow diagram showing a third exemplary read operation in accordance with the present invention.
Figure 21B:
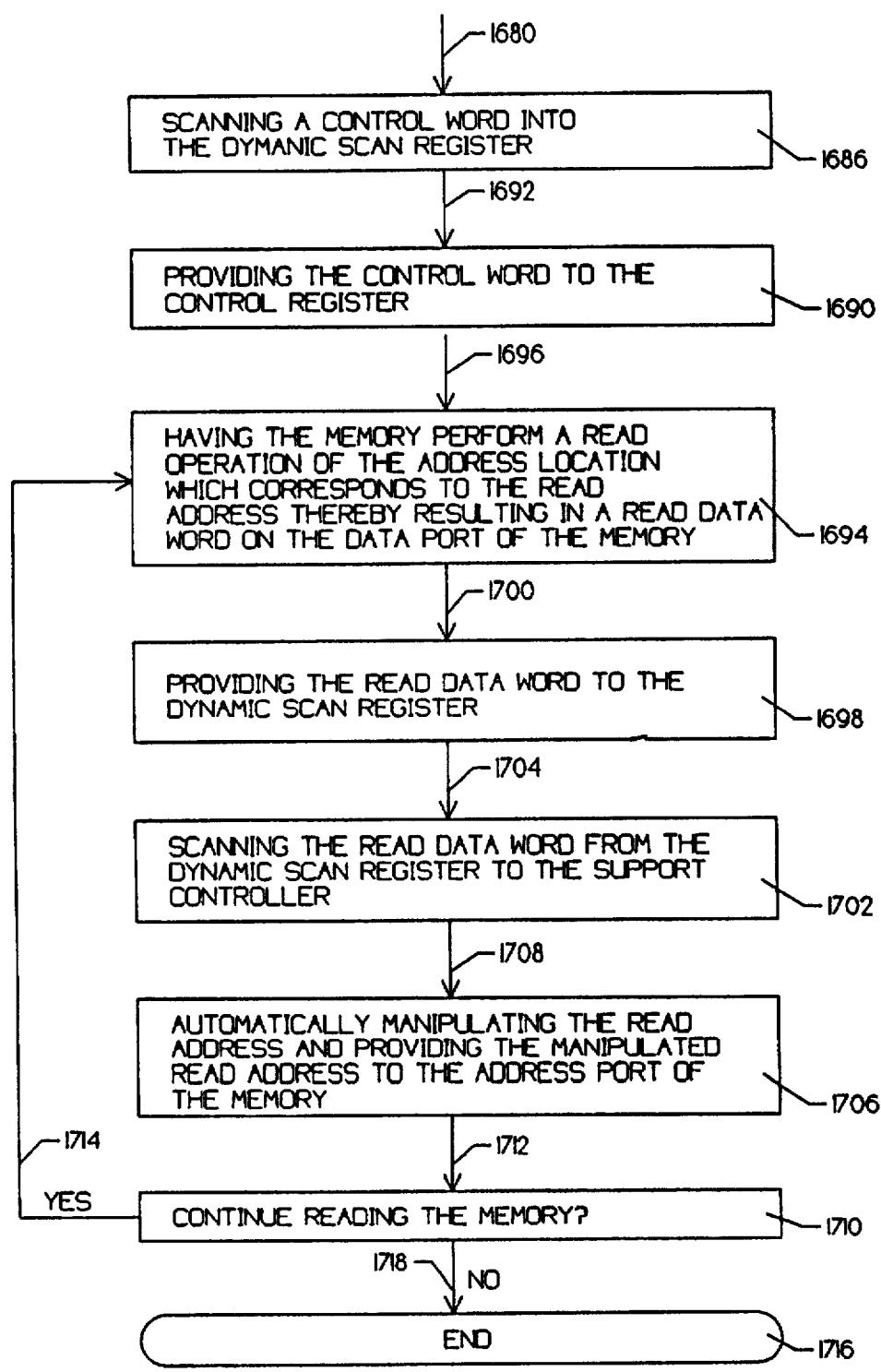

FIG. 21A and FIG. 21B comprise a flow diagram showing a third exemplary read operation in accordance with the present invention. The flow diagram is generally shown at 1650. The algorithm is entered at element 1652, wherein control is passed to element 1654 via interface 1656. Element 1654 provides a dynamic scan register. Control is then passed to element 1658 via interface 1660. Element 1658 provides a support controller for controlling the dynamic scan register. Control is then passed to element 1662 via interface 1664. Element 1662 provides a memory having an address port, a data port, and a control port. Control is then passed to element 1666 via interface 1668. Element 1666 provides an address register, a data register and a control register. The address register is coupled to the address port of the memory, and the data register is coupled to the data port of the memory. Further, the control register is coupled to the control port of the memory. Control is then passed to element 1670 via interface 1672. Element 1670 scans a read address into the dynamic scan register. Control is then passed to element 1674 via interface 1676. Element 1674 provides the read address to the address register. Control is then passed to element 1686 via interface 1680. Element 1686 scans a control word into the dynamic scan register. Control is then passed to element 1690 via interface 1692. Element 1690 provides the control word to the control register. Control is then passed to element 1694 via interface 1696. Element 1694 has the memory perform a read operation of the address location which corresponds to the read address, thereby resulting in a read data word on the data port of the memory. Control is then passed to element 1698 via interface 1700. Element 1698 provides the read data word to the dynamic scan register. Control is then passed to element 1702 via interface 1704. Element 1702 scans the read data word from the dynamic scan register to the support controller. Control is then passed to element 1706 via interface 1708. Element 1706 automatically manipulates the read address and provides the manipulated read address to the address port of the memory. Control is then passed to element 1710 via interface 1712. Element 1710 determines whether another read operation is desired. If another read operation is desired, control is passed back to element 1694 via interface 1714. If another read operation is not desired, control is passed to element 1716 via interface 1718, wherein the algorithm is exited.

Figure 22A:
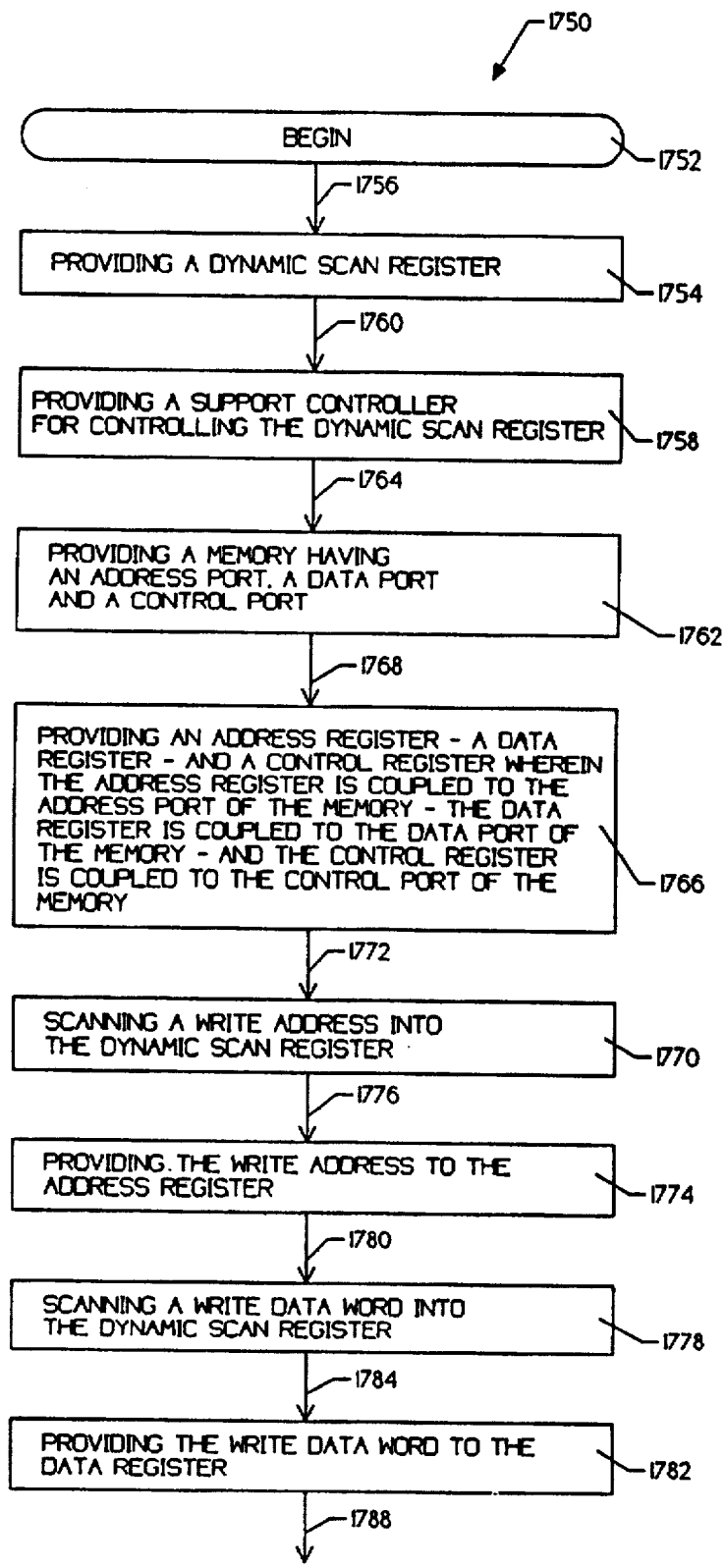
FIG. 22A and FIG. 22B comprise a flow diagram showing a third exemplary write operation in accordance with the present invention.
Figure 22B:
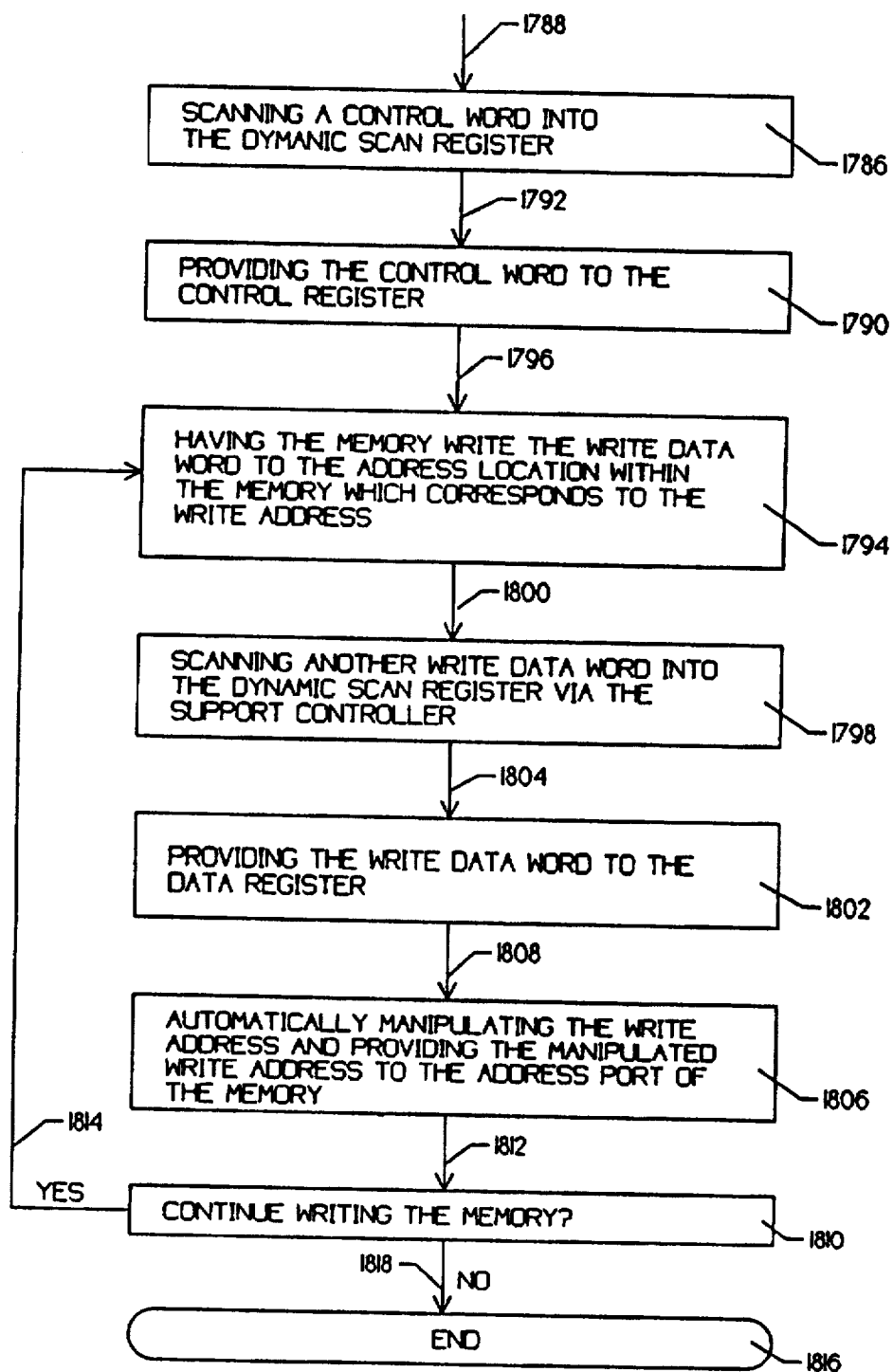

FIG. 22A and FIG. 22B comprise a flow diagram showing a third exemplary write operation in accordance with the present invention. The flow diagram is generally shown at 1750. The algorithm is entered at element 1752, wherein control is passed to element 1754 via interface 1756. Element 1754 provides a dynamic scan register. Control is then passed to element 1758 via interface 1760. Element 1758 provides a support controller for controlling the dynamic scan register. Control is then passed to element 1762 via interface 1764. Element 1762 provides a memory having an address port, a data port, and a control port. Control is then passed to element 1766 via interface 1768. Element 1766 provides an address register, a data register and a control register. The address register is coupled to the address port of the memory and the data register is coupled to the data port of the memory. Further, the control register is coupled to the control port of the memory. Control is then passed to element 1770 via interface 1772. Element 1770 scans a write address into the dynamic scan register. Control is then passed to element 1774 via interface 1776. Element 1774 provides the write address to the address register. Control is then passed to element 1778 via interface 1780. Element 1778 scans a write data word into the dynamic scan register. Control is then passed to element 1782 via interface 1784. Element 1782 provides the write data word to the data register. Control is then passed to element 1786 via interface 1788. Element 1786 scans a control word into the dynamic scan register. Control is then passed to element 1790 via interface 1792. Element 1790 provides the control word to the control register. Control is then passed to element 1794 via interface 1796. Element 1794 has the memory write the write data word to the address location within the memory which corresponds to the write address. Control is then passed to element 1798 via interface 1800. Element 1798 scans another write data word into the dynamic scan register via the support controller. Control is then passed to element 1802 via interface 1804. Element 1802 provides the write data word to the data register. Control is then passed to element 1806 via interface 1808. Element 1806 automatically manipulates the write address and provides the manipulated write address to the address port of the memory. Control is then passed to element 1810 via interface 1812. Element 1810 determines whether another write operation is desired. If another write operation is desired, control is passed back to element 1794 via interface 1814. If another write operation is not desired, control is passed to element 1816 via interface 1818, wherein the algorithm is exited.

Figure 23A:
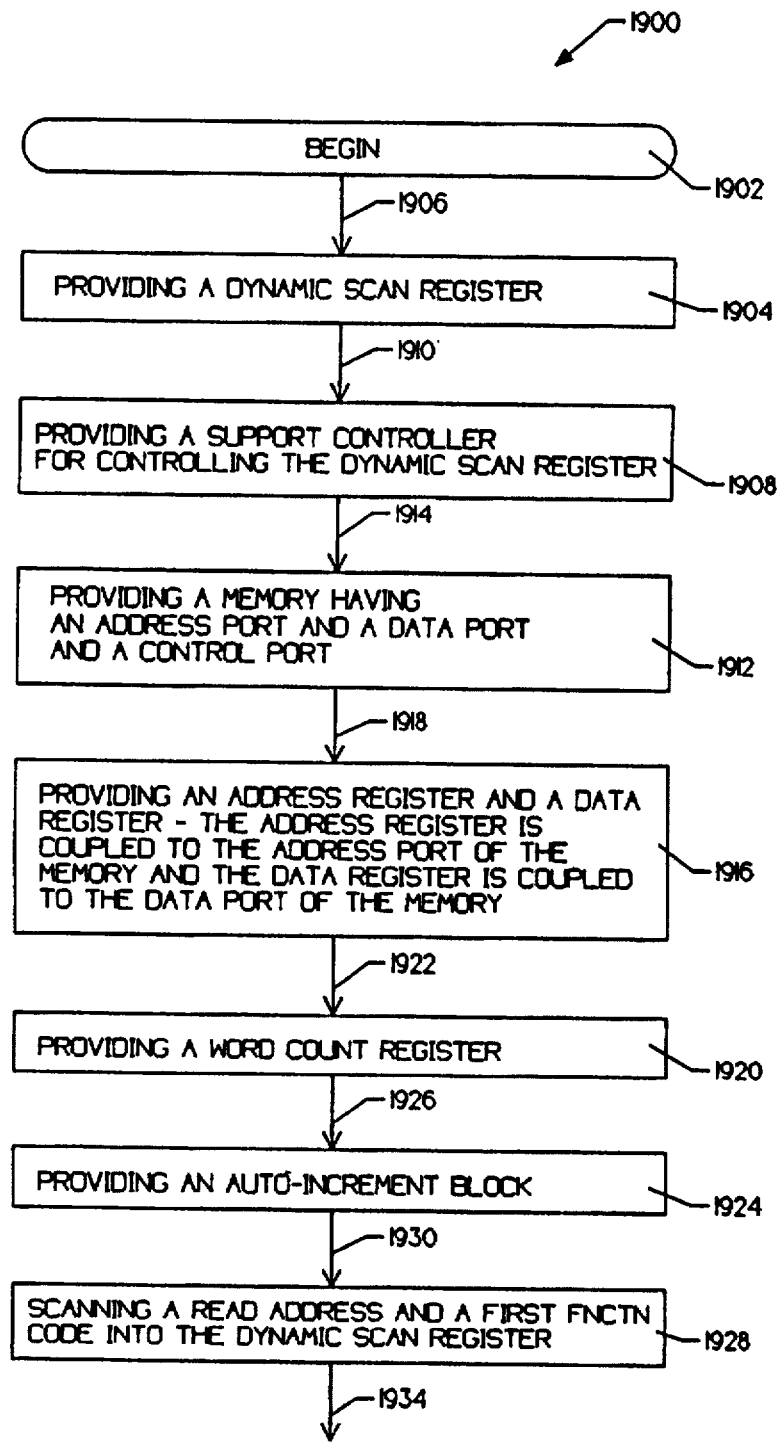
FIG. 23A and FIG. 23B comprise a flow diagram showing a fourth exemplary read operation in accordance with the present invention.
Figure 23B:
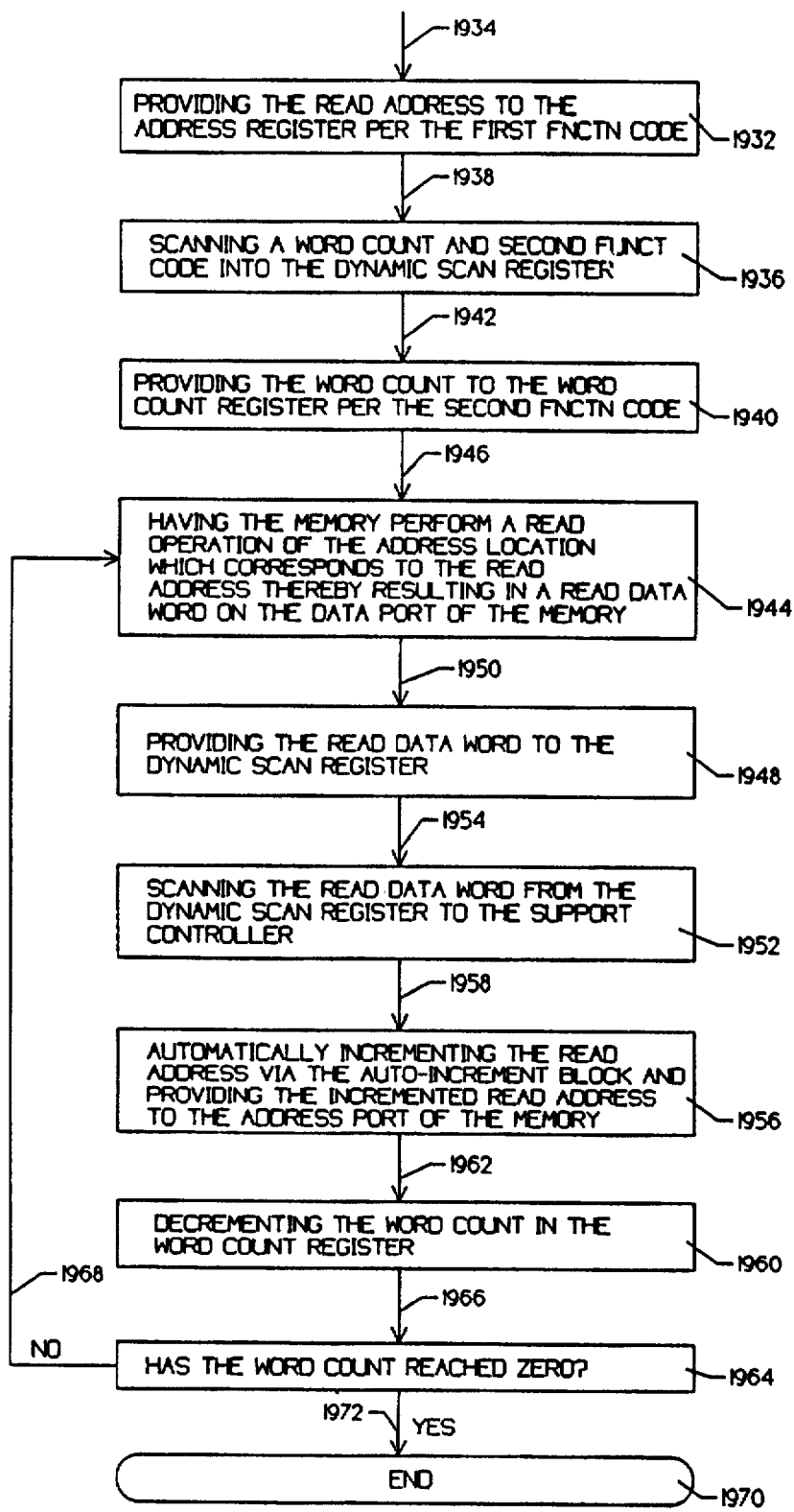

FIG. 23A and FIG. 23B comprise a flow diagram showing a fourth exemplary read operation in accordance with the present invention. The flow diagram is generally shown at 1900. The algorithm is entered at element 1902, wherein control is passed to element 1904 via interface 1906. Element 1904 provides a dynamic scan register. Control is then passed to element 1908 via interface 1910. Element 1908 provides a support controller for controlling the dynamic scan register. Control is then passed to element 1912 via interface 1914. Element 1912 provides a memory having an address port, a data port, and a control port. Control is then passed to element 1916 via interface 1918. Element 1916 provides an address register and a data register. The address register is coupled to the address port of the memory, and the data register is coupled to the data port of the memory. In this exemplary method, the control signals may be provided within the address register. Control is then passed to element 1920 via interface 1922. Element 1920 provides a word count register. Control is then passed to element 1924 via interface 1926. Element 1924 provides an auto increment block. Control is then passed to element 1928 via interface 1930. Element 1928 scans a read address and a first function code into the dynamic scan register. Control is then passed to element 1932 via interface 1934. Element 1932 provides the read address to the address register per the first function code. Control is then passed to element 1936 via interface 1938. Element 1936 scans a word count and a second function code into the dynamic scan register. Control is then passed to element 1940 via interface 1942. Element 1940 provides the word count to the word count register per the second function code. Control is then passed to element 1944 via interface 1946. Element 1944 has the memory perform a read operation of the address location which corresponds to the read address, thereby resulting in a read data word on the data port of the memory. Control is then passed to element 1948 via interface 1950. Element 1948 provides the read data word to the dynamic scan register. Control is then passed to element 1952 via interface 1954. Element 1952 scans the read data word from the dynamic scan register to the support controller. Control is then passed to element 1956 via interface 1958. Element 1956 automatically increments the read address via the auto increment block and provides the incremented read address to the address port of the memory. Control is then passed to element 1960 via interface 1962. Element 1960 decrements the word count in the word count register. Control is then passed to element 1964 via interface 1966. Element 1964 determines the word count register has reached a predetermined value. If the word count has not reached the predetermined value, control is passed back to element 1944 via interface 1968. If the word count register has reached the predetermined value, control is passed to element 1970 via interface 1972, wherein the algorithm is exited.

Figure 24A:
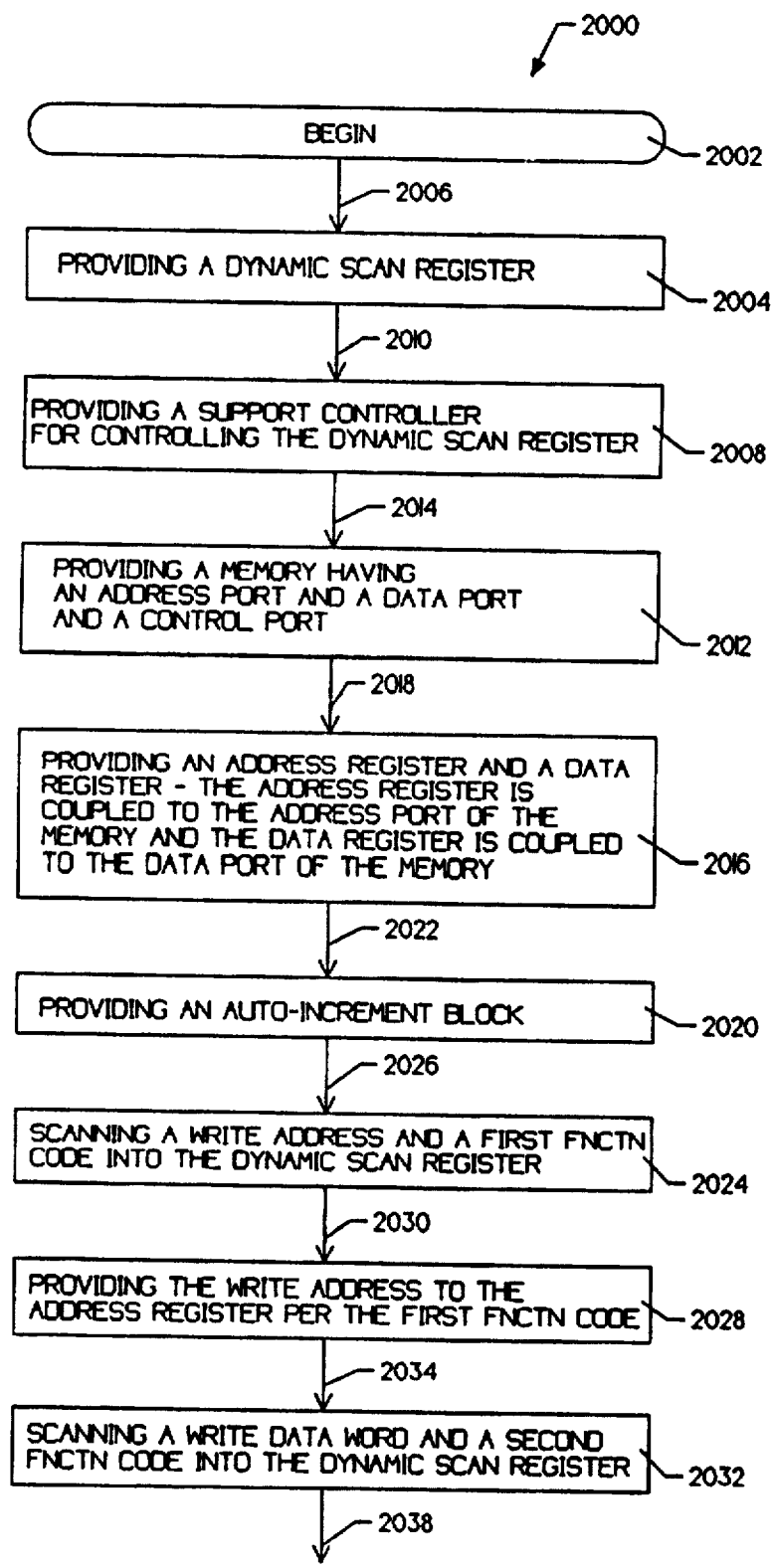
FIG. 24A and FIG. 24B comprise a flow diagram showing a fourth exemplary write operation in accordance with the present invention.
Figure 24B:
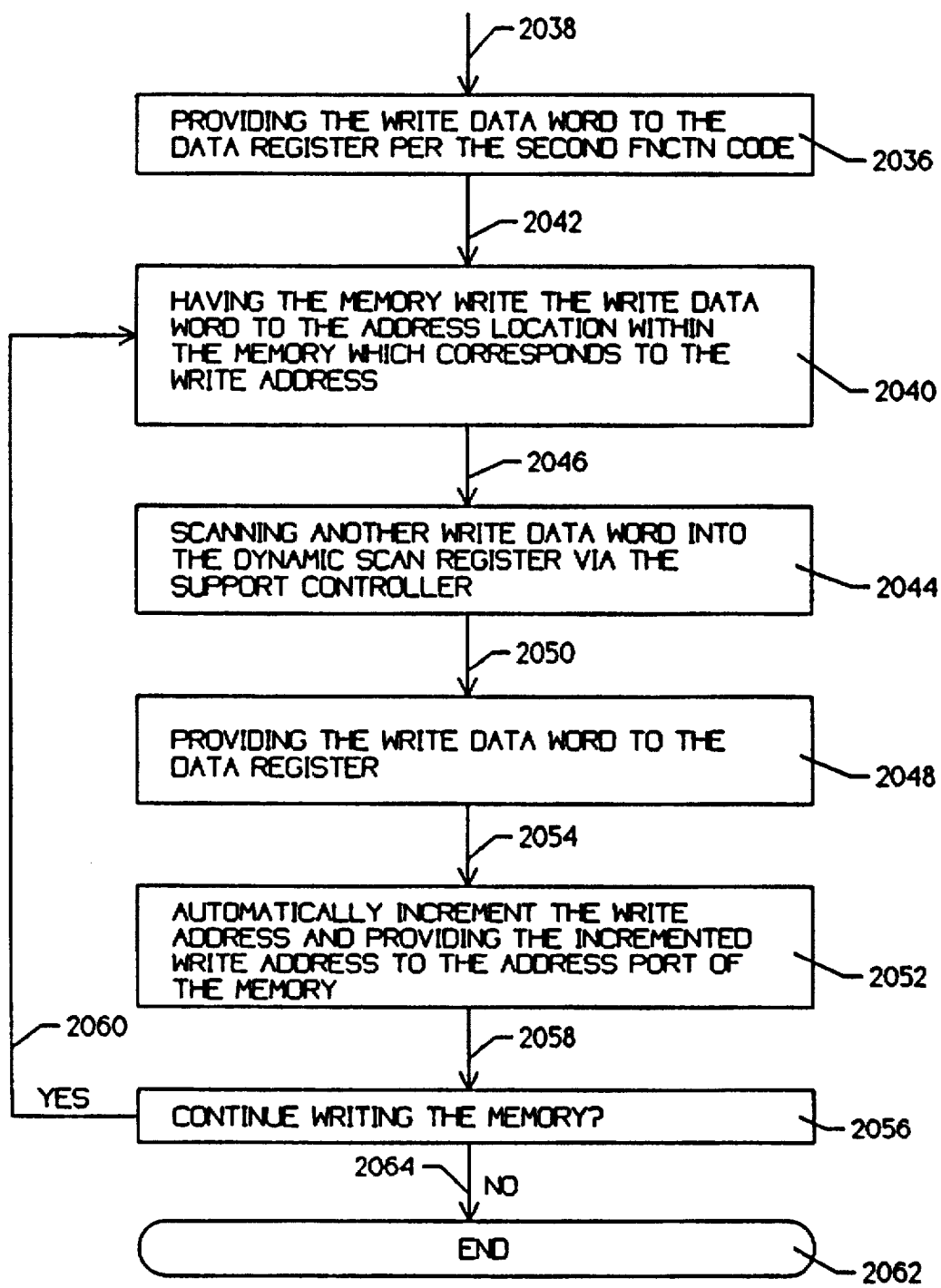

FIG. 24A and FIG. 24B comprise a flow diagram showing a fourth exemplary write operation in accordance with the present invention. The flow diagram is generally shown at 2000. The algorithm is entered at element 2002, wherein control is passed to element 2004 via interface 2006. Element 2004 provides a dynamic scan register. Control is then passed to element 2008 via interface 2010. Element 2008 provides a support controller for controlling the dynamic scan register. Control is then passed to element 2112 via interface 2114. Element 2112 provides a memory having an address port, a data port, and a control port. Control is then passed to element 2116 via interface 2118. Element 2116 provides an address register and a data register. The address register is coupled to the address port of the memory, and the data register is coupled to the data port of the memory. Control is then passed to element 2020 via interface 2022. Element 2020 provides an auto increment block. Control is then passed to element 2024 via interface 2026. Element 2024 scans a write address and a first function code into the dynamic scan register. Control is then passed to element 2028 via interface 2030. Element 2028 provides the write address to the address register per the first function code. Control is then passed to element 2032 via interface 2034. Element 2032 scans a write data word and a second function code into the dynamic scan register. Control is then passed to element 2036 via interface 2038. Element 2036 provides the write data word to the data register per the second function code. Control is then passed to element 2040 via interface 2042. Element 2040 has the memory write the write data word to the address location within the memory which corresponds to the write address. Control is then passed to element 2044 via interface 2046. Element 2044 scans another write data word into the dynamic scan register via the support controller. Control is then passed to element 2048 via interface 2050. Element 2048 provides the write data word to the data register. Control is then passed to element 2052 via interface 2054. Element 2052 automatically increments the write address and provides the incremented write address to the address port of the memory. Control is then passed to element 2056 via interface 2058. Element 2056 determines whether another write operation is desired. If another write operation is desired, control is passed back to element 2040 via interface 2060. If another write operation is not desired, control is passed to element 2062 via interface 2064, wherein the algorithm is exited.

Having thus described the preferred embodiments of the present invention, those of skill in the art will readily appreciate that the teachings found herein may be applied to yet other embodiments within the scope of the claims hereto attached.

We claim:

1. In a data processing system having a memory and a number of registers, the memory having an address port and a data port, at least one of the number of registers being coupled to the address port, and the number of registers being connected together to form two or more scan paths for accessing different ones of said number of registers, the improvement comprising:

a. support controller means coupled to the two or more scan paths for shifting an address into the two or more scan paths, and the at least one of the number of registers that is coupled to the address port of the memory receiving said address, said support controller means capable of performing a number of read and write operations on the memory via the two or more scan paths; and b. auto-increment means coupled to the at least one of the number of registers that is coupled to the address port of the memory for automatically manipulating said address, whereby addresses are calculated.

2. A data processing system according to claim 1 wherein said auto-increment means manipulates said address after a first read operations, thereby not requiring said support controller means to shift in another address into the two or more scan paths for a second read operation.

3. A data processing system according to claim 1 wherein said auto-increment means manipulates said address between a number of successive read operations, thereby not requiring said support controller means to shift in another address into the two or more scan paths for the number of successive read operation.

4. A data processing system according to claim 1 wherein said auto-increment means manipulates said address after a first write operations, thereby not requiring said support controller means to shift in another address into the two or more scan paths for a second write operation.

5. A data processing system according to claim 1 wherein said auto-increment means manipulates said address between a number of successive write operations, thereby not requiring said support controller means to shift in another address into the two or more scan paths for the number of successive write operation.

6. A data processing system according to claim 1 wherein at least one of the number of registers are serial scan shift registers.

7. A data processing system according to claim 1 wherein said auto-increment means manipulates said address by performing an arithmetic operation.

8. A data processing system according to claim 7 wherein said arithmetic operation comprises incrementing said address.

9. A data processing system according to claim 7 wherein said arithmetic operation comprises decrementing said address.

10. A data processing system according to claim 7 wherein said arithmetic operation comprises multiplying said address by a predetermined number.

11. In a data processing system having a memory and a number of registers, the memory having an address port and a data port, at least one of the number of registers being coupled to the address port and at least one of the number of registers being coupled to the data port, the improvement comprising:
  a. dynamic scan register means coupled to the at least one of the number of registers that is coupled to the address port and the at least one of the number of registers that is coupled to the data port of the memory;
  b. support controller means coupled to said dynamic scan register means for shifting an address and data into said dynamic scan register means, the at least one of the number of registers that is coupled to the address port of the memory receiving said address from said dynamic scan register means and the at least one of the number of registers that is coupled to the data port of the memory receiving said data from said dynamic scan register means, said support controller means capable of performing a number of read and write operations on the memory via the dynamic scan register means; and
  c. auto-increment means coupled to the at least one of the number of registers that is coupled to the address port of the memory for automatically manipulating said address.

12. A data processing system according to claim 11 wherein said auto-increment means manipulates said address after a first read operation, thereby not requiring said support controller means to shift in another address into said dynamic scan register means for a second read operation.

13. A data processing system according to claim 11 wherein said auto-increment means manipulates said address between a number of successive read operations, thereby not requiring said support controller means to shift in another address into said dynamic scan register means for the number of successive read operations.

14. A data processing system according to claim 11 wherein said auto-increment means manipulates said address after a first write operation, thereby not requiring said support controller means to shift in another address into said dynamic scan register means for a second write operation.

15. A data processing system according to claim 11 wherein said auto-increment means manipulates said address between a number of successive write operations, thereby not requiring said support controller means to shift in another address into said dynamic scan register means for the number of successive write operations.

16. A data processing system according to claim 11 wherein said auto-increment means manipulates said address by performing an arithmetic operation.

17. A data processing system according to claim 16 wherein said arithmetic operation comprises incrementing said address.

18. A data processing system according to claim 16 wherein said arithmetic operation comprises decrementing said address.

19. A data processing system according to claim 16 wherein said arithmetic operation comprises multiplying said address by a predetermined number.

20. In a data processing system having a memory and a number of registers, the memory having an address port and a data port, at least one of the number of registers being coupled to the address port, and the number of registers being connected together to form two or more scan paths for accessing different ones of said number of registers, the improvement comprising:
  a. a support controller coupled to the two or more scan paths for shifting an address into the two or more scan paths, the at least one of the number of registers that is coupled to the address port of the memory receiving said address, said support controller capable of performing a number of read and write operations on the memory via the two or more scan paths; and
  b. an auto-increment block coupled to the at least one of the number of registers that is coupled to the address port of the memory for automatically manipulating said address.

21. A data processing system according to claim 20 wherein said auto-increment block manipulates said address after a first read operations, thereby not requiring said support controller to shift in another address into the two or more scan paths for a second read operation.

22. A data processing system according to claim 20 wherein said auto-increment block manipulates said address between a number of successive read operations, thereby not requiring said support controller to shift in another address into the two or more scan paths for the number of successive read operation.

23. A data processing system according to claim 20 wherein said auto-increment block manipulates said address after a first write operations, thereby not requiring said support controller to shift in another address into the two or more scan paths for a second write operation.

24. A data processing system according to claim 20 wherein said auto-increment block manipulates said address between a number of successive write operations, thereby not requiring said support controller to shift in another address into the two or more scan paths for the number of successive write operation.

25. A data processing system according to claim 20 wherein at least one of the number of registers are serial scan shift registers.

26. A data processing system according to claim 20 wherein said auto-increment block manipulates said address by performing an arithmetic operation.

27. A data processing system according to claim 26 wherein said arithmetic operation comprises incrementing said address.

28. A data processing system according to claim 26 wherein said arithmetic operation comprises decrementing said address.

29. A data processing system according to claim 26 wherein said arithmetic operation comprises multiplying said address by a predetermined number.

30. In a data processing system having a memory and a number of registers, the memory having an address port and a data port, at least one of the number of registers being coupled to the address port and at least one of the number of registers being coupled to the data port, the improvement comprising:
   a. a dynamic scan register coupled to the at least one of the number of registers that is coupled to the address port and the at least one of the number of registers that is coupled to the data port of the memory;
   b. a support controller coupled to said dynamic scan register for shifting an address and data into said dynamic scan register, the at least one of the number of registers that is coupled to the address port of the memory receiving said address from said dynamic scan register and the at least one of the number of registers that is coupled to the data port of the memory receiving said data from said dynamic scan register means, said support controller capable of performing a number of read and write operations on the memory via the dynamic scan register; and
   c. an auto-increment block coupled to the at least one of the number of registers that is coupled to the address port of the memory for automatically manipulating said address.

31. A data processing system according to claim 30 wherein said auto-increment block manipulates said address after a first read operations, thereby not requiring said support controller to shift in another address into said dynamic scan register for a second read operation.

32. A data processing system according to claim 30 wherein said auto-increment block manipulates said address between a number of successive read operations, thereby not requiring said support controller to shift in another address into said dynamic scan register for the number of successive read operations.

33. A data processing system according to claim 30 wherein said auto-increment block manipulates said address after a first write operations, thereby not requiring said support controller to shift in another address into said dynamic scan register for a second write operation.

34. A data processing system according to claim 30 wherein said auto-increment block manipulates said address between a number of successive write operations, thereby not requiring said support controller to shift in another address into said dynamic scan register for the number of successive write operations.

35. A data processing system according to claim 30 wherein said auto-increment block manipulates said address by performing an arithmetic operation.

36. A data processing system according to claim 35 wherein said arithmetic operation comprises incrementing said address.

37. A data processing system according to claim 35 wherein said arithmetic operation comprises decrementing said address.

38. A data processing system according to claim 35 wherein said arithmetic operation comprises multiplying said address by a predetermined number.

39. An apparatus comprising:
   a. a support controller;
   b. a microsequencer;
   c. a memory having a number of memory locations;
   d. a data save disk controller element coupled to said microsequencer, said memory, and to said support controller, said microsequencer performing a number of successive read operations on said memory element via said data save disk controller element, said data save disk controller element further comprising:
      i. a dynamic scan register coupled to said support controller for receiving an address from said support controller and receiving a data word from a data output register;
      ii. an address register coupled to said dynamic scan register and said memory for receiving said address from said dynamic scan register;
      iii. said data output register coupled to said dynamic scan register and further coupled to said memory for receiving said data word from said memory;
      iv. an auto-increment block coupled to said address register for automatically manipulating said address; and
      v. whereby said support controller shifts in said address into said dynamic scan register wherein said address is provided to said address register, said memory then reads a corresponding one of the number of memory locations and provides a resulting data word to said data output register, said data output register then providing said resulting data word to said dynamic scan register, said support controller then shifts out said resulting data word from said dynamic scan register to complete a first of said number of successive read operations, said auto-increment block automatically manipulating said address and providing a manipulated address to said memory for a subsequent one of the number of successive read operations.

40. An apparatus according to claim 39 wherein said auto-increment block increments said address.

41. An apparatus according to claim 39 wherein said auto-increment block decrements said address.

42. An apparatus according to claim 39 further comprising a word count register for indicating when a predetermined number of successive read operations have been performed.

43. An apparatus comprising:
   a. a support controller;
   b. a microsequencer;
   c. a memory having a number of memory locations;
   d. a data save disk controller element coupled to said microsequencer, said memory, and to said support controller, said microsequencer performing a number of successive write operations on said memory element via said data save disk controller element, said data save disk controller element further comprising:
      i. a dynamic scan register coupled to said support controller for receiving an address and a data word from said support controller;
      ii. an address register coupled to said dynamic scan register and said memory for receiving said address from said dynamic scan register.
      iii. a data input register coupled to said dynamic scan register and further coupled to said memory for receiving said data word from said dynamic scan register;

iv. an auto-increment block coupled to said address register for automatically manipulating said address; and v. whereby said support controller shifts in said address into said dynamic scan register wherein said address is provided to said address register, said support controller then shifts in said data word into said dynamic scan register wherein said data word is provided to said data input register, said memory then writes said data word to a corresponding one of the number of memory locations to complete a first of said number of successive write operations, said support controller shifting another data word into said dynamic scan register wherein said another data word is provided to said data input register for a subsequent one of the number of successive write operations, said auto-increment block automatically manipulating said address and providing a manipulated address to said memory for said subsequent one of the number of successive write operations.

44. An apparatus according to claim 43 wherein said auto-increment block increments said address.

45. An apparatus according to claim 43 wherein said auto-increment block decrements said address.

46. A method for dynamically reading a memory wherein the memory has an address port and a data port, the method comprising the steps of:
   a. providing a support controller coupled to the memory through a plurality of scan paths;
   b. initializing the memory by performing a number of initial scan operations to the memory through said plurality of scan paths via said support controller;
   c. scanning a read address to the address port of the memory through a first one of said plurality of scan paths via said support controller, the memory providing a resulting data word to the data port in response thereto;
   d. scanning the resulting data word from the memory through a second one of said plurality of scan paths via said support controller;
   e. automatically manipulating said read address and providing a manipulated read address to the address port of the memory through said first one of said plurality of scan paths; and
   f. repeating steps (d) through (e) to continue reading the memory.

47. A method for dynamically writing a memory wherein the memory has an address port and a data port, the method comprising the steps of:
   a. providing a support controller coupled to the memory through a plurality of scan paths;
   b. initializing the memory by performing a number of initial scan operations to the memory through said plurality of scan paths via said support controller;
   c. scanning a write address to the address port of the memory through a first one of said plurality of scan paths via said support controller;
   d. scanning a write data word to the data port of the memory through a second one of said plurality of scan paths via said support controller, the memory writing the data word to a corresponding address location within the memory in response thereto;
   e. automatically manipulating said write address and providing a manipulated write address to the address port of the memory through said first one of said plurality of scan paths; and
   f. repeating steps (d) through (e) to continue writing the memory.

48. A method for dynamically reading a memory wherein the memory has an address port and a data port, the method comprising the steps of:
   a. providing a plurality of scan registers coupled to a plurality of scan paths wherein a first one of said plurality of scan registers is coupled to the address port through a first one of said plurality of scan paths and a second one of said plurality of scan registers is coupled to the data port through a second one of said plurality of scan paths;
   b. providing a support controller coupled to said plurality of scan registers through said plurality of scan paths for controlling said plurality of scan registers;
   c. scanning a read address into said first one of said plurality of scan registers through said first one of said plurality of scan paths wherein the memory provides a resulting data word to the data port in response thereto;
   d. providing said resulting data word to said second one of said plurality of scan registers through said second one of said plurality of scan paths;
   e. scanning the resulting data word from said second one of said plurality of scan registers via said support controller;
   f. automatically manipulating said read address and providing a manipulated read address to the address port of the memory through said first one of said plurality of scan paths; and
   g. repeating steps (e) through (f) to continue reading the memory.

49. A method for dynamically writing a memory wherein the memory has an address port and a data port, the method comprising the steps of:
   a. providing a plurality of scan registers coupled to a plurality of scan paths wherein a first one of said plurality of scan registers is coupled to the address port through a first one of said plurality of scan paths and a second one of said plurality of scan registers is coupled to the data port through a second one of said plurality of scan paths;
   b. providing a support controller coupled to said plurality of scan registers through said Plurality of scan paths for controlling said plurality of scan registers;
   c. scanning a write address into said first one of said plurality of scan registers through said first one of said plurality of scan paths;
   d. scanning a write data word into said second one of said plurality of scan registers through said second one of said plurality of scan paths, the memory writing the write data word to a corresponding address location therein, in response thereto;
   e. automatically manipulating said write address and providing a manipulated write address to the address port of the memory through said first one of said plurality of scan paths; and
   f. repeating steps (d) through (e) to continue writing the memory.

50. A method for dynamically reading a memory wherein the memory has an address port and a data port, the method comprising the steps of:
   a. providing a dynamic scan register for receiving a read address and a data word, said dynamic scan register being coupled to the address port and the data port of the memory;

b. providing a support controller coupled to said dynamic scan register for controlling said dynamic scan register;

c. scanning said read address into said dynamic scan register and providing said read address to the address port of the memory, the memory providing said resulting data word to the data port in response thereto;

d. providing said resulting data word to said dynamic scan register;

e. scanning the resulting data word from said dynamic scan register via said support controller;

f. automatically manipulating said read address and providing a manipulated read address to the address port of the memory; and g. repeating steps (e) through (f) to continue reading the memory.

51. A method for dynamically writing a memory wherein the memory has an address port and a data port, the method comprising the steps of:

a. providing a dynamic scan register for receiving a write address and a write data word, said dynamic scan register being coupled to the address port and the data port of the memory;

b. providing a support controller coupled to said dynamic scan register for controlling said dynamic scan register;

c. scanning said write address into said dynamic scan register and providing said write address to the address port of the memory;

d. scanning said write data word into said dynamic scan register and providing said write data word to the data port of the memory, the memory writing the write data word to a corresponding address location therein, in response thereto;

e. automatically manipulating said write address and providing a manipulated write address to the address port of the memory; and f. repeating steps (d) through (e) to continue writing the memory.

52. A method for dynamically reading a memory wherein the memory has an address port and a data port, the method comprising the steps of:

a. providing a dynamic scan register for receiving a read address and a data word;

b. providing a support controller coupled to said dynamic scan register for controlling said dynamic scan register;

c. providing an address register, said address register being coupled to said dynamic scan register and to the address port of the memory;

d. providing a data output register, said data output register being coupled to said dynamic scan register and to the data port of the memory;

e. providing a word count register, said word count register being coupled to said dynamic scan register and said support controller;

f. providing an auto-increment block, said auto-increment block being coupled to said address register;

g. scanning said read address into said dynamic scan register and providing said read address to said address register, said address register providing said read address to the address port of the memory, the memory providing said resulting data word to the data port in response thereto;

h. scanning a word count into said dynamic scan register and providing said word count to said word count register;

i. providing said resulting read data word to said dynamic scan register;

j. scanning the resulting data word from said dynamic scan register via said support controller;

k. automatically manipulating said read address via said auto-increment block, said auto-increment block providing a manipulated read address to the address port of the memory;

l. decrementing said word count;

m. determining if said word count reached a predetermined value; and n. repeating steps (j) through (n) if said word count has not reached said predetermined value.

53. A method for dynamically writing a memory wherein the memory has an address port and a data port, the method comprising the steps of:

a. providing a dynamic scan register for receiving a write address and a write data word;

b. providing a support controller coupled to said dynamic scan register for controlling said dynamic scan register;

c. providing an address register, said address register being coupled to said dynamic scan register and to the address port of the memory;

d. providing a data input register, said data input register being coupled to said dynamic scan register and to the data port of the memory;

e. providing an auto-increment block, said auto-increment block being coupled to said address register;

f. scanning said write address into said dynamic scan register and providing said write address to said address register, said address register providing said write address to the address port of the memory;

g. scanning said write data word into said dynamic scan register and providing said write data word to said data input register, said data input register providing said write data word to the data port of the memory, the memory writing said write data word to a corresponding address location therein, in response thereto;

h. automatically manipulating said write address via said auto-increment block, said auto-increment block providing a manipulated write address to the address port of the memory; and i. repeating steps (g) through (h) to continue writing to the memory.

54. A data processing system having a memory and a plurality of registers, the memory having an addressing means, a data input means, and a data output means, which comprises:

a. a dynamic scan register means;

b. an address register means coupled to said dynamic scan register means and further coupled to the addressing means for receiving an address from said dynamic scan register means;

c. a data input register means coupled to said dynamic scan register means and further coupled to the data input means for receiving a data word from said dynamic scan register means;

d. a data output register means coupled to said dynamic scan register means and further coupled to the data output means for receiving a data word from said data output means;

e. support controller means coupled to said dynamic scan register means for shifting said address and said data into said dynamic scan register means wherein said address is provided to said address register and said data is provided to said data input register, and wherein said data is provided to said dynamic scan register means from said data output register, for shifting said data out of said dynamic scan register means, said support controller means capable of performing a number of read and write operations on the memory via said dynamic scan register means; and f. auto-increment means coupled to said address register means for automatically manipulating said address.

55. A data processing system according to claim 54 wherein said auto-increment means manipulates said address after a first read operation, thereby not requiring said support controller means to shift in another address into said dynamic scan register means for a second read operation.

56. A data processing system according to claim 54 wherein said auto-increment means manipulates said address between a number of successive read operations, thereby not requiring said support controller means to shift in another address into said dynamic scan register means for the number of successive read operations.

57. A data processing system according to claim 54 wherein said auto-increment means manipulates said address after a first write operation, thereby not requiring said support controller means to shift in another address into said dynamic scan register means for a second write operation.

58. A data processing system according to claim 54 wherein said auto-increment means manipulates said address between a number of successive write operations, thereby not requiring said support controller means to shift in another address into said dynamic scan register means for the number of successive write operations.

59. A data processing system according to claim 54 wherein said auto-increment means manipulates said address by performing an arithmetic operation.

60. A data processing system according to claim 59 wherein said arithmetic operation comprises incrementing said address.

61. A data processing system according to claim 59 wherein said arithmetic operation comprises decrementing said address.

62. A data processing system according to claim 59 wherein said arithmetic operation comprises multiplying said address by a predetermined number.

63. A data processing system having a memory and a plurality of registers, the memory having an address port, a data input port, and a data output port and a test system, which comprises:
   a. a dynamic scan register;
   b. an address register coupled to said dynamic scan register and further coupled to the address port for receiving an address from said dynamic scan register;
   c. a data input register coupled to said dynamic scan register and further coupled to the data input port for receiving a data word from said dynamic scan register;
   d. a data output register coupled to said dynamic scan register and further coupled to the data output port for receiving a data word from said data output port;
   e. support controller coupled to said dynamic scan register for shifting said address and said data into said dynamic scan register wherein said address is provided to said address register and said data is provided to said data input register, and wherein said data is provided to said dynamic scan register from said data output register, for shifting said data out of said dynamic scan register, said support controller capable of performing a number of read and write operations on the memory via said dynamic scan register; and
   f. auto-increment block coupled to said address register for automatically manipulating said address.

64. A data processing system according to claim 63 wherein said auto-increment block manipulates said address after a first read operation, thereby not requiring said support controller to shift in another address into said dynamic scan register for a second read operation.

65. A data processing system according to claim 63 wherein said auto-increment block manipulates said address between a number of successive read operations, thereby not requiring said support controller to shift in another address into said dynamic scan register for the number of successive read operations.

66. A data processing system according to claim 63 wherein said auto-increment block manipulates said address after a first write operation, thereby not requiring said support controller means to shift in another address into said dynamic scan register for a second write operation.

67. A data processing system according to claim 63 wherein said auto-increment block manipulates said address between a number of successive write operations, thereby not requiring said support controller to shift in another address into said dynamic scan register for the number of successive write operations.

68. A data processing system according to claim 63 wherein said auto-increment block manipulates said address by performing an arithmetic operation.

69. A data processing system according to claim 68 wherein said arithmetic operation comprises incrementing said address.

70. A data processing system according to claim 68 wherein said arithmetic operation comprises decrementing said address.

71. A data processing system according to claim 68 wherein said arithmetic operation comprises multiplying said address by a predetermined number.

72. A method for dynamically reading a memory wherein the memory has an address port and a data port, the method comprising the steps of:
   a. providing a dynamic scan register having last corresponding bit positions, said dynamic scan register being coupled to the address port and the data port of the memory;
   b. providing a support controller coupled to said dynamic scan register for controlling said dynamic scan register;
   c. scanning a read address into said dynamic scan register and providing said read address to the address port of the memory, the memory providing a resulting read data word to the data port in response thereto;
   d. providing said resulting read data word to said last corresponding bit positions of said dynamic scan register;
   e. scanning the resulting data word from said dynamic scan register via said support controller by shifting said last corresponding bit positions out of said dynamic scan register;
   f. automatically manipulating said read address and providing a manipulated read address to the address port of the memory; and
   g. repeating steps (e) through (f) to continue reading the memory.

73. A method for dynamically writing a memory wherein the memory has an address port and a data port, the method comprising the steps of:

a. providing a dynamic scan register having first corresponding bit positions, said dynamic scan register being coupled to the address port and the data port of the memory;

b. providing a support controller coupled to said dynamic scan register for controlling said dynamic scan register;

c. scanning a write address into said dynamic scan register and providing said write address to the address port of the memory;

d. scanning a write data word into said first corresponding bit positions of said dynamic scan register and providing said write data word to the data port of the memory, the memory writing the write data word to a corresponding address location therein, in response thereto;

e. automatically manipulating said write address and providing a manipulated write address to the address port of the memory; and f. repeating steps (d) through (e) to continue writing the memory.

74. A method for dynamically reading a memory wherein the memory has an address port and a data port, the method comprising the steps of:

a. providing a dynamic scan register having last corresponding bit positions;

b. providing a support controller coupled to said dynamic scan register for controlling said dynamic scan register;

c. providing an address register, said address register being coupled to said dynamic scan register and to the address port of the memory;

d. providing a data output register, said data output register being coupled to said last corresponding bit positions of said dynamic scan register and to the data port of the memory;

e. providing a word count register, said word count register being coupled to said dynamic scan register and said support controller;

f. providing an auto-increment block, said auto-increment block being coupled to said address register;

g. scanning a read address into said dynamic scan register and providing said read address to said address register, said address register providing said read address to the address port of the memory, the memory providing a resulting read data word to the data port in response thereto;

h. scanning a word count into said dynamic scan register and providing said word count to said word count register;

i. providing said resulting read data word to said last corresponding bit positions of said dynamic scan register;

j. scanning the resulting read data word from said dynamic scan register via said support controller by shifting said last corresponding bit positions out of said dynamic scan register;

k. automatically manipulating said read address via said auto-increment block, said auto-increment block providing a manipulated read address to the address port of the memory;

l. decrementing said word count;

m. determining if said word count reached a predetermined value; and n. repeating steps (j) through (n) if said word count has not reached said predetermined value.

75. A method for dynamically writing a memory wherein the memory has an address port and a data port, the method comprising the steps of:

a. providing a dynamic scan register having first corresponding bit positions;

b. providing a support controller coupled to said dynamic scan register for controlling said dynamic scan register;

c. providing an address register, said address register being coupled to said dynamic scan register and to the address port of the memory;

d. providing a data input register, said data input register being coupled to said first corresponding bit positions of said dynamic scan register and to the data port of the memory;

e. providing an auto-increment block, said auto-increment block being coupled to said address register;

f. scanning a write address into said dynamic scan register and providing said write address to said address register, said address register providing said write address to the address port of the memory;

g. scanning a write data word into said first corresponding bit positions of said dynamic scan register by shifting said write data word into said first corresponding bit positions of said dynamic scan register and providing said write data word to said data input register, said data input register providing said write data word to the data port of the memory, the memory writing said write data word to a corresponding address location therein, in response thereto;

h. automatically manipulating said write address via said auto-increment block, said auto-increment block providing a manipulated write address to the address port of the memory; and i. repeating steps (g) through (h) to continue writing to the memory.

* * * * *